(12) United States Patent  (10) Patent No.: US 7,863,127 B2
Mise et al.  (45) Date of Patent: Jan. 4, 2011

(54) MANUFACTURING METHOD OF SEMICONDUCTOR DEVICE

(75) Inventors: Nobuyuki Mise, Tokyo (JP); Tetsu Morooka, Tsukuba (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 41 days.

(21) Appl. No.: 12/470,718

(22) Filed: May 22, 2009

(65) Prior Publication Data

US 2009/0291538 A1 Nov. 26, 2009

(30) Foreign Application Priority Data

May 23, 2008 (JP) ............... 2008-135703

(51) Int. Cl.
*H01L 21/8238* (2006.01)
(52) U.S. Cl. ............... 438/216; 438/783; 257/E21.639; 257/E21.625; 257/E21.632
(58) Field of Classification Search ................. 438/216, 438/783; 257/E21.639, E21.625, E21.632
See application file for complete search history.

(56) References Cited

U.S. PATENT DOCUMENTS

2003/0218223 A1 11/2003 Nishiyama et al.
2007/0176242 A1 8/2007 Lee et al.
2008/0083956 A1 4/2008 Mise et al.
2009/0053883 A1* 2/2009 Colombo et al. ............ 438/592
2009/0098693 A1* 4/2009 Nakajima ................... 438/199

FOREIGN PATENT DOCUMENTS

| JP | 2003-249649 A | 9/2003 |
| JP | 2005-150737 A | 6/2005 |
| JP | 2007-208160 A | 8/2007 |

* cited by examiner

*Primary Examiner*—Caridad M Everhart
(74) *Attorney, Agent, or Firm*—Miles & Stockbridge P.C.

(57) ABSTRACT

After forming a first gate electrode and a second gate electrode on a semiconductor substrate, a silicon oxide film is formed to cover an n-channel MISFET forming region, and a p-channel MISFET forming region is exposed. Subsequently, after a first element supply film made of, for example, an aluminum oxide film is formed on the whole surface of the semiconductor substrate, a heat treatment is performed. By this means, a high-concentration HfAlO film and a low-concentration HfAlO film are formed by diffusing aluminum into the first insulating film just below the second gate electrode. Thereafter, by using a magnesium oxide film as a second element supply film, magnesium is diffused into the first insulating film just below the first gate electrode, thereby forming a high-concentration HfMgO film and a low-concentration HfMgO film.

22 Claims, 28 Drawing Sheets n-CHANNEL MISFET FORMING REGION
Y1 ⟷ Y1 p-CHANNEL MISFET FORMING REGION
Y2 ⟷ Y2

MANUFACTURING METHOD OF SEMICONDUCTOR DEVICE

CROSS-REFERENCE TO RELATED APPLICATION

The present application claims priority from Japanese Patent Application No. JP 2008-135703 filed on May 23, 2008, the content of which is hereby incorporated by reference into this application.

TECHNICAL FIELD OF THE INVENTION

The present invention relates to a technology for manufacturing a semiconductor device, and more particularly to a technology effectively applied to the manufacture of a semiconductor device including a MISFET (Metal Insulator Semiconductor Field Effect Transistor) in which a high-dielectric-constant film having a dielectric constant higher than that of a silicon oxide film is used as a gate insulating film.

BACKGROUND OF THE INVENTION

Japanese Patent Application Laid-Open Publication No. 2003-249649 (Patent Document 1) describes a technology for suppressing the formation of interface oxide layers on and below a gate insulating film while using a high-dielectric-constant material as the gate insulating film. Concretely, a gate insulating film is formed on a semiconductor layer, and a gate electrode is formed on this gate insulating film. At this time, the gate insulating film is made of an oxide containing a metal and is formed so that the content of nitrogen or aluminum is higher at both end portions of the gate insulating film in a gate length direction than that of a central portion.

Japanese Patent Application Laid-Open Publication No. 2007-208160 (Patent Document 2) describes a technology for improving the reliability of a MISFET using a gate insulating film including a high-dielectric-constant film. Concretely, in a MISFET with a gate length of 10 nm or less, a stacked film of a silicon oxide film and a high-dielectric-constant film is used as a gate insulating film formed on a silicon substrate. At this time, the gate insulating film is formed so as to contain more nitrogen in lateral side portions than a central portion in a gate length direction and contain more nitrogen in an upper surface side than a lower surface side in a film thickness direction of the gate insulating film.

Japanese Patent Application Laid-Open Publication No. 2005-150737 (Patent Document 3) describes a technology for achieving the reliability improvement and the optimum operating characteristics in an n-channel MISFET and a p-channel MISFET, respectively. Concretely, the gate insulating film of the n-channel MISFET and the gate insulating film of the p-channel MISFET are made of different high-dielectric-constant films.

SUMMARY OF THE INVENTION

For example, in the n-channel MISFET and the p-channel MISFET constituting a CMIS (Complementary Metal Insulator Semiconductor) circuit, a silicon oxide film has been conventionally used for the gate insulating film.

In recent years, however, with the trend of scaling down the size of MISFET constituting a semiconductor device, the thickness of a gate insulating film has been rapidly reduced. When the thickness of a gate insulating film is reduced, a phenomenon in which electrons pass through the gate insulating film occurs due to the tunnel effect. By this phenomenon, tunnel current flows in the gate insulating film. As a result, the leakage current of the MISFET increases.

Therefore, studies on the replacement of a silicon oxide film used as a gate insulating film with a high-dielectric-constant film with a dielectric constant higher than that of a silicon oxide film have been proceeding. This is because, when a high-dielectric-constant film is used to form a gate insulating film, even if the capacitance is the same as that of the case of using a silicon oxide film, the actual physical thickness can be increased by a factor of "dielectric constant of high-dielectric-constant film/dielectric constant of silicon oxide film", and as a result, the leakage current can be reduced. As a material of a high-dielectric-constant film, metal oxides such as hafnium (Hf) oxide and zirconium (Zr) oxide have been studied.

As described above, the leakage current passing through the gate insulating film can be reduced by using a high-dielectric-constant film as a gate insulating film of a MISFET, but it causes new problems.

Conventionally, a polysilicon film has been used as a gate electrode in an n-channel MISFET and a p-channel MISFET. Further, in the n-channel MISFET, an n-type impurity (for example, phosphorus or arsenic) is implanted into the polysilicon film constituting the gate electrode. By this means, the work function (Fermi level) of the gate electrode is set near the conduction band (near 4.05 eV) of silicon, thereby achieving the reduction of the threshold voltage of the n-channel MISFET. Meanwhile, in the p-channel MISFET, a p-type impurity (for example, boron) is implanted into the polysilicon film constituting the gate electrode. By this means, the work function of the gate electrode is set near the valence band (near 5.17 eV) of silicon, thereby achieving the reduction of the threshold voltage of the p-channel MISFET. This is an example when a silicon oxide film is used as a gate insulating film. More specifically, in the case where a silicon oxide film is used as a gate insulating film, the work function of the gate electrode can be set near the conduction band or the valence band by implanting an n-type impurity or a p-type impurity into the gate electrode.

However, in the case where a high-dielectric-constant film is used as a gate insulating film, the work function of the gate electrode cannot be set near the conduction band or the valence band even when an n-type impurity or a p-type impurity is implanted into the gate electrode made of a polysilicon film. More specifically, when a high-dielectric-constant film is used as a gate insulating film, the work function of the gate electrode is increased and separated from near the conduction band in the n-channel MISFET. Therefore, the threshold voltage of the n-channel MISFET is increased. Meanwhile, the work function of the gate electrode is reduced and separated from the valence band in the p-channel MISFET. Therefore, similar to the n-channel MISFET, the threshold voltage thereof is increased. The phenomenon that the work function of the gate electrode shifts in a direction of the increase of a threshold voltage as described above is interpreted as Fermi level pinning. This Fermi level pinning appears particularly in the p-channel MISFET. That is, the increase in threshold voltage in the case where a high-dielectric-constant film is used for a gate insulating film appears particularly in the p-channel MISFET.

Furthermore, when a polysilicon film is used as a gate electrode, the phenomenon that the polysilicon film is depleted at the interface between the gate insulating film and the gate electrode occurs. Since the depleted polysilicon film functions as a capacitor insulating film, the capacitor insulating film between the gate electrode and the semiconductor substrate is not only the gate insulating film, but the depleted polysilicon film also functions as a part of the capacitor insulating film. Although the influence of the depleted polysilicon film is negligibly small in a state where the gate insulating film has a large thickness, the influence of the depleted polysilicon film becomes increasingly unignorable with the further reduction in the thickness of the gate insulating film. More specifically, even when the thickness reduction of the gate insulating film advances, the thickness of the gate insulating film is substantially increased by the thickness of the depleted polysilicon film when a polysilicon film is used as the gate electrode. As a result, since the capacitance between the gate electrode and the semiconductor substrate is reduced, it becomes difficult to ensure the sufficient ON current.

Therefore, the studies have been made on the formation of the gate electrode disposed on the gate insulating film from a metal film instead of a polysilicon film in the case where a high-dielectric-constant film with a dielectric constant higher than that of a silicon oxide film is used for a gate insulating film. If a metal film is used to form the gate electrode, the threshold voltage can be adjusted by selecting the type of the metal film instead of adjusting the threshold voltage by implanting an impurity like in the case of using the polysilicon film. Therefore, it is possible to solve the problem of the above-described Fermi level pinning by using a metal film for a gate electrode. Furthermore, since no polysilicon film is used for the gate electrode, the problem of the depletion of the gate electrode can also be solved.

However, when a metal film is used for a gate electrode, it is necessary to use different metal films for an n-channel MISFET and a p-channel MISFET. This is because, although the work function value differs depending on the type of the metal film, a metal film having a work function near the conduction band of silicon has to be used in the n-channel MISFET in order to reduce the threshold voltage, and on the other hand, a metal film having a work function near the valence band of silicon has to be used in the p-channel MISFET in order to reduce the threshold voltage. Accordingly, when a metal film is used for a gate electrode, different metal films are used in the n-channel MISFET and the p-channel MISFET. For example, a TaSiN film is used for the gate electrode of the n-channel MISFET and a TiN film is used for the gate electrode of the p-channel MISFET.

When different metal films are used for the gate electrodes of the n-channel MISFET and the p-channel MISFET, the vertical processing of these metal films becomes difficult. More specifically, since the etching characteristics of the metal film greatly differ depending on the type of the metal film, it is difficult to achieve good etching characteristics for both the two different metal films. In particular, along with the scaling down of the MISFET, the gate electrode needs to be processed to have a gate length of 20 nm or less. However, when different metal films are used for the gate electrode of the n-channel MISFET and the gate electrode of the p-channel MISFET, since the vertical processability of the respective gate electrodes is not good, it is difficult to process these gate electrodes to have the gate length of 20 nm or less.

For this reason, studies have been made on the case where the same metal film is used for the gate electrode of the n-channel MISFET and that of the p-channel MISFET and also the composition of the gate insulating film of the n-channel MISFET and that of the gate insulating film (high-dielectric-constant film) of the p-channel MISFET are made different from each other. In other words, it has become apparent that, even if the gate electrodes are made of the same metal film, the threshold value of the n-channel MISFET and the threshold value of the p-channel MISFET can be adjusted to respectively different states by using the films having different compositions for the gate insulating films (high-dielectric-constant films) disposed just below the gate electrodes. As one conceivable example, a HfLaO film is used as the gate insulating film in the n-channel MISFET, and a HfAlO film is used in the p-channel MISFET.

As described above, by forming the gate insulating film of the n-channel MISFET and the gate insulating film of the p-channel MISFET from high-dielectric-constant films having different compositions, the gate electrode of the n-channel MISFET and the gate electrode of the p-channel MISFET can be formed from the metal film with the same composition. Although it is difficult to simultaneously achieve the good vertical processing accuracies for different metal films, it is not so much difficult to achieve good vertical processing accuracies for the metal films with the same composition. Therefore, it can be said that the structure where the gate electrode of the n-channel MISFET and the gate electrode of the p-channel MISFET are formed from the metal films with the same composition and the gate insulating film (high-dielectric-constant film) of the n-channel MISFET and the gate insulating film (high-dielectric-constant film) of the p-channel MISFET are made to have different compositions is a suitable structure for the scaling down of the MISFET (for example, gate length is 20 nm or less).

However, new problems are caused when this structure is employed. In other words, since the composition of the gate insulating film of the n-channel MISFET and the composition of the gate insulating film of the p-channel MISFET are different from each other, a step of exposing a semiconductor substrate in an n-channel MISFET forming region or in a p-channel MISFET forming region exists as described below. For example, after forming a first gate insulating film (gate insulating film for n-channel MISFET) on the whole surface of a semiconductor substrate, the first gate insulating film formed in a p-channel MISFET forming region is removed. At this time, the semiconductor substrate is exposed in the p-channel MISFET forming region. Thereafter, a second gate insulating film (gate insulating film for p-channel MISFET) is formed on the whole surface of the semiconductor substrate. In this manner, a stacked film of the first gate insulating film and the second gate insulating film is formed in an n-channel MISFET forming region, and the second gate insulating film is formed in the p-channel MISFET forming region. Then, by removing the second gate insulating film formed in the n-channel MISFET forming region, the first gate insulating film is formed in the n-channel MISFET forming region, and the second gate insulating film is formed in the p-channel MISFET forming region.

In the process described above, there is the step in which the semiconductor substrate is exposed. In this case, there is a fear that the surface of the semiconductor substrate is damaged due to the exposure of the semiconductor substrate. In other words, as described in the example above, the first gate insulating film is formed without exposing the semiconductor substrate in the n-channel MISFET forming region, but the second gate insulating film is formed after exposing the semiconductor substrate in the p-channel MISFET forming region. Therefore, there is a fear that the first gate insulating film that is formed without exposing the semiconductor substrate and the second gate insulating film that is formed after exposing the semiconductor substrate may have different film qualities.

In the process of forming the MISFETs, it is desired to avoid placing a semiconductor substrate in a state different from the proven conventional manufacturing process as much as possible. In other words, when a semiconductor substrate is placed in a state different from the proven conventional manufacturing process, the problem not observed in the conventional manufacturing process may emerge as a new problem in some cases. Concretely, in the conventional manufacturing process, a silicon oxide film is used for the gate insulating film and a polysilicon film is used for the gate electrode. In this process, the same gate insulating film is used for the n-channel MISFET forming region and the p-channel MISFET forming region, and therefore, the semiconductor substrate in either one of the n-channel MISFET forming region and the p-channel MISFET forming region is not exposed in the process of forming the gate insulating film. Meanwhile, in the case where different gate insulating films are used for the n-channel MISFET and the p-channel MISFET, there is the step in which the semiconductor substrate is exposed. Thus, in the case where different gate insulating films are used for the n-channel MISFET and the p-channel MISFET, the semiconductor substrate is placed in the state different from the conventional manufacturing process, that is, the semiconductor substrate is exposed in the forming process of the gate insulating film. Accordingly, there is concern that the reliability of the semiconductor device is deteriorated in the manufacturing process of the semiconductor device.

An object of the present invention is to provide a technology capable of improving the reliability of a semiconductor device without unnecessarily exposing a semiconductor substrate in the manufacturing technology of a semiconductor device in which a high-dielectric-constant film having a dielectric constant higher than that of a silicon oxide film is used for a gate insulating film and different high-dielectric-constant films are used to form a gate insulating film of an n-channel MISFET and a gate insulating film of a p-channel MISFET.

The above and other objects and novel characteristics of the present invention will be apparent from the description of this specification and the accompanying drawings.

The typical ones of the inventions disclosed in this application will be briefly described as follows.

A manufacturing method of a semiconductor device according to one representative embodiment relates to a manufacturing method of a semiconductor device comprising the step of: forming a first MISFET in a first region and forming a second MISFET in a second region, in which the first MISFET and the second MISFET constitute MISFETs of different conductivity types. The step of forming the first MISFET and the second MISFET includes the steps of: (a) forming a first insulating film on a semiconductor substrate; (b) forming a first conductor film on the first insulating film; and (c) patterning the first conductor film, thereby forming a first gate electrode in the first region and forming a second gate electrode in the second region. Next, the step includes the steps of: (d) after the step (c), forming a first mask film so as to cover the first gate electrode, the second gate electrode and the exposed first insulating film; and (e) after the step (d), removing the first mask film formed in the first region while leaving the first mask film formed in the second region. Subsequently, the step includes the step of: (f) after the step (e), forming a first element supply film so as to cover the first mask film formed in the second region, the first gate electrode exposed in the first region and the first insulating film exposed in the first region. Further, the step includes the steps of: (g) after the step (f), performing a first heat treatment to the semiconductor substrate; (h) after the step (g), removing the first element supply film; and (i) after the step (h), removing the first mask film formed in the second region. Next, the step includes the steps of: (j) after the step (i), forming a second mask film so as to cover the first gate electrode, the second gate electrode and the exposed first insulating film; and (k) after the step (j), removing the second mask film formed in the second region while leaving the second mask film formed in the first region. Subsequently, the step includes the step of: (l) after the step (k), forming a second element supply film so as to cover the second mask film formed in the first region, the second gate electrode exposed in the second region and the first insulating film exposed in the second region. Also, the step includes the steps of: (m) after the step (l), performing a second heat treatment to the semiconductor substrate; (n) after the step (m), removing the second element supply film; and (o) after the step (n), removing the second mask film formed in the first region. Further, the step includes the step of: (p) after the step (o), forming a first source region and a first drain region of the first MISFET in the first region, and forming a second source region and a second drain region of the second MISFET in the second region.

Here, by the first heat treatment in the step (g), a first element contained in the first element supply film is diffused from the first element supply film into the first insulating film formed below the first gate electrode, so that the first insulating film covered with the first gate electrode turns into a first gate insulating film made of a film having a dielectric constant higher than that of a silicon oxide film. At this time, in the first gate insulating film, the amount of the first element contained in the first gate insulating film gradually decreases as going from an end portion toward a central portion in a gate length direction.

Similarly, by the second heat treatment in the step (m), a second element contained in the second element supply film is diffused from the second element supply film into the first insulating film formed below the second gate electrode, so that the first insulating film covered with the second gate electrode turns into a second gate insulating film made of a film having a dielectric constant higher than that of a silicon oxide film. At this time, in the second gate insulating film, the amount of the second element contained in the second gate insulating film gradually decreases as going from an end portion toward a central portion in a gate length direction.

The effects obtained by representative embodiments of the inventions disclosed in this application will be briefly described below.

According to the representative embodiment, the reliability of a semiconductor device can be improved without unnecessarily exposing a semiconductor substrate in the manufacturing technology of a semiconductor device in which a high-dielectric-constant film having a dielectric constant higher than that of a silicon oxide film is used for a gate insulating film and different high-dielectric-constant films are used to form a gate insulating film of an n-channel MISFET and a gate insulating film of a p-channel MISFET.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference numbers throughout the drawings for describing the embodiments, and the repetitive description thereof will be omitted. Further, hatching is used in some cases even in a plan view so as to make the drawings easy to see.

First Embodiment

Figure 1:
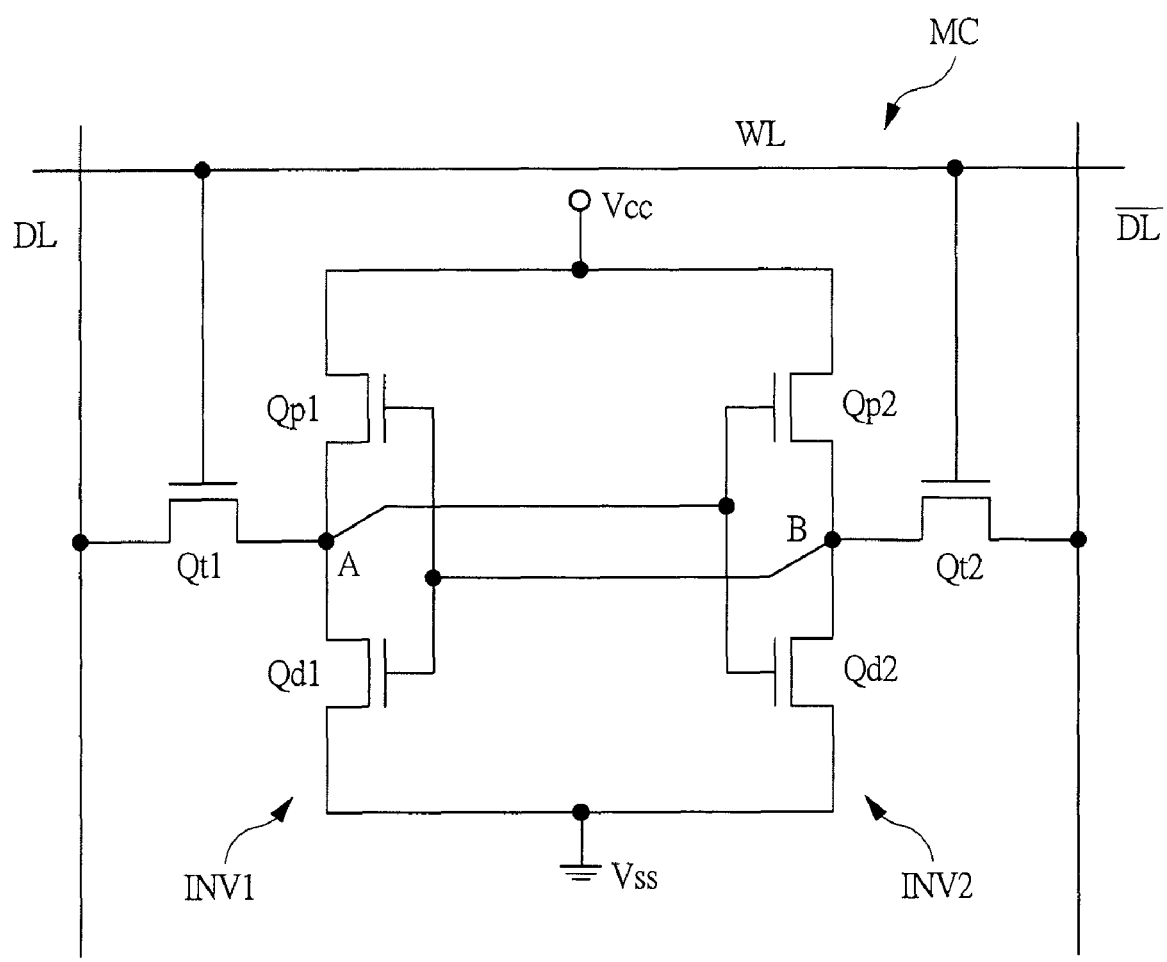
FIG. 1 is an equivalent circuit diagram showing a memory cell of an SRAM.

The first embodiment will be described with an SRAM (Static Random Access Memory) being taken as an example of a semiconductor device. First, an equivalent circuit of a memory cell MC constituting an SRAM will be described. FIG. 1 is an equivalent circuit diagram showing the memory cell MC of the SRAM according to the first embodiment. As shown in FIG. 1, this memory cell is disposed at an intersection between a pair of complementary data lines (data line DL and data line /DL) and a word line WL, and is constituted of a pair of driver MISFETs Qd1 and Qd2, a pair of load MISFETs Qp1 and Qp2, and a pair of transfer MISFETs Qt1 and Qt2. The n-channel MISFETs are used for the driver MISFETs Qd1 and Qd2 and the transfer MISFETs Qt1 and Qt2, and the p-channel MISFETs are used for the load MISFETs Qp1 and Qp2.

Of the six MISFETs constituting the memory cell MC, the driver MISFET Qd1 and the load MISFET Qp1 form a CMOS inverter INV1, and the driver MISFET Qd2 and the load MISFET Qp2 form a CMOS inverter INV2. The mutual input/output terminals (storage nodes A and B) of the pair of CMOS inverters INV1 and INV2 are cross-coupled to constitute a flip-flop circuit as an information storage portion that stores 1-bit information. Also, one input/output terminal (storage node A) of this flip-flop circuit is connected to one of a source region and a drain region of the transfer MISFET Qt1, and the other input/output terminal (storage node B) thereof is connected to one of a source region and a drain region of the transfer MISFET Qt2.

Furthermore, the other of the source region and the drain region of the transfer MISFET Qt1 is connected to the data line DL, and the other of the source region and the drain region of the transfer MISFET Qt2 is connected to the data line /DL. Also, one end of the flip-flop circuit (each source region of the load MISFETs Qp1 and Qp2) is connected to a power supply voltage (Vcc), and the other end thereof (each source region of the driver MISFETs Qd1 and Qd2) is connected to a reference voltage (Vss).

The operation of the circuit will be described. When the storage node A of one CMOS inverter INV1 is at a high potential ("H"), the driver MISFET Qd2 is turned ON, and therefore, the storage node B of the other CMOS inverter INV2 changes to a low potential ("L"). Therefore, the driver MISFET Qd1 is turned OFF, and the high potential ("H") of the storage node A is maintained. More specifically, the states of the mutual storage nodes A and B are maintained by the latch circuit in which the pair of CMOS inverters IVN1 and INV2 is cross-coupled, and the information is stored during the period when the power supply voltage is being applied.

The word line WL is connected to the gate electrodes of the transfer MISFETs Qt1 and Qt2, and the conduction and the non-conduction of the transfer MISFETs Qt1 and Qt2 are controlled by this word line WL. More specifically, when the word line WL is at a high potential ("H"), the transfer MISFETs Qt1 and Qt2 are turned ON, and the latch circuit and the complementary data lines (data lines DL and /DL) are electrically connected. Accordingly, the potential states ("H" or "L") of the storage nodes A and B appears in the data lines DL and /DL and read as the information of the memory cell MC.

When writing the information in the memory cell MC, the word line WL is set to the "H" potential level and the transfer MISFETs Qt1 and Qt2 are put into an ON state, thereby transmitting the information of the data lines DL and /DL to the storage nodes A and B. The SRAM can be operated in the above-described manner.

Figure 2:
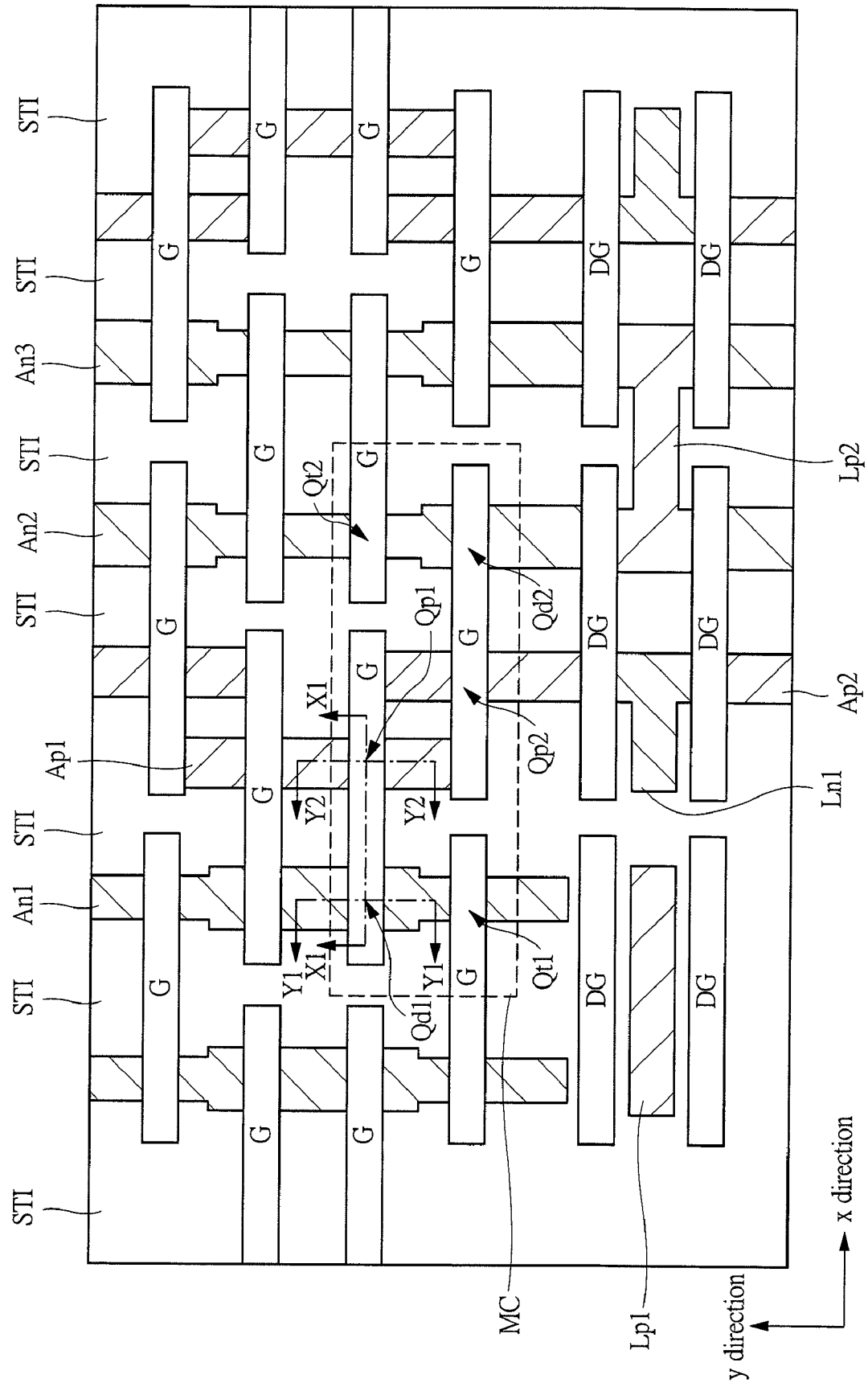
FIG. 2 is a plan view showing a planar layout of the SRAM.

Next, an example of the layout configuration of the above-described SRAM will be described with reference to FIG. 2. FIG. 2 is a plan view schematically showing the layout configuration of the SRAM. The memory cell MC of the SRAM is constituted of, for example, six field effect transistors including the pair of driver MISFETs Qd1 and Qd2, the pair of load MISFETs Qp1 and Qp2, and the pair of transfer MISFETs Qt1 and Qt2 formed on a semiconductor substrate as shown in FIG. 2. In this case, the n-channel MISFETs are used for the pair of driver MISFETs Qd1 and Qd2 and the pair of transfer MISFETs Qt1 and Qt2, and the p-channel MISFETs are used for the pair of load MISFETs Qp1 and Qp2.

Concretely, the semiconductor substrate is partitioned by element isolation regions STI into a plurality of active regions An1, An2, An3, Ap1 and Ap2. The plurality of active regions An1, An2, An3, Ap1 and Ap2 partitioned by the element isolation regions STI are arranged to extend in a first direction of the semiconductor substrate, and the element isolation regions STI surround the active regions An1, An2, An3, Ap1 and Ap2. In the active regions An1, An2 and An3 that form the n-channel MISFET, a source region and a drain region are formed by implanting an n-type impurity such as phosphorus or arsenic into the active regions An1, An2 and An3. Then, gate electrodes G are formed on the active regions An1, An2 and An3 between the source region and the drain region via gate insulating films. The gate electrodes G extend in a second direction orthogonal to the first direction in which the active regions An1, An2 and An3 extend. In this manner, the n-channel MISFET is formed from the gate electrode G formed on the active regions An1, An2 and An3, and the source region and the drain region formed in the active regions An1, An2 and An3 so as to sandwich the gate electrode G. Similarly, the p-channel MISFET is formed from the gate electrode G formed on the active regions Ap1 and Ap2, and the source region and the drain region formed in the active regions Ap1 and Ap2 so as to sandwich the gate electrode G.

For example, in the memory cell MC of the SRAM, the driver MISFET Qd1 and the transfer MISFET Qt1 constituted of the source region, the drain region and the two gate electrodes G formed in the active region An1 are formed in the same active region An1. Also, the load MISFET Qp1 is formed of the source region, the drain region and the gate electrode G formed in the active region Ap1, and the load MISFET Qp2 is formed of the source region, the drain region and the gate electrode G formed in the active region Ap2. Similarly, the driver MISFET Qd2 and the transfer MISFET Qt2 constituted of the source region, the drain region and the gate electrodes G formed in the active region An2 are formed in the same active region An2.

Furthermore, in the SRAM, other than the plurality of memory cells MC constituted of six field effect transistors, substrate potential supply portions Lp1 and Lp2 are provided in order to obtain the potential of the drain region of the driver transistors Qd1 and Qd2 because of the structural issue of the SRAM. The substrate potential supply portions Lp1 and Lp2 are formed from a p-type semiconductor region. Similarly, a substrate potential supply portion Ln1 formed from an n-type semiconductor region is also formed on the semiconductor substrate. Fundamentally, the region between the forming region of the memory cell MC and the substrate potential supply portions Lp1, Lp2 and Ln1 is a region in which the formation of the gate electrode G is not required, but the dummy gate electrodes DG corresponding to the space of the gate electrodes G are formed in order to ensure the processing accuracy by evenly forming the gate electrodes G throughout the semiconductor substrate. In this manner, the SRAM is formed on the semiconductor substrate.

Next, the structure of the driver MISFET Qd1 taken along the line Y1-Y1 in FIG. 2 and the structure of the load MISFET Qp1 taken along the line Y2-Y2 in FIG. 2 will be described. Since the driver MISFET Qd1 is constituted of an n-channel MISFET, the driver MISFET Qd1 is an n-channel MISFET in FIG. 3. Similarly, since the load MISFET Qp1 is constituted of a p-channel MISFET, the load MISFET Qp1 is a p-channel MISFET in FIG. 3.

Figure 3:
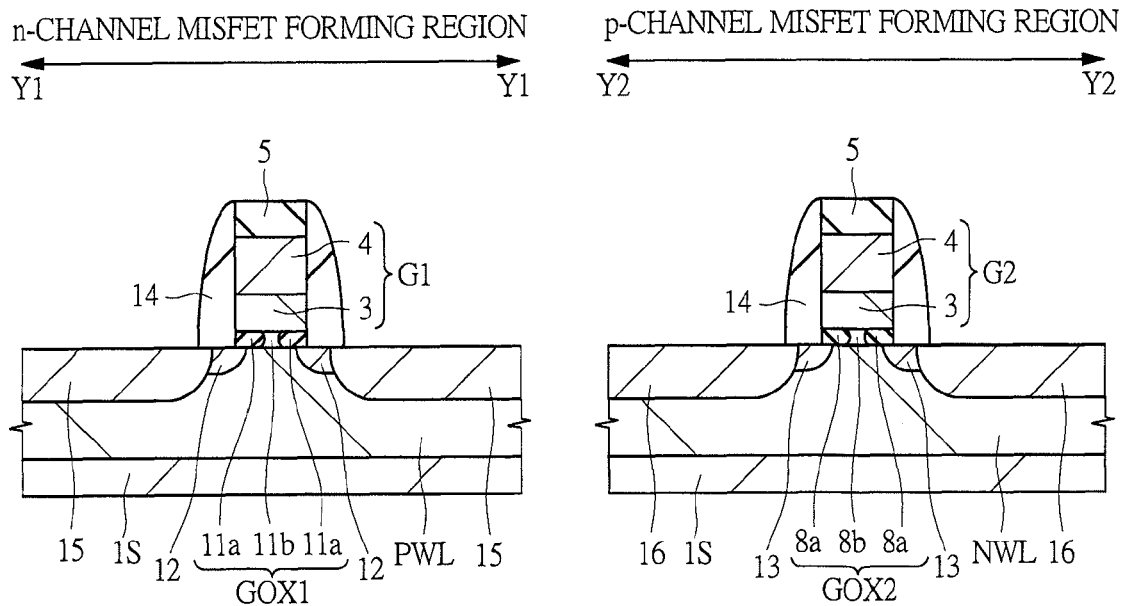
FIG. 3 is a diagram showing a cross-sectional view taken along the line Y1-Y1 and a cross-sectional view taken along the line Y2-Y2 in FIG. 2 side-by-side.

FIG. 3 is a diagram showing the cross-sectional structures of the n-channel MISFET (left MISFET in FIG. 3) and the p-channel MISFET (right MISFET in FIG. 3) constituting the SRAM. The structure of the MISFET according to the first embodiment will be described with reference to FIG. 3. First, the structure of the n-channel MISFET will be described. As shown in FIG. 3 (left side), a p-type well PWL is formed in a semiconductor substrate 1S, and a gate insulating film GOX1 is formed on the semiconductor substrate 1S having the p-type well PWL formed therein. Then, a gate electrode G1 is formed on the gate insulating film GOX1. In the first embodiment, the gate electrode G1 is made of a metal film, so that the so-called metal gate structure is formed. Concretely, the gate electrode G1 is constituted of a stacked film of a titanium nitride film 3 and a tungsten film 4. The titanium nitride film 3 is in direct contact with the gate insulating film GOX1 and is used for adjusting the threshold voltage of the n-channel MISFET. On the other hand, the tungsten film 4 is formed to reduce the resistance of the gate electrode G1. On the gate electrode G1, a cap insulating film made of a silicon nitride film 5 is formed, and sidewalls 14 are formed on both sidewalls of the gate electrode G1. The sidewall 14 is made of, for example, a silicon nitride film.

Next, in the p-type well PWL just below the sidewalls 14, shallow n-type impurity diffusion regions 12 provided in alignment with the gate electrode G1 are formed. This shallow n-type impurity diffusion region 12 is a semiconductor region formed by implanting an n-type impurity such as phosphorus (P) or arsenic (As) into the semiconductor substrate 1S. Further, in the p-type well PWL outside the shallow n-type impurity diffusion regions 12, deep n-type impurity diffusion regions 15 in alignment with the sidewalls 14 are formed. This deep n-type impurity diffusion region 15 is also formed by implanting an n-type impurity such as phosphorus or arsenic into the semiconductor substrate 1S, and is a semiconductor region. As described above, the source region and the drain region of the n-channel MISFET are formed from the pair of shallow n-type impurity diffusion regions 12 and the pair of deep n-type impurity diffusion regions 15. In the manner described above, the n-channel MISFET is formed on the semiconductor substrate 1S.

Subsequently, the structure of the p-channel MISFET will be described. As shown in FIG. 3 (right side), an n-type well NWL is formed in the semiconductor substrate 1S, and a gate insulating film GOX2 is formed on the semiconductor substrate is having the n-type well NWL formed therein. Then, a gate electrode G2 is formed on the gate insulating film GOX2. In the first embodiment, the gate electrode G2 is made of a metal film, so that the so-called metal gate structure is formed. Concretely, the gate electrode G2 is constituted of a stacked film of the titanium nitride film 3 and the tungsten film 4. The titanium nitride film 3 is in direct contact with the gate insulating film GOX2 and is used for adjusting the threshold voltage of the p-channel MISFET. On the other hand, the tungsten film 4 is formed to reduce the resistance of the gate electrode G2. On the gate electrode G2, a cap insulating film made of the silicon nitride film 5 is formed, and sidewalls 14 are formed on both sidewalls of the gate electrode G2. The sidewall 14 is made of, for example, a silicon nitride film.

Next, in the n-type well NWL just below the sidewalls 14, shallow p-type impurity diffusion regions 13 provided in alignment with the gate electrode G2 are formed. This shallow p-type impurity diffusion region 13 is a semiconductor region formed by implanting a p-type impurity such as boron (B) into the semiconductor substrate 1S. Further, in the n-type well NWL outside the shallow p-type impurity diffusion regions 13, deep p-type impurity diffusion regions 16 in alignment with the sidewalls 14 are formed. This deep p-type impurity diffusion region 16 is also formed by implanting a p-type impurity such as boron into the semiconductor substrate 1S, and is a semiconductor region. As described above, the source region and the drain region of the p-channel MISFET are formed from the pair of shallow p-type impurity diffusion regions 13 and the pair of deep p-type impurity diffusion regions 16. In the manner described above, the p-channel MISFET is formed on the semiconductor substrate 1S.

Figure 4:
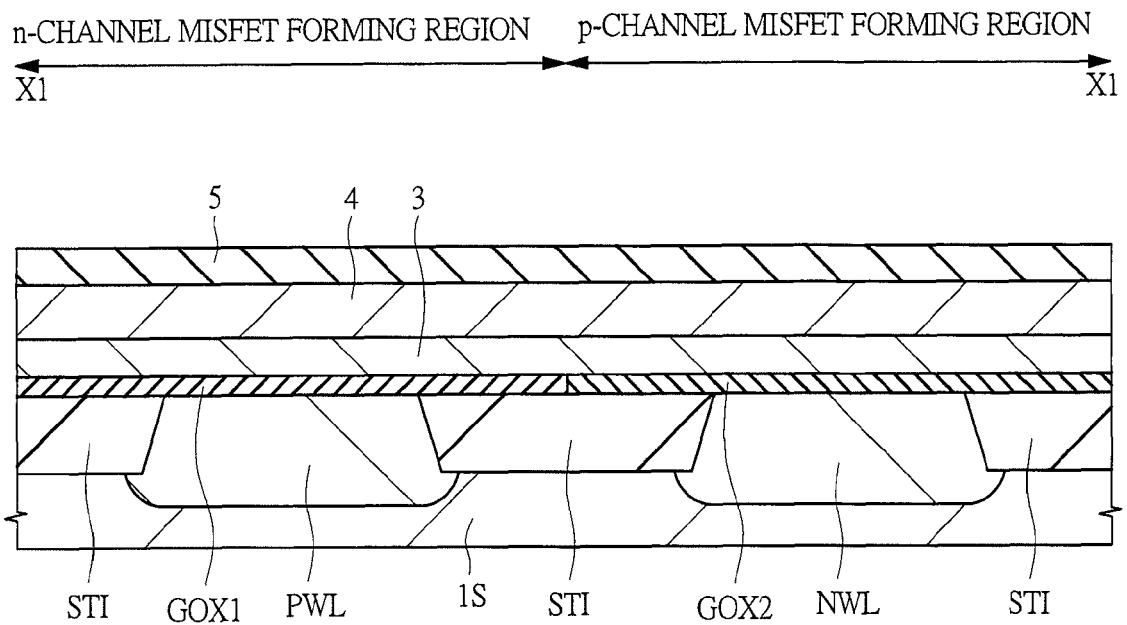
FIG. 4 is a cross-sectional view taken along the line X1-X1 in FIG. 2.

The gate electrode G1 of the n-channel MISFET (driver MISFET Qd1) and the gate electrode G2 of the p-channel MISFET (load MISFET Qp1) are formed as one gate electrode G as shown in FIG. 2. FIG. 4 is a cross-sectional view taken along the line X1-X1 in FIG. 2. As shown in FIG. 4, in the semiconductor substrate 1S, the element isolation regions STI are formed, and the n-channel MISFET and the p-channel MISFET are formed in the active regions separated by the element isolation regions STI. For example, the p-type well PWL is formed in the active region sandwiched between the left element isolation region STI and the central element isolation region STI of the three element isolation regions STI shown in FIG. 4. On the other hand, the n-type well NWL is formed in the active region sandwiched between the central element isolation region STI and the right element isolation region STI. The region in which the p-type well PWL is formed is the n-channel MISFET forming region, and the region in which the n-type well NWL is formed is the p-channel MISFET forming region.

Further, the gate insulating film GOX1 is formed on the p-type well PWL, and the gate insulating film GOX2 is formed on the n-type well NWL. Also, the titanium nitride film 3 is formed on the gate insulating film GOX1 and the gate insulating film GOX2. In other words, the titanium nitride film 3 is formed over both the n-channel MISFET forming region and the p-channel MISFET forming region. Similarly, the tungsten film 4 is formed on the titanium nitride film 3, and the silicon nitride film 5 is formed on the titanium film 4. Therefore, the gate electrode G constituted of the titanium nitride film 3 and the tungsten film 4 (see FIG. 2) is formed over both the n-channel MISFET forming region and the p-channel MISFET forming region. In other words, the gate electrode G shown in FIG. 2 functions as the gate electrode G1 of the n-channel MISFET (see FIG. 3) in the n-channel MISFET forming region and functions as the gate electrode G2 of the p-channel MISFET (see FIG. 3) in the p-channel MISFET forming region.

Next, the structures of the gate insulating film GOX1 of the n-channel MISFET shown in FIG. 3 and the gate insulating film GOX2 of the p-channel MISFET shown in FIG. 3 will be described in detail. First, in the first embodiment, a high-dielectric-constant film having a dielectric constant higher than that of a silicon oxide film is used to form the gate insulating film GOX1 and the gate insulating film GOX2. Conventionally, from the perspective of high withstand voltage and excellent electrical and physical stability at a silicon-silicon oxide interface, a silicon oxide film has been used as the gate insulating film GOX1 and the gate insulating film GOX2. However, along with the further scaling down of the device, the extremely small thickness has been demanded for the thickness of the gate insulating film GOX1 (gate insulating film GOX2). When the thin silicon oxide film like this is used as the gate insulating film GOX1 (gate insulating film GOX2), electrons flowing through the channel of the MISFET tunnel through the barrier wall formed of the silicon oxide film, that is, the so-called tunnel current is generated.

For its prevention, a material having a dielectric constant higher than that of a silicon oxide film has been used to form a high-dielectric-constant film capable of increasing the physical film thickness without changing the capacitance. Since the physical film thickness can be increased while maintaining the same capacitance when the high-dielectric-constant film is used, the leakage current can be reduced. For example, in the first embodiment, a HfMgO film is used as the gate insulating film GOX1 of the n-channel MISFET, and a HfAlO film is used as the gate insulating film GOX2 of the p-channel MISFET. The case where the gate insulating film GOX1 of the n-channel MISFET and the gate insulating film GOX2 of the p-channel MISFET are formed from the films having different compositions will be described below.

When a silicon oxide film is used as the gate insulating film GOX1 (gate insulating film GOX2), the gate electrode formed on the gate insulating film GOX1 (gate insulating film GOX2) is made of a polysilicon film. Then, an n-type impurity (for example, phosphorus or arsenic) is implanted into the polysilicon film constituting the gate electrode in the n-channel MISFET. By this means, the work function (Fermi level) of the gate electrode is set near the conduction band (near 4.05 eV) of silicon, thereby achieving the reduction of the threshold voltage of the n-channel MISFET. Meanwhile, in the p-channel MISFET, a p-type impurity (for example, boron) is implanted into the polysilicon film constituting the gate electrode. By this means, the work function of the gate electrode is set near the valence band (near 5.17 eV) of silicon, thereby achieving the reduction of the threshold voltage of the p-channel MISFET. More specifically, in the case where a silicon oxide film is used as the gate insulating film GOX1 (gate insulating film GOX2), the work function of the gate electrode can be set near the conduction band or the valence band by implanting an n-type impurity or a p-type impurity into the gate electrode.

However, in the case where a high-dielectric-constant film is used as the gate insulating film GOX1 (gate insulating film GOX2), the work function of the gate electrode cannot be set near the conduction band or the valence band even when an n-type impurity or a p-type impurity is implanted into a gate electrode made of a polysilicon film. More specifically, when a high-dielectric-constant film is used as the gate insulating film GOX1 (gate insulating film GOX2), the work function of the gate electrode is increased and separated from near the conduction band in the n-channel MISFET. Therefore, the threshold voltage of the n-channel MISFET is increased. Meanwhile, the work function of the gate electrode is reduced and separated from the valence band in the p-channel MISFET. Therefore, similar to the n-channel MISFET, the threshold voltage thereof is increased. The phenomenon that the work function of the gate electrode shifts in a direction of the increase of a threshold voltage as described above is interpreted as Fermi level pinning. This Fermi level pinning appears particularly in the p-channel MISFET. That is, the increase in threshold voltage in the case where a high-dielectric-constant film is used for a gate insulating film appears particularly in the p-channel MISFET. Therefore, it can be understood that the threshold voltage cannot be appropriately adjusted if a polysilicon film is used to form a gate electrode when a high-dielectric-constant film is used as the gate insulating film GOX1 (gate insulating film GOX2).

For this reason, the studies have been made on the formation of the gate electrode disposed on the gate insulating film GOX1 (gate insulating film GOX2) from a metal film instead of a polysilicon film in the case where a high-dielectric-constant film having a dielectric constant higher than that of a silicon oxide film is used for the gate insulating film GOX1 (gate insulating film GOX2). If a metal film is used to form the gate electrode, the threshold voltage can be adjusted by selecting the type of the metal film instead of adjusting the threshold voltage by implanting an impurity like in the case of using the polysilicon film. Therefore, it is possible to solve the problem of the above-described Fermi level pinning by using a metal film for a gate electrode.

When a metal film (including a metal compound film) is used to form the gate electrode, the work function value for reducing the threshold voltage differs in the n-channel MISFET and the p-channel MISFET. Therefore, it is conceivable that different metal films are used for the n-channel MISFET and the p-channel MISFET. However, since the gate length of the gate electrode to which the first embodiment is directed is miniaturized to 20 nm or less, it is necessary to ensure the vertical processability of the gate electrode. Therefore, when different metal films are used for the n-channel MISFET and the p-channel MISFET, the vertical processability has to be ensured for both the different metal films. For this reason, in the first embodiment, the gate electrode G1 of the n-channel MISFET and the gate electrode G2 of the p-channel MISFET are constituted of a stacked film (titanium nitride film and tungsten film) with the same composition as shown in FIG. 3. In this case, it is impossible to optimally adjust the threshold voltage of the n-channel MISFET and the threshold voltage of the p-channel MISFET. Therefore, in the first embodiment, the gate electrode G1 of the n-channel MISFET and the gate electrode G2 of the p-channel MISFET are formed to have the same composition, and at the same time, the gate insulating film GOX1 and the gate insulating film GOX2 are formed to have different compositions. In other words, by using the films of different compositions for the gate insulating film GOX1 of the n-channel MISFET and the gate insulating film GOX2 of the p-channel MISFET, both the threshold voltage of the n-channel MISFET and the threshold voltage of the p-channel MISFET can be reduced. For this reason, in the first embodiment, a high-dielectric-constant film having a dielectric constant higher than that of a silicon oxide film is used for the gate insulating film GOX1 and the gate insulating film GOX2, and the gate insulating film GOX1 and the gate insulating film GOX2 are formed to have different compositions.

The first embodiment is characterized by forming the gate insulating film GOX1 and the gate insulating film GOX2 having different compositions without exposing the semiconductor substrate 1S. However, when this manufacturing method is used, the gate insulating film GOX1 and the gate insulating film GOX2 have the following structures. In other words, by using the characteristic manufacturing method in the first embodiment, the trace thereof clearly remains in the structures of the gate insulating film GOX1 and the gate insulating film GOX2.

This point will be described. As shown in FIG. 3, when focusing on the n-channel MISFET, for example, the gate insulating film GOX1 is constituted of a high-concentration HfMgO film 11a and a low-concentration HfMgO film 11b. In other words, the gate insulating film GOX1 has the structure in which the high-concentration HfMgO film 11a is formed at both end portions in the channel direction and the low-concentration HfMgO film 11b is formed at the central portion. Note that FIG. 3 shows as if the high-concentration HfMgO film 11a is formed at both end portions and the low-concentration HfMgO film 11b is formed at the central portion, but actually, the amount of magnesium (element) contained in the gate insulating film GOX1 continuously decreases as going from the end portion toward the central portion in the gate length direction.

The same is true of the gate insulating film GOX2 of the p-channel MISFET. The gate insulating film GOX2 is constituted of a high-concentration HfAlO film 8a and a low-concentration HfAlO film 8b. In other words, the gate insulating film GOX2 has the structure in which the high-concentration HfAlO film 8a is formed at both end portions in the channel direction and the low-concentration HfAlO film 8b is formed at the central portion. Note that FIG. 3 shows as if the high-concentration HfAlO film 8a is formed at both end portions and the low-concentration HfAlO film 8b is formed at the central portion, but actually, the amount of aluminum (element) contained in the gate insulating film GOX2 continuously decreases as going from the end portion toward the central portion in the gate length direction.

In the description above, the high-concentration HfMgO film 11a means that magnesium (element) is contained in $HfO_2$ at a high concentration. In other words, the low-concentration HfMgO film 11b means that magnesium (element) is contained in $HfO_2$ at a low concentration. Similarly, the high-concentration HfAlO film 8a means that aluminum (element) is contained in $HfO_2$ at a high concentration, and the low-concentration HfAlO film 8b means that aluminum (element) is contained in $HfO_2$ at a low concentration.

Figure 5:
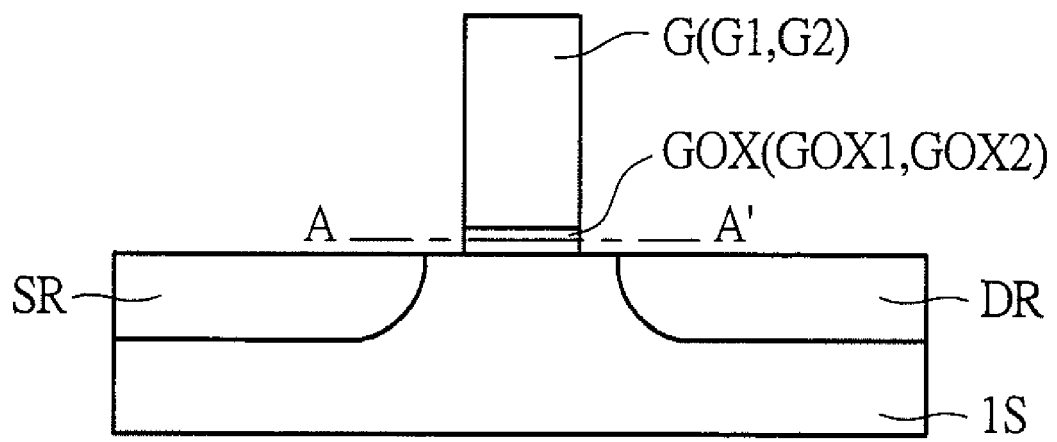
FIG. 5 is a diagram schematically showing the concentration distribution in a channel direction of an element implanted into a gate insulating film.
Figure 5:
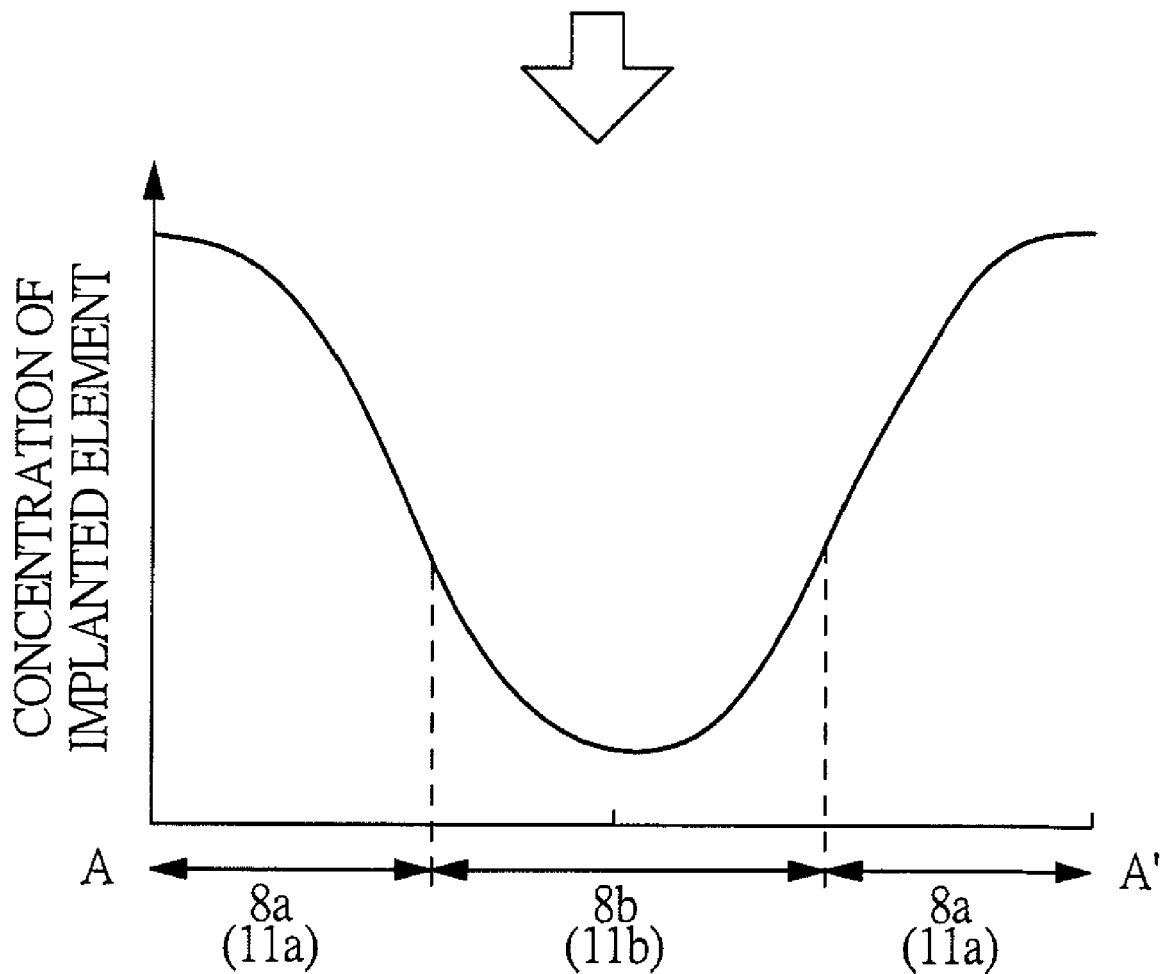

The structure described above is illustrated in FIG. 5. FIG. 5 (upside) schematically shows the structure of the MISFET. Concretely, the gate insulating film GOX is formed on the semiconductor substrate S1, and the gate electrode G is formed on this gate insulating film GOX. Then, a source region SR and a drain region DR are formed in alignment with the gate electrode G in the semiconductor substrate 1S. FIG. 5 (downside) shows the concentration of the additive element along the line A-A' of the gate insulating film GOX in FIG. 5 (upside). In FIG. 5 (downside), the horizontal axis represents the distance from a point A on the line A-A', and the vertical axis represents the concentration of the additive element to be implanted into the gate insulating film GOX. For example, when the gate insulating film GOX is the gate insulating film GOX1 of the n-channel MISFET, the additive element is magnesium, and when the gate insulating film GOX is the gate insulating film GOX2 of the p-channel MISFET, the additive element is aluminum. As shown in FIG. 5, the concentration of the implanted element is large at the point A (end portion of the gate insulating film GOX), and the concentration decreases as going from the point A toward the central portion. Further, the concentration increases as going from the central portion to the point A'. Therefore, as shown in the profile of the implanted element divided by dotted lines in FIG. 5, the relatively high-concentration HfMgO film 11a is formed in the proximity of both the end portions (point A and point A') of the gate insulating film GOX1, and the relatively low-concentration HfMgO film 11b is formed in the proximity of the central portion of the gate insulating film GOX1. Similarly, the relatively high-concentration HfAlO film 8a is formed in the proximity of both the end portions (point A and point A') of the gate insulating film GOX2, and the relatively low-concentration HfAlO film 8b is formed in the proximity of the central portion of the gate insulating film GOX2.

In this specification, the concentration of the implanted element added to the gate insulating film GOX1 continuously changes as shown in FIG. 5, but since it is difficult to illustrate this continuous change, the gate insulating film GOX1 is described as if it is constituted of the high-concentration HfMgO film 11a and the low-concentration HfMgO film 11b as a matter of convenience. Similarly, the gate insulating film GOX2 is described as if it is constituted of the high-concentration HfAlO film 8a and the low-concentration HfAlO film 8b. As described above, when the characteristic manufacturing method of the first embodiment is used, the gate insulating film GOX1 of the n-channel MISFET is constituted of the high-concentration HfMgO film 11a and the low-concentration HfMgO film 11b, and the gate insulating film GOX2 of the p-channel MISFET is constituted of the high-concentration HfAlO film 8a and the low-concentration HfAlO film 8b.

Next, it will be proven that there is no problem with respect to characteristics in the MISFET even if the gate insulating film GOX1 and the gate insulating film GOX2 are formed in the manner described above. For example, when the n-channel MISFET is considered, the gate insulating film GOX1 is constituted of the high-concentration HfMgO film 11a and the low-concentration HfMgO film 11b in the first embodiment. In other words, in the gate insulating film GOX1, the content of magnesium (element) is high at the end portions in the channel direction and the content of magnesium (element) is low at the central portion. As described above, in the gate insulating film GOX1, magnesium is not evenly contained in the whole film, but the content of magnesium changes in a predetermined manner. In this case, whether or not the threshold voltage can be appropriately adjusted by the gate insulating film GOX1 is important. More specifically, in the gate insulating film GOX1 of the n-channel MISFET, the effect of reducing the threshold voltage becomes larger in the region where the content of magnesium is high. Accordingly, the effect of reducing the threshold voltage is large in the end portion of the gate insulating film GOX1 because the content of magnesium is high, but there is concern that the effect of reducing the threshold voltage cannot be sufficiently achieved in the central portion of the gate insulating film GOX1 because the content of magnesium is low.

Figure 6:
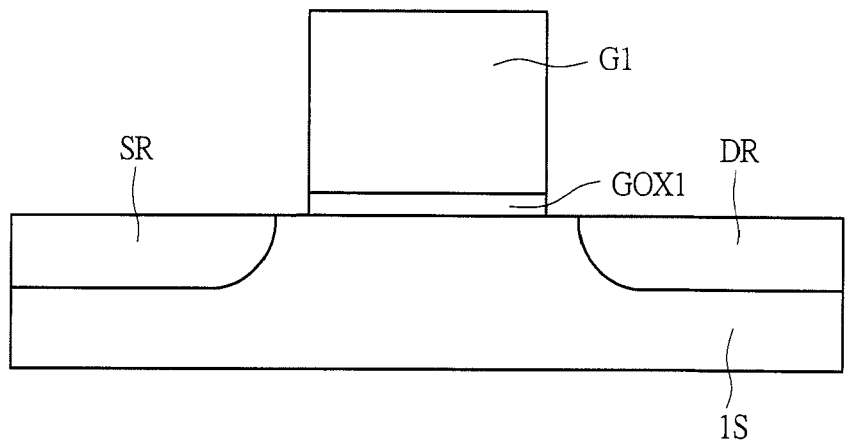
FIG. 6 is a diagram schematically showing a potential barrier in a channel region in a MISFET having a gate length of, for example, 20 nm or more.
Figure 6:
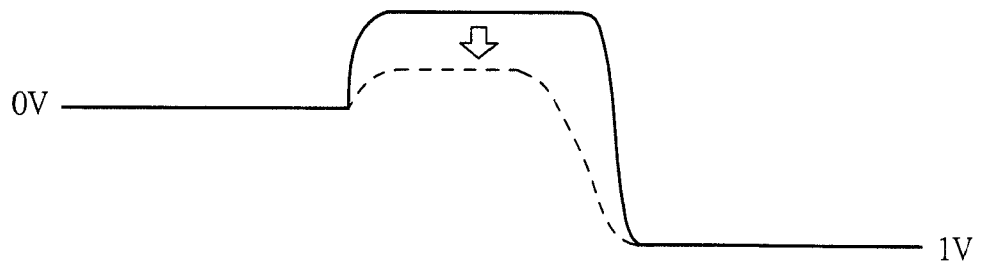

FIG. 6 is a diagram for describing a potential barrier in a channel of a MISFET. The MISFET to which FIG. 6 is directed is the MISFET having the gate electrode G1 whose gate length is 20 nm or more. In this case, the potential barrier with respect to electrons is shown in FIG. 6 (downside). FIG. 6 (downside) corresponds to the schematic structure of the MISFET shown in FIG. 6 (upside). Concretely, the case where electrons are allowed to flow from the source region SR to the drain region DR of the MISFET will be considered. In this state, for example, the potential of the source region SR is 0 V, and the potential of the drain region DR is 1 V. When this state is viewed from the standpoint of electrons, since the region at a positive electric potential is low in terms of potential, the drain region DR is lower than the source region SR in potential. A potential barrier is formed in the channel region between the source region SR and the drain region DR, so that electrons do not flow from the source region SR to the drain region DR when this potential barrier is high. This is the OFF state. Meanwhile, in the ON state, a predetermined voltage is applied to the gate electrode G1. Then, the potential barrier formed in the channel region is lowered by the voltage applied to the gate electrode G1, so that electrons flow from the source region SR to the drain region DR. At this time, the state where the potential barrier formed in the channel region is lowered in advance is desirable for turning ON the MISFET in the state where the voltage applied to the gate electrode G1 is relatively low. In order to achieve this state, a HfMgO film is used as the gate insulating film GOX1 in the n-channel MISFET. By this means, as shown in FIG. 6 (downside), the potential barrier (solid line) of the channel region is lowered as indicated by the dashed line. However, the MISFET shown in FIG. 6 (upside) is directed to the relatively large MISFET having the gate electrode G1 whose gate length is 20 nm or more. In this case, since the potential barrier is high over the entirety of the channel region, magnesium has to be added at a high concentration into the whole gate insulating film GOX1 in order to lower the potential barrier over the entirety of the channel region. More specifically, the potential barrier which is high over the entirety of the channel region can be lowered by adding magnesium at a high concentration into the whole gate insulating film GOX1. As a result, the threshold voltage of the MISFET can be reduced. As can be understood from the above, for reducing the threshold voltage when the gate length of the gate electrode G1 is long, magnesium has to be evenly implanted from the end portion to the central portion of the gate insulating film GOX1 at a high concentration. Therefore, in the structure in which the high-concentration HfMgO film is formed at the end portion of the gate insulating film GOX1 and the low-concentration HfMgO film is formed at the central portion of the gate insulating film GOX1 like in the first embodiment, there is a possibility that the threshold voltage of the MISFET cannot be sufficiently reduced. However, the MISFET to which the first embodiment is directed is miniaturized so as to have the gate electrode G1 whose gate length is 20 nm or less. In such a miniaturized MISFET, the threshold voltage of the MISFET can be sufficiently reduced if the high-concentration HfMgO film is formed at least at the end portion like the gate insulating film GOX1 of the first embodiment.

Figure 7:
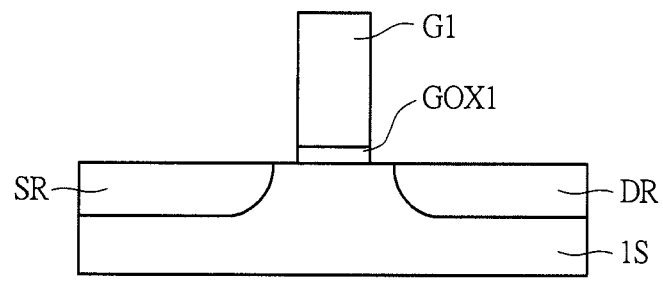
FIG. 7 is a diagram schematically showing a potential barrier in a channel region in a MISFET having the gate length of, for example, 20 nm or less.
Figure 7:
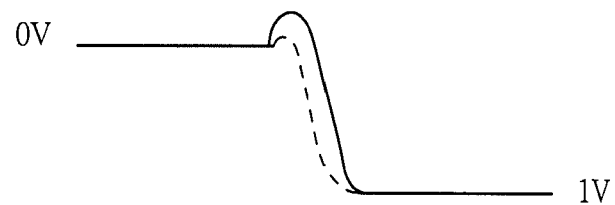

This point will be described. FIG. 7 is a diagram for describing the potential barrier in the channel of the MISFET. FIG. 7 is directed to the MISFET having the gate electrode G1 whose gate length is 20 nm or less. In FIG. 7, the potential barrier with respect to electrons is shown so as to correspond to the structure of the MISFET. At this time, similar to FIG. 6, the potential of the source region SR is 0 V, and the potential of the drain region DR is 1 V. When this state is viewed from the standpoint of electrons, since the region at a positive electric potential is low in terms of potential, the drain region DR is lower than the source region SR in potential. A potential barrier is formed in the channel region between the source region SR and the drain region DR. The potential barrier formed in the channel region shown in FIG. 7 is different from the potential barrier in the channel region shown in FIG. 6. More specifically, in FIG. 7, the potential barrier is not increased over the entirety of the channel region, but the potential barrier is high only at the proximity of the end portion of the channel region on the source region SR side. This suggests that the threshold voltage of the MISFET can be reduced when the potential barrier can be lowered at the end portion on the source region SR side even if the potential barrier is not lowered over the entirety of the channel region.

In the first embodiment, the gate insulating film GOX1 is constituted of the high-concentration HfMgO film formed at the end portion and the low-concentration HfMgO film formed at the central portion. More specifically, the high-concentration HfMgO film is formed at the end portion on the source region SR side. Therefore, it is possible to sufficiently reduce the potential barrier increased at the end portion of the channel region on the source region SR side. As a result, in the MISFET miniaturized to have the gate length of 20 nm or less, the threshold voltage can be sufficiently reduced even in the structure of the gate insulating film GOX1 in the first embodiment. In other words, even when the gate insulating film GOX1 is formed so that the content of magnesium (element) is high at the end portion in the channel direction and the content of magnesium (element) is low at the central portion, there is no problem with respect to the characteristics of the MISFET for reducing the threshold voltage. Although the description above has been made based on the n-channel MISFET, the same is true of the p-channel MISFET.

The semiconductor device according to the first embodiment is constituted as described above, and the manufacturing method thereof will be described below. The first embodiment is characterized in the manufacturing method in which the gate insulating film of the n-channel MISFET and the gate insulating film of the p-channel MISFET are formed from different high-dielectric-constant films, but the manufacturing method studied by the inventor of the present invention will be first described to show the problems thereof.

The technology studied by the inventor of the present invention will be described with reference to the cross section taken along the line X1-X1 in FIG. 2. In other words, the example where the gate insulating film of the n-channel MIS- FET and the gate insulating film of the p-channel MISFET are formed from different high-dielectric-constant films in an SRAM will be described.

Figure 8:
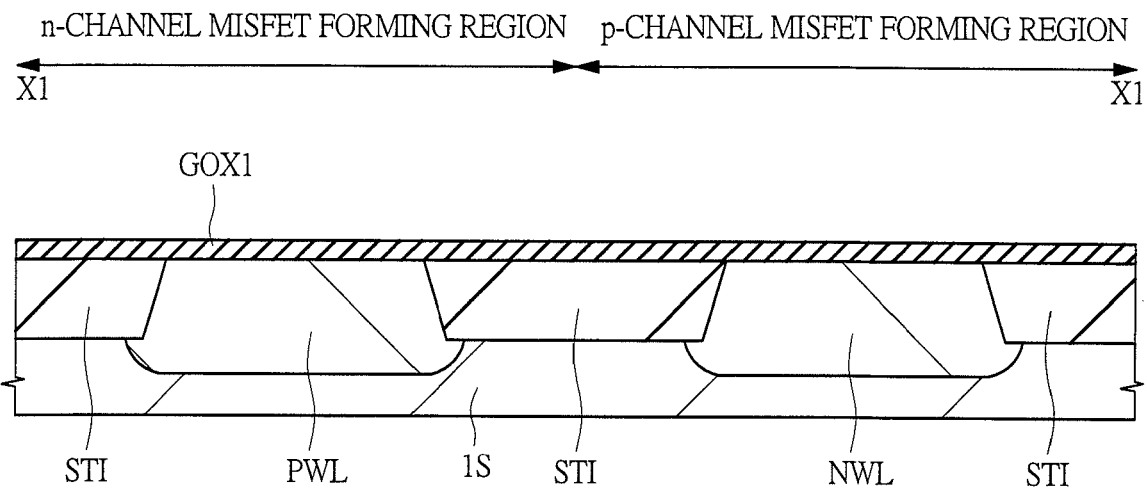
FIG. 8 is a diagram studied by the inventor of the present invention, and is a cross-sectional view showing a manufacturing process of a semiconductor device.

As shown in FIG. 8, element isolation regions STI are formed in the semiconductor substrate S1, and the p-type well PWL and the n-type well NWL are formed in the active regions separated by the element isolation regions STI. Concretely, the p-type well PWL is formed in the active region in the n-channel MISFET forming region, and the n-type well NWL is formed in the active region in the p-channel MISFET forming region. Subsequently, the gate insulating film GOX1 is formed on the whole surface of the semiconductor substrate S1. In this manner, the surface of the semiconductor substrate 1S (the n-channel MISFET forming region and the p-channel MISFET forming region) is covered with the gate insulating film GOX1.

Figure 9:
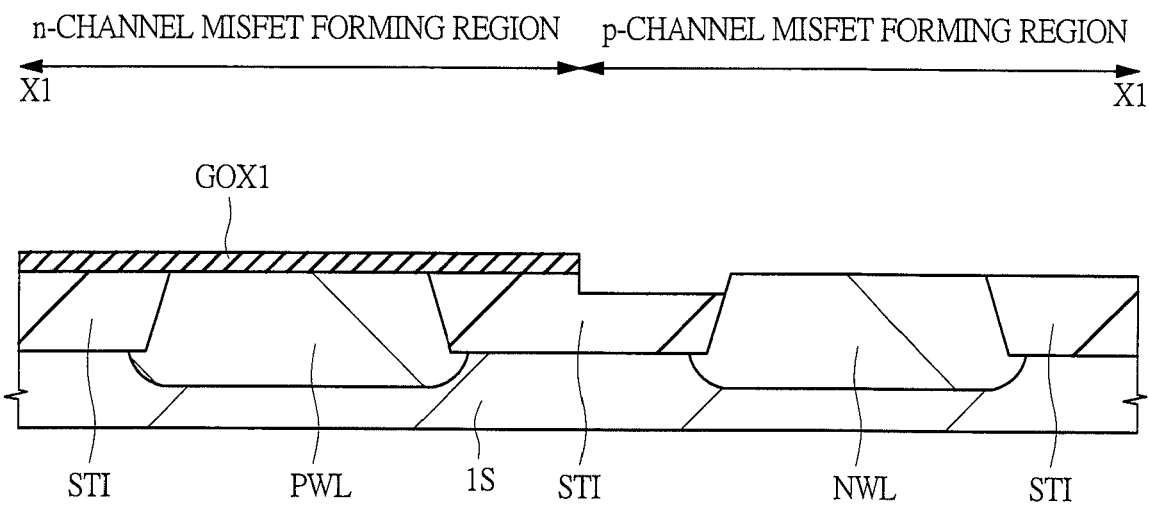
FIG. 9 is a diagram studied by the inventor of the present invention, and is a cross-sectional view showing the manufacturing process of a semiconductor device continued from FIG. 8.
Figure 10:
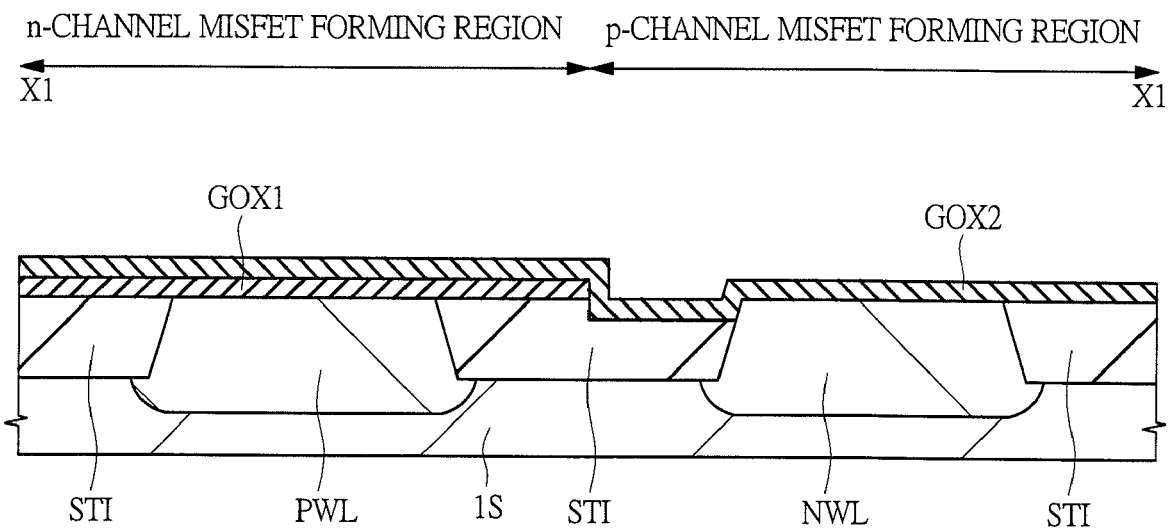
FIG. 10 is a diagram studied by the inventor of the present invention, and is a cross-sectional view showing the manufacturing process of a semiconductor device continued from FIG. 9.

Next, as shown in FIG. 9, the gate insulating film GOX1 formed in the p-channel MISFET forming region is removed by, for example, wet etching or others. At this time, the exposed element isolation region STI is also etched so that the trench is formed. Thereafter, as shown in FIG. 10, the gate insulating film GOX2 is formed on the whole surface of the semiconductor substrate 1S. In this manner, the gate insulating film GOX2 is formed directly on the semiconductor substrate S1 in the p-channel MISFET forming region, and on the other hand, the gate insulating film GOX2 is formed on the gate insulating film GOX1 in the n-channel MISFET forming region.

Figure 11:
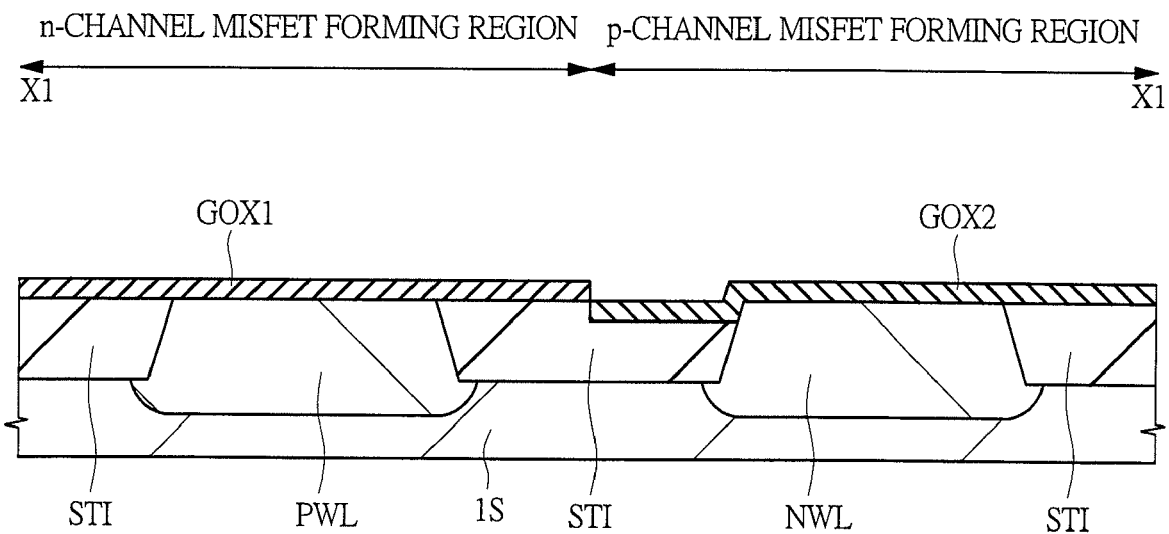
FIG. 11 is a diagram studied by the inventor of the present invention, and is a cross-sectional view showing the manufacturing process of a semiconductor device continued from FIG. 10.

Then, as shown in FIG. 11, the gate insulating film GOX2 formed in the n-channel MISFET forming region is removed by using the photolithography technique and the etching technique. In this manner, the gate insulating film GOX1 and the gate insulating film GOX2 having different compositions can be formed in the n-channel MISFET forming region and the p-channel MISFET forming region.

In the above-described process (FIG. 8 to FIG. 11), there is the step in which the semiconductor substrate 1S is exposed. In this case, there is a fear that the surface of the semiconductor substrate 1S is damaged by the exposure of the semiconductor substrate 1S. In other words, the gate insulating film GOX1 is formed in the n-channel MISFET forming region without exposing the semiconductor substrate 1S, but the gate insulating film GOX2 is formed in the p-channel MISFET forming region after exposing the semiconductor substrate 1S (see FIG. 9 and FIG. 10). Therefore, there is a fear that the gate insulating film GOX1 that is formed without exposing the semiconductor substrate 1S and the gate insulating film GOX2 that is formed after exposing the semiconductor substrate 1S may have different film qualities. In particular, since the region in which the gate stack structure (stacked structure of the processed gate insulating film and gate electrode) is formed is also exposed, there is concern that the film quality of the gate insulating film constituting the gate stack structure is adversely affected.

In the process of forming the MISFET, it is desired to avoid placing the semiconductor substrate 1S in a state different from the proven conventional manufacturing process as much as possible. In other words, when the semiconductor substrate 1S is placed in a state different from the proven conventional manufacturing process, the problem not observed in the conventional manufacturing process emerges as a new problem in some cases. Concretely, in the conventional manufacturing process, a silicon oxide film is used for the gate insulating film and a polysilicon film is used for the gate electrode. In this process, the same gate insulating film is used for the n-channel MISFET forming region and the p-channel MISFET forming region, and therefore, the semiconductor substrate 1S in either one of the n-channel MISFET forming region and the p-channel MISFET forming region is not exposed in the process of forming the gate insulating film. Meanwhile, in the case where different gate insulating films are used for the n-channel MISFET and the p-channel MISFET, there is the step in which the semiconductor substrate 1S is exposed as described above. Accordingly, in the case where different gate insulating films are used for the n-channel MISFET and the p-channel MISFET, the semiconductor substrate 1S is placed in the state different from the conventional manufacturing process, that is, the semiconductor substrate 1S is exposed in the forming process of the gate insulating film. Accordingly, there is concern that the reliability of the semiconductor device is deteriorated in the manufacturing process of the semiconductor device. This is the first problem.

Furthermore, a part of the exposed element isolation region STI is removed and a concave portion is formed in the element isolation region STI as shown in FIG. 9. In the SRAM, the same gate electrode G (see FIG. 2) is formed so as to extend in the n-channel MISFET forming region and the p-channel MISFET forming region through the element isolation region STI as shown by the line X1-X1 in FIG. 2. Therefore, the difference in level in the element isolation region STI is reflected to the gate electrode G formed so as to extend from the n-channel MISFET forming region to the p-channel MISFET forming region. Therefore, there is concern that the gate electrode cannot be appropriately patterned due to the influence of the difference in level (concave portion) in the element isolation region STI. In particular, when the difference in level (concave portion) in the element isolation region STI is large, the case where the gate electrode G extending from the n-channel MISFET forming region to the p-channel MISFET forming region is broken may occur. This is the second problem.

As described above, it can be understood that there is concern that the reliability of the semiconductor device is deteriorated in the technology studied by the inventor of the present invention. Therefore, the first embodiment provides the manufacturing method of a semiconductor device capable of forming a gate insulating film of an n-channel MISFET and a gate insulating film of a p-channel MISFET from respectively different high-dielectric-constant films without unnecessarily exposing a semiconductor substrate (in particular, semiconductor substrate below gate stack structure). The manufacturing method of a semiconductor device according to the first embodiment will be described below with reference to the drawings. The cross-sectional view taken along the line Y1-Y1 in FIG. 2 and the cross-sectional view taken along the line Y2-Y2 in FIG. 2 will be used for the drawings.

Figure 12:
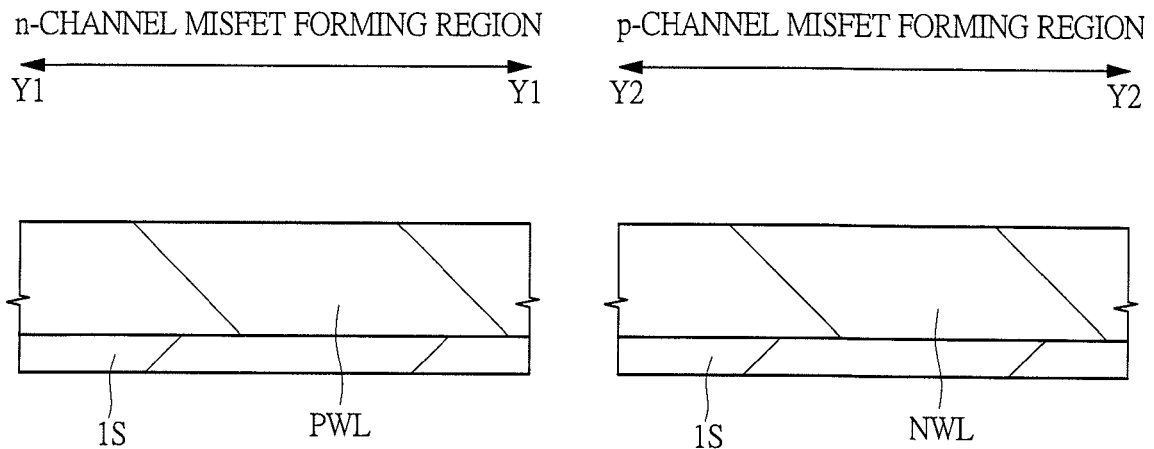
FIG. 12 is a cross-sectional view showing a manufacturing process of a semiconductor device according to the first embodiment of the present invention.

First, though not shown in FIG. 12, element isolation regions are formed on the semiconductor substrate 1S. The element isolation region is shown as the element isolation region STI in FIG. 2 and FIG. 4 corresponding to the cross-sectional view taken along the line X1-X1 in FIG. 2. The method of forming this element isolation region will be described.

First, after forming a silicon oxide film of about 5 nm to 20 nm on the semiconductor substrate 1S, a silicon nitride film of about 50 nm to 200 nm is formed on the silicon oxide film. The silicon oxide film can be formed by, for example, thermal oxidation, and the silicon nitride film can be formed by, for example, CVD (Chemical Vapor Deposition).

Then, by using the photolithography technique and the etching technique, the silicon nitride film is patterned. The silicon nitride film is patterned so as to open the region where the element isolation region is to be formed. Then, by sequentially etching the exposed silicon oxide film and the semiconductor substrate 1S below the silicon oxide film with using the patterned silicon nitride film as a mask, the element isolation trench is formed in the semiconductor substrate 1S. The element isolation trench has a depth of, for example, about 250 nm to 400 nm.

Subsequently, a silicon oxide film is formed on the main surface of the semiconductor substrate 1S having the element isolation trench formed therein. The silicon oxide film can be formed by, for example, the plasma CVD using the HDP (High Density Plasma), and the thickness thereof is, for example, about 600 nm. At this time, it is preferable to form a silicon oxide film on the surface of the element isolation trench by the thermal oxidation before filling the element isolation trench with the silicon oxide film, thereby recovering the damage due to the dry etching performed at the time of forming the element isolation trench. Furthermore, it is also preferable to form a silicon nitride film on the surface of the element isolation trench by performing the heat treatment at 1000° C. to 1100° C. for 30 to 60 seconds in 50 to 100% NO gas atmosphere. By forming the silicon nitride film on the surface of the element isolation trench, the stress from the element isolation region to be formed later can be reduced, so that the occurrence of the crystal defect in the active region separated by the element isolation regions can be suppressed. Then, the silicon oxide film formed on the semiconductor substrate 1S so as to fill the element isolation trenches is polished by CMP (Chemical Mechanical Polishing). The polishing at this time is continued until the silicon nitride film formed on the semiconductor substrate 1S is exposed.

Next, as shown in FIG. 12, the silicon nitride film (not shown) formed on the semiconductor substrate 1S is removed, and thereafter, the p-type well PWL is formed in the n-channel MISFET forming region of the semiconductor substrate 1S. The p-type well PWL is formed by implanting a p-type impurity such as boron (B) or boron fluoride ($BF_2$) into the semiconductor substrate 1S by using the ion implantation. Similarly, the n-type well NWL is formed in the p-channel MISFET forming region of the semiconductor substrate 1S. The n-type well NWL is formed by implanting an n-type impurity such as phosphorus (P) or arsenic (As) into the semiconductor substrate 1S by using the ion implantation. Thereafter, the silicon oxide film (not shown) formed on the semiconductor substrate 1S is removed. In this manner, the element isolation region can be formed. Further, the p-type well PWL is formed in the active region of the n-channel MISFET forming region separated and partitioned by the element isolation regions, and the n-type well NWL is formed in the active region of the p-channel MISFET forming region.

Figure 13:
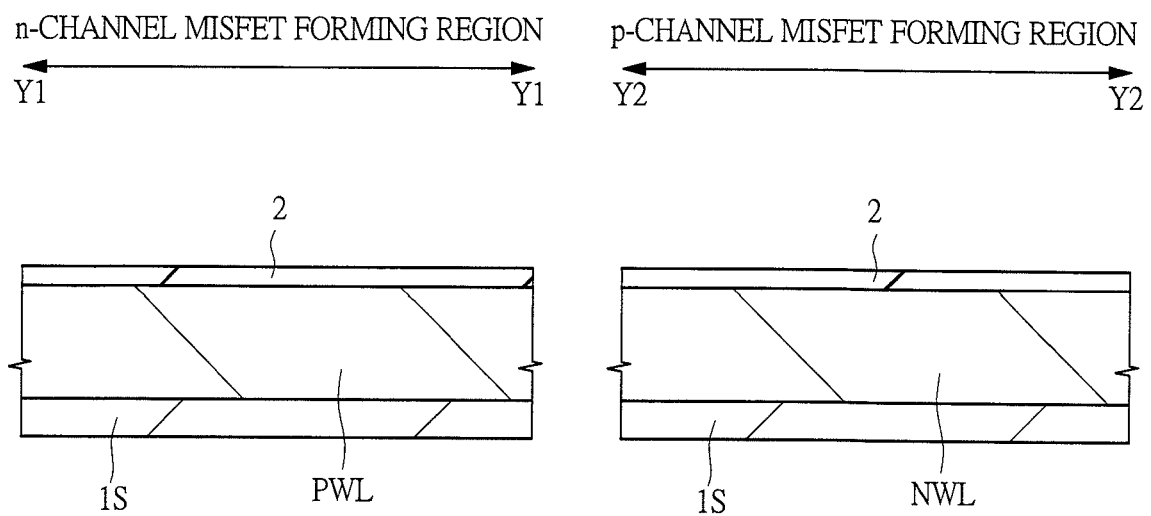
FIG. 13 is a cross-sectional view showing the manufacturing process of a semiconductor device continued from FIG. 12.

Subsequently, as shown in FIG. 13, a first insulating film 2 is formed on the semiconductor substrate 1S. The first insulating film 2 is formed on the whole surface of the semiconductor substrate 1S including the n-channel MISFET forming region and the p-channel MISFET forming region. The first insulating film 2 is made of, for example, a $HfO_2$ film (hafnium oxide film) having a dielectric constant higher than that of a silicon oxide film, and can be formed by, for example, ALD (Atomic Layer Deposition) or MOCVD (Metal Organic Chemical Vapor Deposition). However, the first insulating film 2 is not limited to the $HfO_2$ film, and can be made of a HfON film, (hafnium oxynitride film), a HfSiO film, a HfSiON film, a $SiO_2$ film (silicon oxide film), a SiON film (silicon oxynitride film) or others. The first insulating film 2 mentioned here is a film to be the gate insulating film in the subsequent process, but the first insulating film 2 is not necessarily required to be a high-dielectric-constant film at this point, and it does not matter as long as the gate insulating film to be formed in the subsequent process is the high-dielectric-constant film. Therefore, it is possible to use a silicon oxide film as the first insulating film 2. Note that it is also preferable to form a silicon oxide film (interface layer) of 1 nm or less between the first insulating film 2 and the semiconductor substrate 1, and further, the nitriding treatment and the heat treatment may be added in the process of forming the first insulating film 2 or after the formation of the first insulating film 2.

Figure 14:
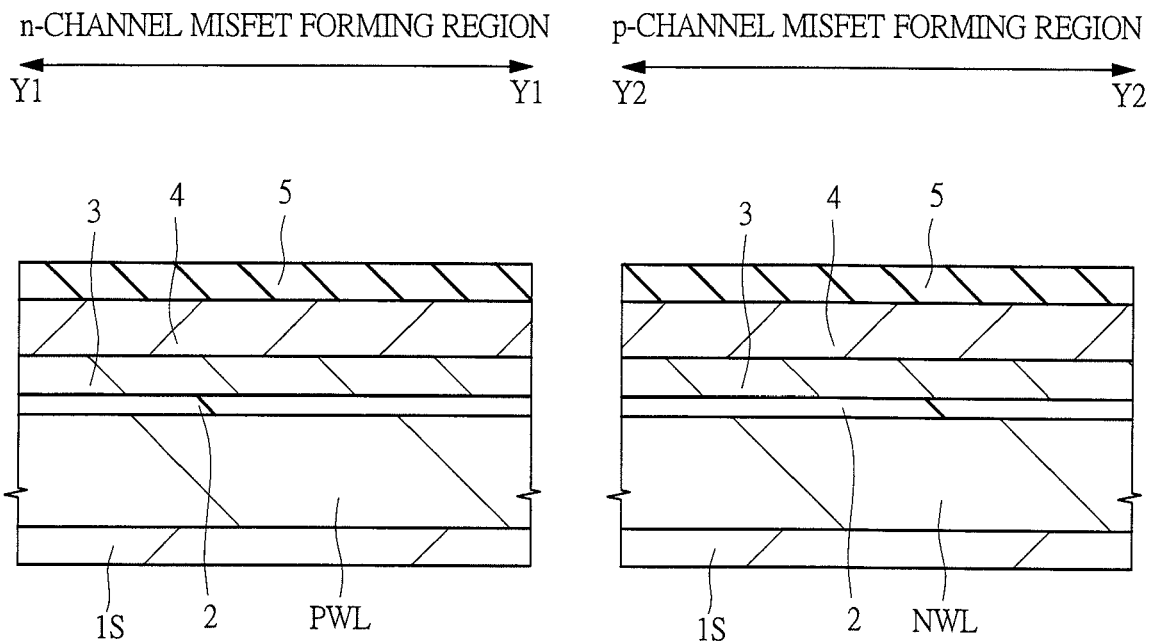
FIG. 14 is a cross-sectional view showing the manufacturing process of a semiconductor device continued from FIG. 13.

Next, as shown in FIG. 14, a titanium nitride film (TiN film) 3 is formed on the first insulating film 2, and a tungsten film 4 is formed on this titanium nitride film 3. Thereafter, a silicon nitride film 5 is formed on the tungsten film 4. The titanium nitride film 3 can be formed by using, for example, the sputtering, and the thickness thereof is, for example, about 5 nm. This titanium nitride film 3 is the film formed to adjust the threshold value. The film formed on the titanium nitride film 3 is required to be a film with a low resistance, and for example, the tungsten film 4 is used for it. The tungsten film 4 can be formed by using, for example, the CVD, and the thickness thereof is, for example, about 50 nm. The silicon nitride film 5 formed on the tungsten film 4 is a film functioning as a hard mask. The silicon nitride film 5 can be formed by using, for example, the CVD, and the thickness thereof is, for example, about 50 nm. Instead of the tungsten film 4, a polysilicon film can be used as the film formed on the titanium nitride film 3. In this case, all or a part of the polysilicon film can be silicided in the subsequent process. For example, by forming a nickel-silicided polysilicon film, the resistance can be reduced eventually.

Figure 15:
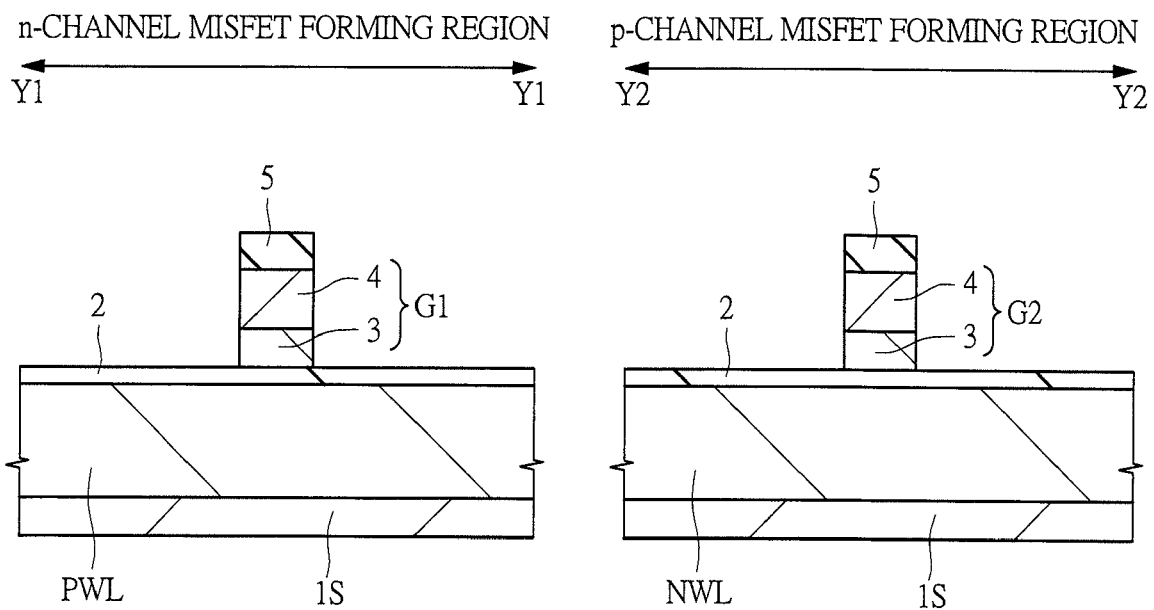
FIG. 15 is a cross-sectional view showing the manufacturing process of a semiconductor device continued from FIG. 14.

Next, as shown in FIG. 15, the gate electrode G1 is formed in the n-channel MISFET forming region and the gate electrode G2 is formed in the p-channel MISFET forming region by using the photolithography technique and the etching technique. Concretely, the silicon nitride film 5 is patterned by using the photolithography technique. Then, the tungsten film 4 and the titanium nitride film 3 are sequentially patterned with using the patterned silicon nitride film 5 as a hard mask. In this manner, the gate electrode G1 and the gate electrode G2 are formed.

As is apparent from FIG. 2, the gate electrode of the n-channel MISFET and the gate electrode of the p-channel MISFET are the same gate electrode G. More specifically, although the gate electrode G1 of the n-channel MISFET and the gate electrode G2 of the p-channel MISFET shown in FIG. 15 constitute the same gate electrode G (see FIG. 2), the gate electrode G of the n-channel MISFET is shown as the gate electrode G1 and the gate electrode G of the p-channel MISFET is shown as the gate electrode G2 as a matter of convenience in the first embodiment.

Both the gate electrode G1 and the gate electrode G2 are formed of the titanium nitride film 3 and the tungsten film 4. In other words, the gate electrode G1 and the gate electrode G2 are made of a common metal material, and this common metal material is etched. Therefore, there is an advantage that the etching control (vertical processability) can be facilitated as compared with the case where the gate electrode G1 and the gate electrode G2 are made of different metal materials (dual gate). Accordingly, the first embodiment is mainly directed to the miniaturized MISFET having the gate length of 20 nm or less, and it has an advantage that the gate electrode G1 and the gate electrode G2 whose gate lengths are 20 nm or less can be easily realized.

Further, after forming the gate electrode G1 and the gate electrode G2, the residues formed on the sidewall of the gate electrode G1 and the sidewall of the gate electrode G2 are removed by using diluted hydrofluoric acid (DHF). At this time, the first insulating film 2 formed on the whole surface of the semiconductor substrate 1S is left unremoved. In the process described above, the gate stack structure is formed, and both the n-channel MISFET forming region and the p-channel MISFET forming region are covered with the first insulating film 2, so that the semiconductor substrate 1S is not exposed throughout the process above. Note that a cap insulating film made of the silicon nitride film 5 is formed on the gate electrode G1 and the gate electrode G2.

Figure 16:
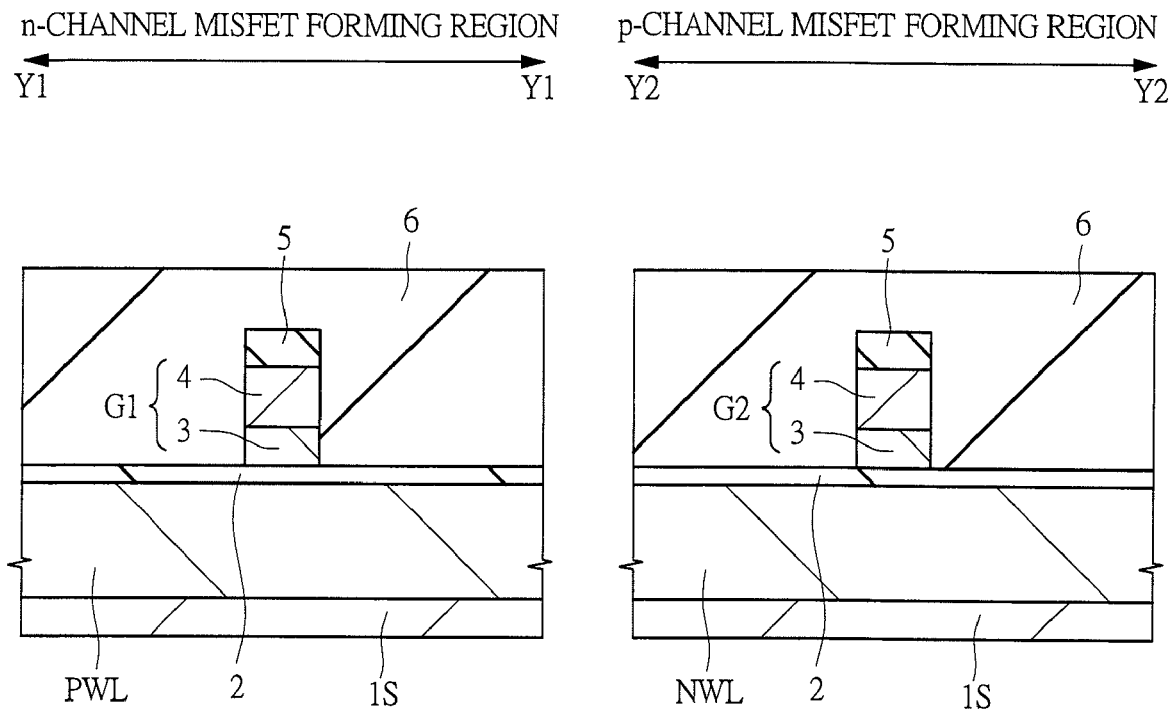
FIG. 16 is a cross-sectional view showing the manufacturing process of a semiconductor device continued from FIG. 15.
Figure 17:
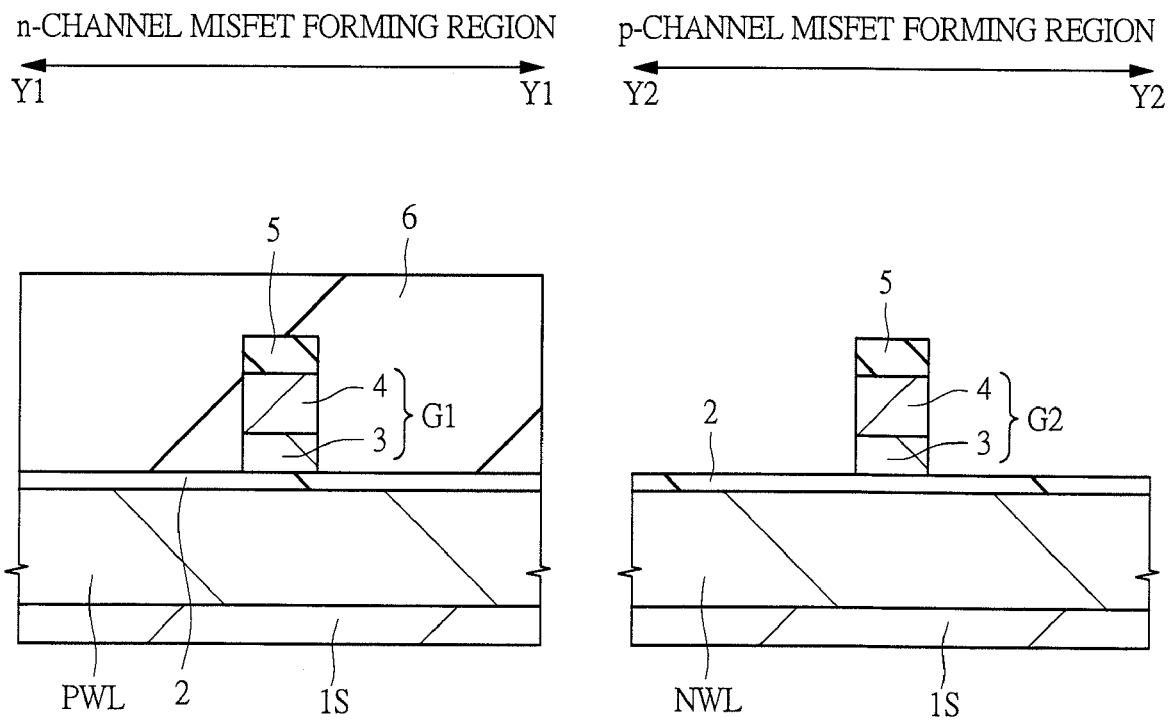
FIG. 17 is a cross-sectional view showing the manufacturing process of a semiconductor device continued from FIG. 16.

Next, as shown in FIG. 16, a silicon oxide film 6 is formed on the whole surface of the semiconductor substrate 1S. By this means, the n-channel MISFET forming region and the p-channel MISFET forming region are covered with the silicon oxide film 6. Therefore, the gate electrode G1 and the gate electrode G2 are covered with the silicon oxide film 6. The silicon oxide film 6 can be formed by using, for example, the plasma CVD. Thereafter, as shown in FIG. 17, the silicon oxide film 6 formed in the p-channel MISFET forming region is removed by using the photolithography technique and the etching technique. As a result, as shown in FIG. 17, the n-channel MISFET forming region is covered with the silicon oxide film 6, and on the other hand, the p-channel MISFET forming region is exposed. However, since the first insulating film 2 is formed on the semiconductor substrate 1S, the semiconductor substrate 1S is not exposed even in the p-channel MISFET forming region.

Figure 18:
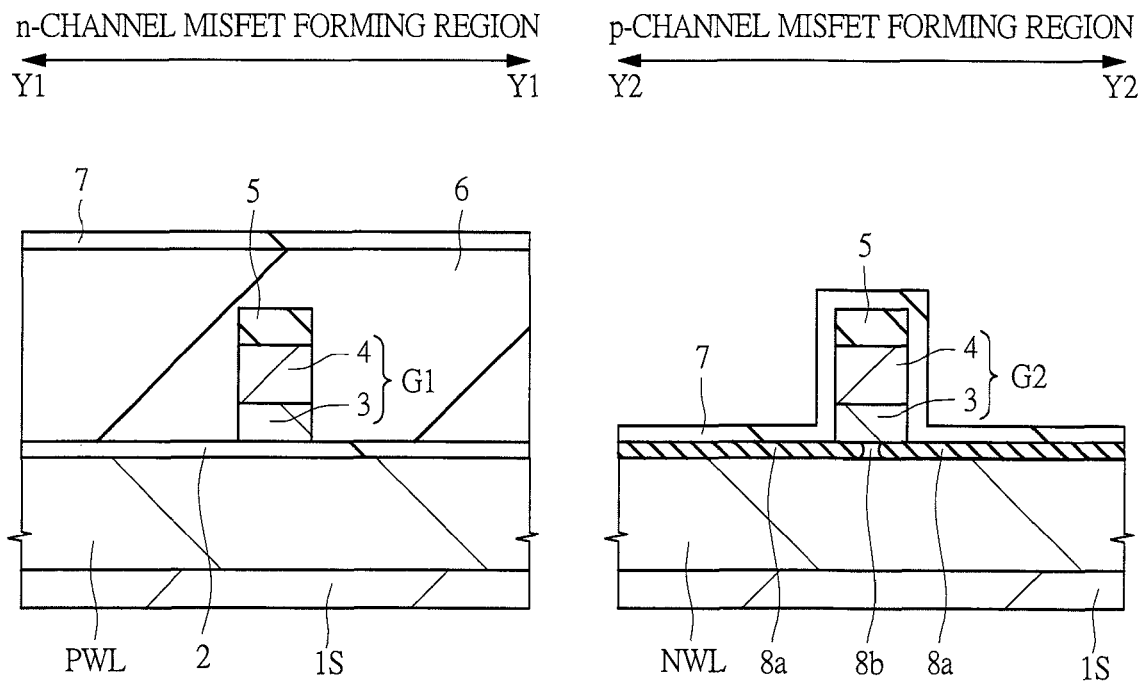
FIG. 18 is a cross-sectional view showing the manufacturing process of a semiconductor device continued from FIG. 17.

Subsequently, an element supply film 7 is formed on the whole surface of the semiconductor substrate 1S as shown in FIG. 18. At this time, since the silicon oxide film 6 is formed in the n-channel MISFET forming region, the element supply film 7 is formed on the silicon oxide film 6. Meanwhile, in the p-channel MISFET forming region, the element supply film 7 is formed so as to cover the first insulating film 2 and the gate electrode G2 (including the silicon nitride film 5) formed on the semiconductor substrate 1S. In particular, the exposed first insulating film 2 is in direct contact with the element supply film 7.

The element supply film 7 is made of a film containing aluminum (element), and is made of, for example, an aluminum oxide film ($Al_2O_3$ film). However, any film may be used as the element supply film 7 as long as the film contains aluminum, and an aluminum film or an aluminum nitride film is also available as the element supply film 7. When an aluminum film is used to form the element supply film 7, it can be formed by using, for example, the DC sputtering, the ADL, or the MOCVD. Meanwhile, when an aluminum oxide film or an aluminum nitride film is used to form the element supply film 7, after an aluminum film is formed by the DC sputtering, oxidizing treatment or nitriding treatment is performed to the aluminum film, thereby forming the aluminum oxide film or the aluminum nitride film. Furthermore, it is also possible to directly form an aluminum oxide film or an aluminum nitride film by the RF sputtering. Also, the aluminum oxide film or the aluminum nitride film can be formed by performing oxidizing treatment or nitriding treatment after forming an aluminum film by the ALD or the MOCVD, and the aluminum oxide film or the aluminum nitride film can be directly formed by the ALD or the MOCVD.

Next, the heat treatment is performed to the semiconductor substrate 1S. By this means, aluminum (element) is diffused from the element supply film 7 made of, for example, an aluminum oxide film to the first insulating film 2. As a result, as shown in FIG. 18, aluminum (element) is diffused into the first insulating film 2 made of, for example, a $HfO_2$ film, so that the high-concentration HfAlO film 8a is formed in the p-channel MISFET forming region. At this time, since the first insulating film 2 just below the gate electrode G2 is not in direct contact with the element supply film 7, it turns into the low-concentration HfAlO film 8b. In other words, when focusing on the first insulating film 2 just below the gate electrode G2, aluminum (element) is diffused from the end portion side just below the gate electrode G2 toward the central portion just below the gate electrode G2. Accordingly, in the first insulating film 2 formed just below the gate electrode G2, the aluminum concentration is high on the end portion side in the channel direction, and the aluminum concentration decreases as going toward the central portion apart from the end portion. As a result, in the first insulating film 2 formed just below the gate electrode G2, the end portions are made of the high-concentration HfAlO films 8a, and the central portion is made of the low-concentration HfAlO film 8b. Note that, since the element supply film 7 is formed on the silicon oxide film 6 in the n-channel MISFET forming region, aluminum (element) is not implanted into the first insulating film 2 covered with the thick silicon oxide film 6, so that the first insulating film 2 remains a $HfO_2$ film.

Figure 19:
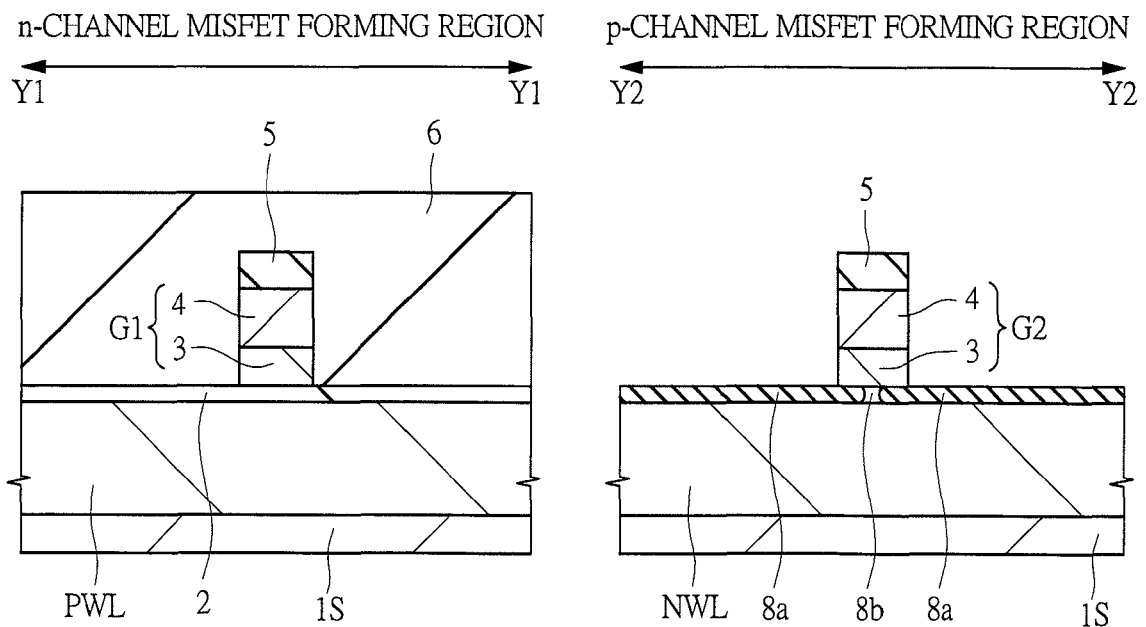
FIG. 19 is a cross-sectional view showing the manufacturing process of a semiconductor device continued from FIG. 18.
Figure 20:
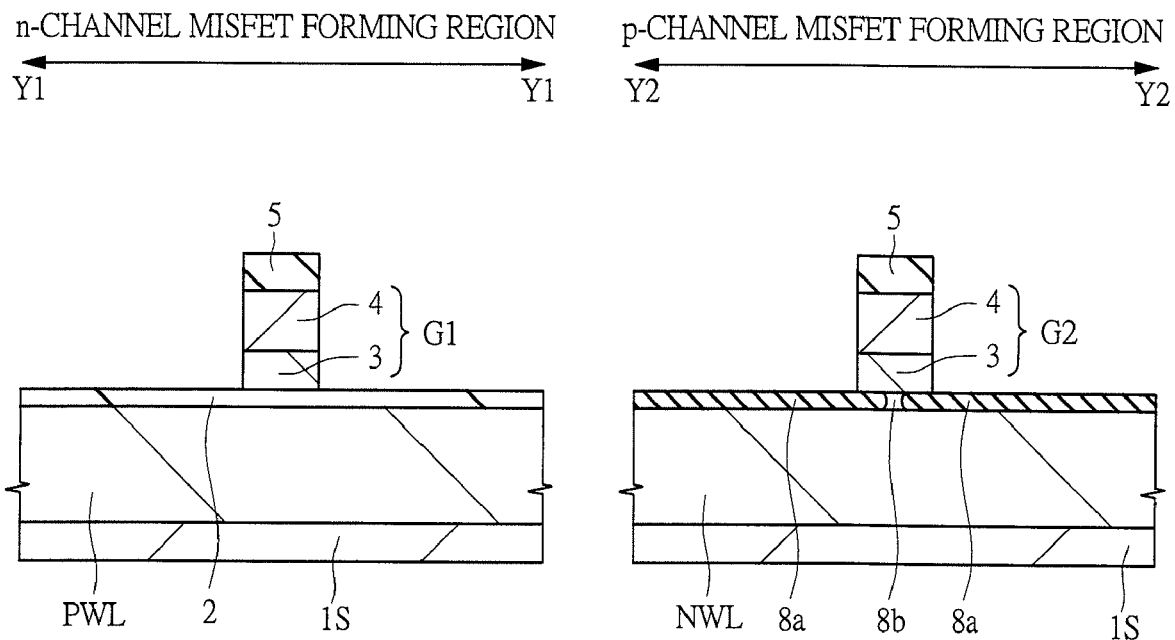
FIG. 20 is a cross-sectional view showing the manufacturing process of a semiconductor device continued from FIG. 19.

Subsequently, as shown in FIG. 19, the element supply film 7 made of, for example, an aluminum oxide film is removed. In other words, the element supply film 7 formed in the n-channel MISFET forming region and the p-channel MISFET forming region is removed. Thereafter, as shown in FIG. 20, the silicon oxide film 6 formed in the n-channel MISFET forming region is removed.

Figure 21:
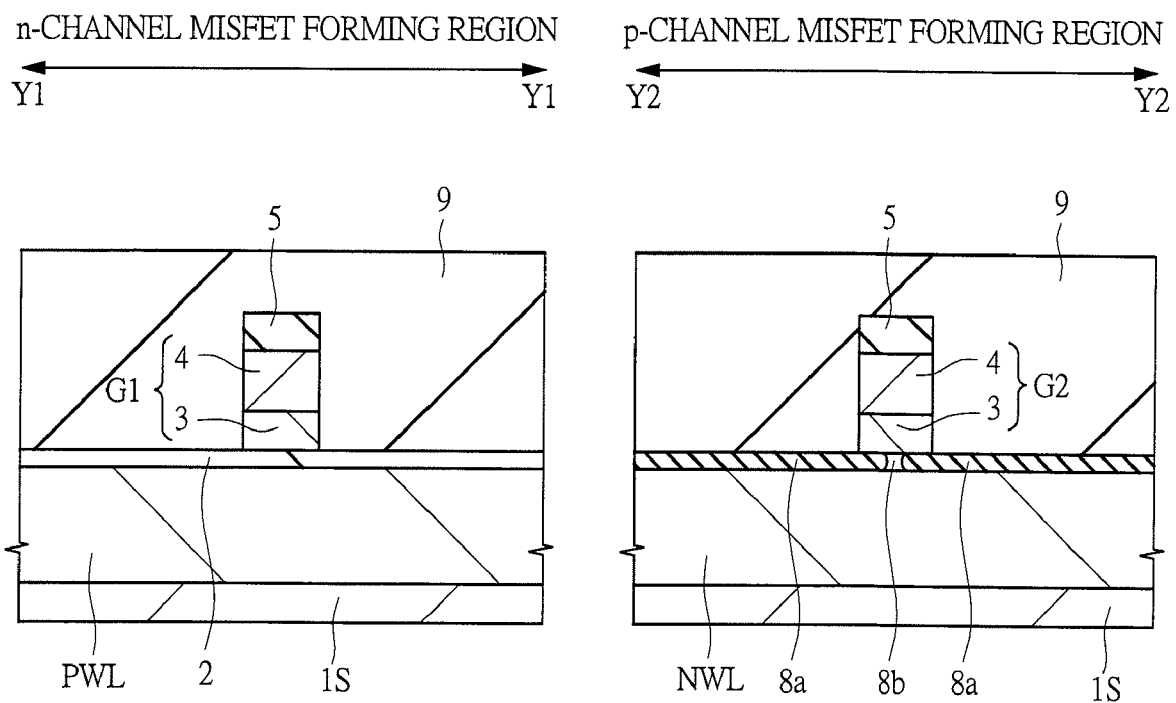
FIG. 21 is a cross-sectional view showing the manufacturing process of a semiconductor device continued from FIG. 20.
Figure 22:
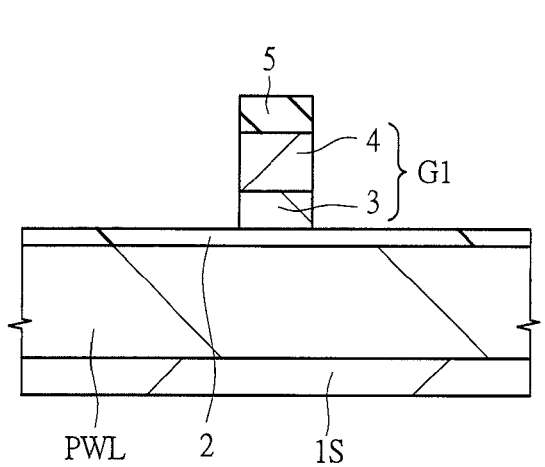
FIG. 22 is a cross-sectional view showing the manufacturing process of a semiconductor device continued from FIG. 21.
Figure 22:
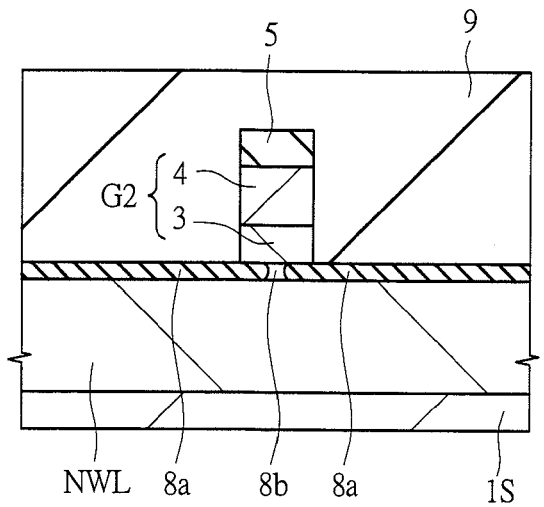

Then, as shown in FIG. 21, a silicon oxide film 9 is again formed on the whole surface of the semiconductor substrate 1S. By this means, the n-channel MISFET forming region and the p-channel MISFET forming region are again covered with the silicon oxide film 9. The silicon oxide film 9 can be formed by using, for example, the plasma CVD. Thereafter, as shown in FIG. 22, the silicon oxide film 9 formed in the n-channel MISFET forming region is removed by using the photolithography technique and the etching technique. As a result, as shown in FIG. 22, the p-channel MISFET forming region is covered with the silicon oxide film 9, and on the other hand, the n-channel MISFET forming region is exposed. However, since the first insulating film 2 is formed on the semiconductor substrate 1S, the semiconductor substrate 1S is not exposed even in the n-channel MISFET forming region.

Figure 23:
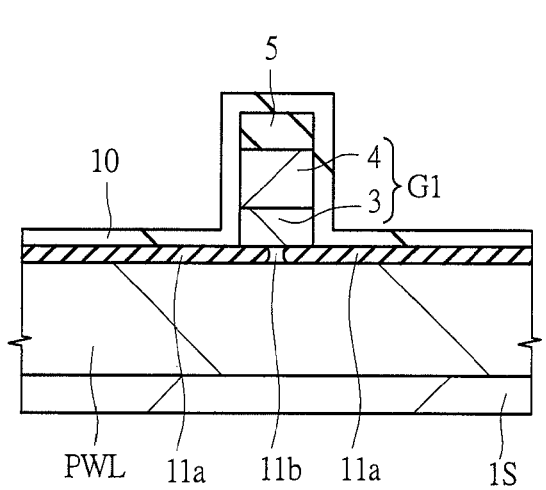
FIG. 23 is a cross-sectional view showing the manufacturing process of a semiconductor device continued from FIG. 22.
Figure 23:
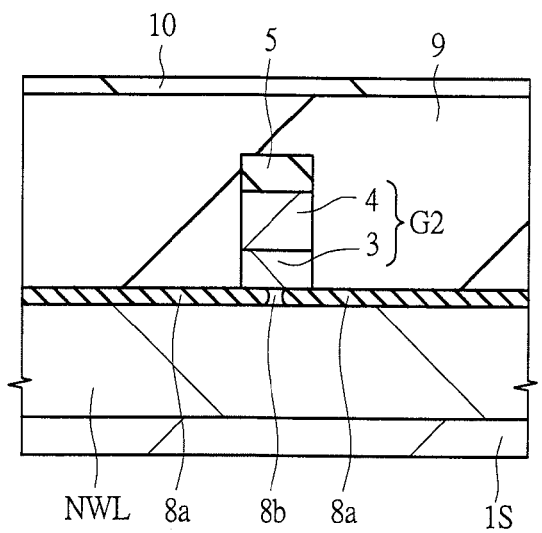

Subsequently, an element supply film 10 is formed on the whole surface of the semiconductor substrate 1S as shown in FIG. 23. At this time, since the silicon oxide film 9 is formed in the p-channel MISFET forming region, the element supply film 10 is formed on the silicon oxide film 9. Meanwhile, in the n-channel MISFET forming region, the element supply film 10 is formed so as to cover the first insulating film 2 and the gate electrode G1 (including the silicon nitride film 5) formed on the semiconductor substrate 1S. In particular, the exposed first insulating film 2 is in direct contact with the element supply film 10.

The element supply film 10 is made of a film containing magnesium (element), and is made of, for example, a magnesium oxide film (MgO film). However, any film may be used as the element supply film 10 as long as the film contains magnesium, and a magnesium film or a magnesium nitride film is also available as the element supply film 10. When a magnesium film is used to form the element supply film 10, it can be formed by using, for example, the DC sputtering, the ADL, or the MOCVD. Meanwhile, when a magnesium oxide film or a magnesium nitride film is used to form the element supply film 10, after a magnesium film is formed by the DC sputtering, oxidizing treatment or nitriding treatment is performed to the magnesium film, thereby forming the magnesium oxide film or the magnesium nitride film. Furthermore, it is also possible to directly form a magnesium oxide film or a magnesium nitride film by the RF sputtering. Also, the magnesium oxide film or the magnesium nitride film can be formed by performing oxidizing treatment or nitriding treatment after forming a magnesium film by the ALD or the MOCVD, and the magnesium oxide film or the magnesium nitride film can be directly formed by the ALD or the MOCVD.

Next, the heat treatment is performed to the semiconductor substrate 1S. By this means, magnesium (element) is diffused from the element supply film 10 made of, for example, a magnesium oxide film to the first insulating film 2. As a result, as shown in FIG. 23, magnesium (element) is diffused into the first insulating film 2 made of, for example, a $HfO_2$ film, so that the high-concentration HfMgO film 11a is formed in the n-channel MISFET forming region. At this time, since the first insulating film 2 just below the gate electrode G1 is not in direct contact with the element supply film 10, it turns into the low-concentration HfMgO film 11b. In other words, when focusing on the first insulating film 2 just below the gate electrode G1, magnesium (element) is diffused from the end portion side just below the gate electrode G1 toward the central portion just below the gate electrode G1. Accordingly, in the first insulating film 2 formed just below the gate electrode G1, the magnesium concentration is high on the end portion side in the channel direction, and the magnesium concentration decreases as going toward the central portion apart from the end portion. As a result, in the first insulating film 2 formed just below the gate electrode G1, the end portion is made of the high-concentration HfMgO film 11a, and the central portion is made of the low-concentration HfMgO film 11b. Note that, since the element supply film 10 is formed on the silicon oxide film 9 in the p-channel MISFET forming region, magnesium is not implanted into the high-concentration HfAlO film 8a and the low-concentration HfAlO film 8b covered with the thick silicon oxide film 9.

In the description above, the element supply film 10 is made of a film containing magnesium such as a magnesium oxide film. However, the element supply film 10 is not limited to this, and may be a film containing lanthanum (La), scandium (Sc), dysprosium (Dy), yttrium (Y), gadolinium (Gd) or others. Concretely, by diffusing the element mentioned above into the first insulating film 2 made of, for example, a $HfO_2$ film, the effect of reducing the threshold voltage of the n-channel MISFET can be obtained like in the case of magnesium. For example, in the case of using lanthanum (La), a lanthanum film or a lanthanum oxide film can be applied as the element supply film 10.

Figure 24:
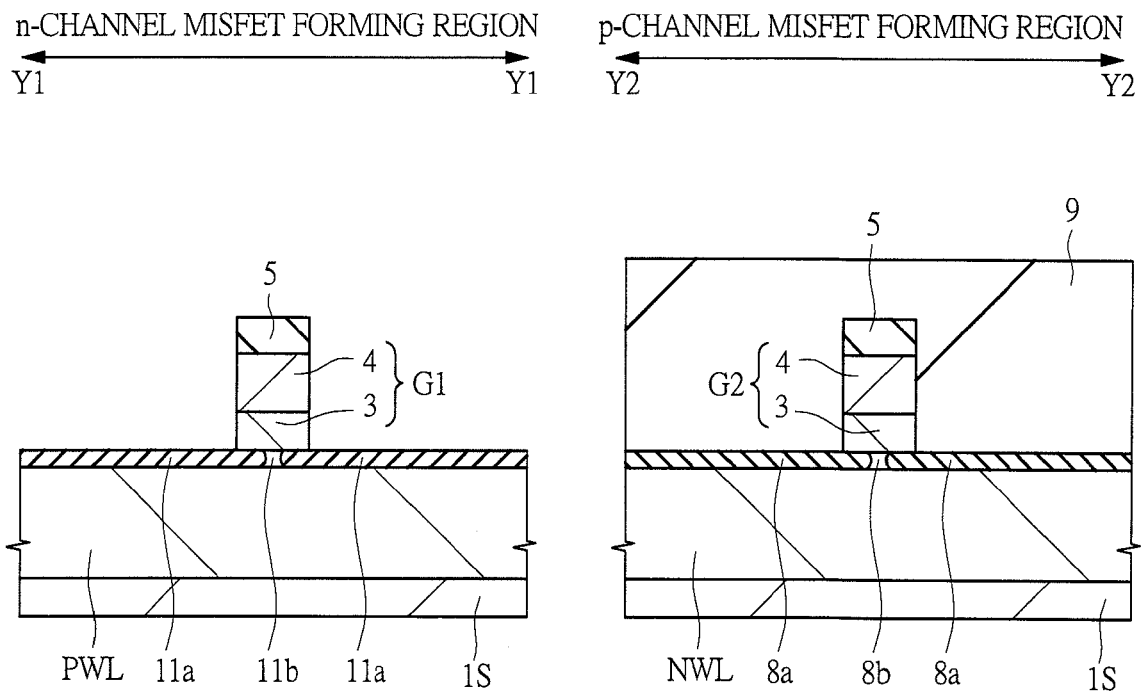
FIG. 24 is a cross-sectional view showing the manufacturing process of a semiconductor device continued from FIG. 23.
Figure 25:
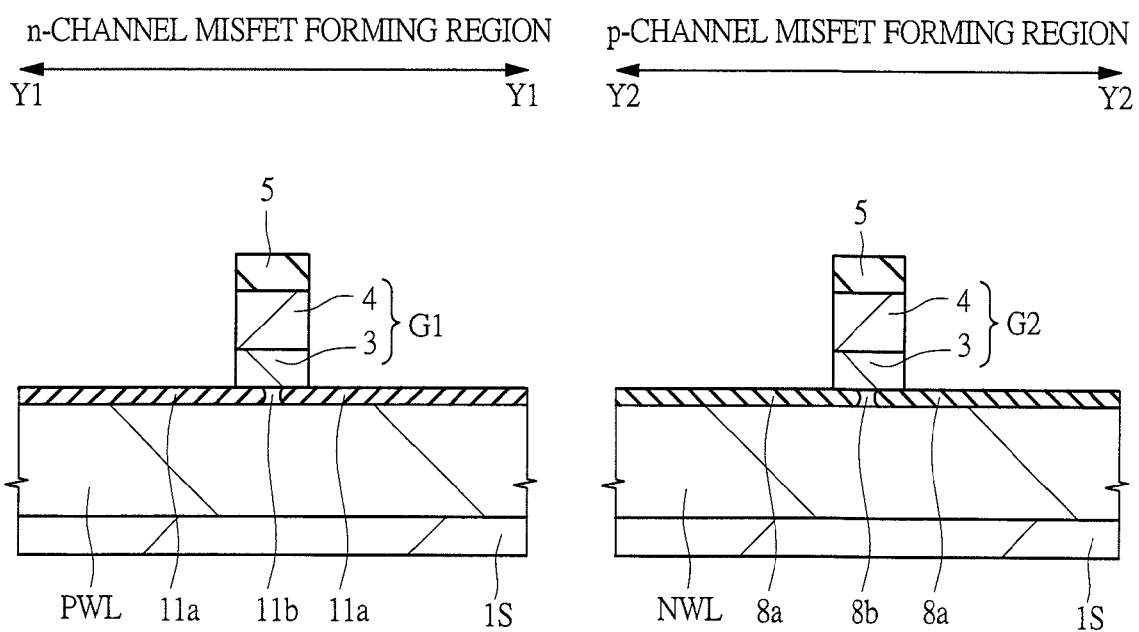
FIG. 25 is a cross-sectional view showing the manufacturing process of a semiconductor device continued from FIG. 24.

Subsequently, as shown in FIG. 24, the element supply film 10 made of, for example, a magnesium oxide film is removed. In other words, the element supply film 10 formed in the n-channel MISFET forming region and the p-channel MISFET forming region is removed. Thereafter, as shown in FIG. 25, the silicon oxide film 9 formed in the p-channel MISFET forming region is removed.

Figure 26:
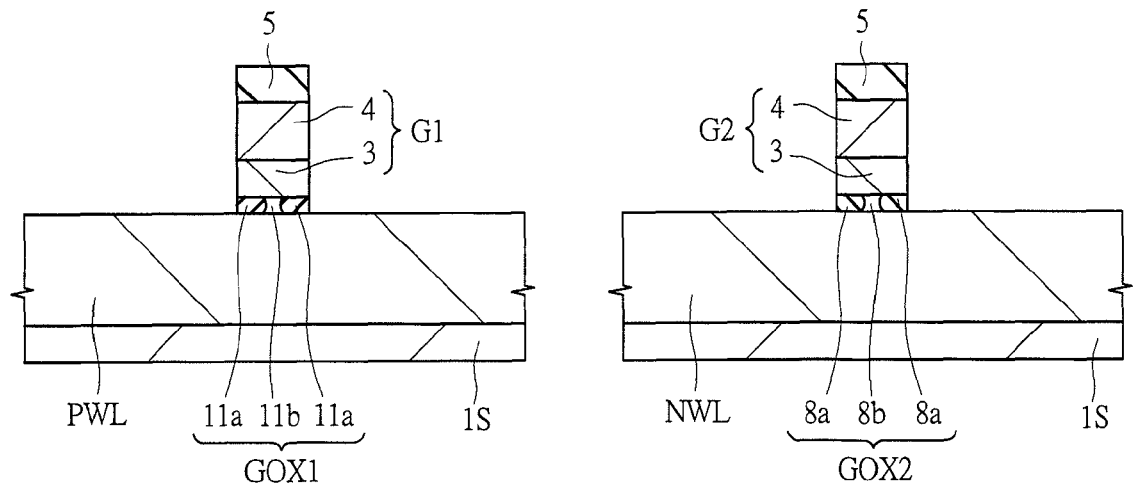
FIG. 26 is a cross-sectional view showing the manufacturing process of a semiconductor device continued from FIG. 25.

Next, as shown in FIG. 26, the high-concentration HfMgO film 11a exposed in the n-channel MISFET forming region of the semiconductor substrate 1S is removed, and the high-concentration HfAlO film 8a exposed in the p-channel MISFET forming region of the semiconductor substrate 1S is removed. By this means, the gate insulating film GOX1 can be formed only just below the gate electrode G1 in the n-channel MISFET forming region. This gate insulating film GOX1 is constituted of the high-concentration HfMgO films 11a formed in the proximity of the end portions in the channel direction and the low-concentration HfMgO film 11b formed in the proximity of the central portion in the channel direction. More specifically, the gate insulating film GOX1 in which the magnesium concentration is high on the end portion side in the channel direction and the magnesium concentration decreases as going toward the central portion apart from the end portion is formed.

Similarly, the gate insulating film GOX2 can be formed only just below the gate electrode G2 in the p-channel MISFET forming region. This gate insulating film GOX2 is constituted of the high-concentration HfAlO films 8a formed in the proximity of the end portions in the channel direction and the low-concentration HfAlO film 8b formed in the proximity of the central portion in the channel direction. More specifically, the gate insulating film GOX2 in which the aluminum concentration is high on the end portion side in the channel direction and the aluminum concentration decreases as going toward the central portion apart from the end portion is formed.

In this manner as described above, the gate insulating film GOX1 of the n-channel MISFET and the gate insulating film GOX2 of the p-channel MISFET can be formed from the high-dielectric-constant films having different compositions. At this time, as is apparent from the above-described process, the gate insulating film GOX1 and the gate insulating film GOX2 having different compositions can be formed without exposing the portion just below the gate electrode G1 and the portion just below the gate electrode G2 even once. Therefore, in the manufacturing method of a semiconductor device according to the first embodiment, the gate insulating film GOX1 of the n-channel MISFET and the gate insulating film GOX2 of the p-channel MISFET can be formed from respectively different high-dielectric-constant films without unnecessarily exposing the semiconductor substrate 1S (in particular, the semiconductor substrate 1S below the gate stack structure), and therefore, the reliability of the semiconductor device can be improved.

Figure 27:
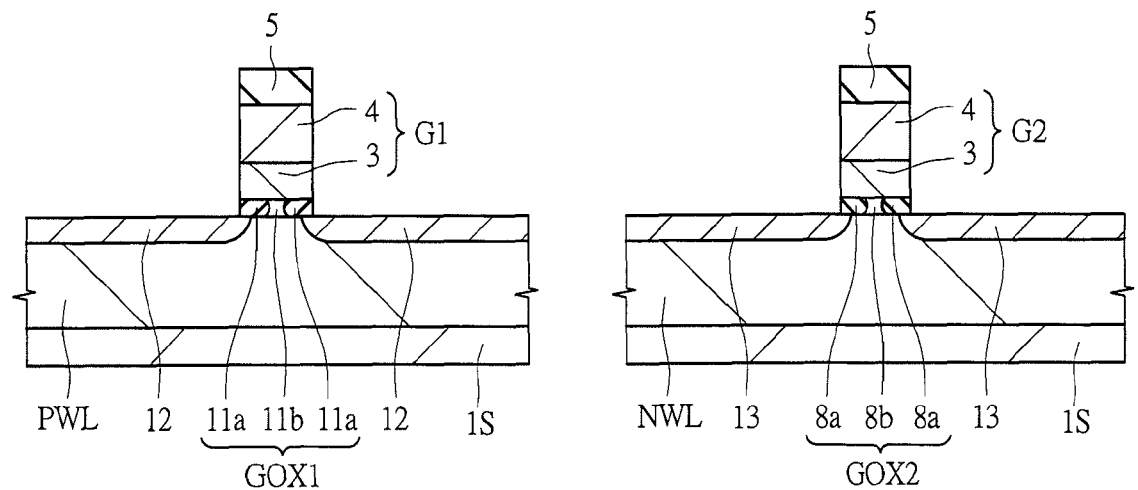
FIG. 27 is a cross-sectional view showing the manufacturing process of a semiconductor device continued from FIG. 26.

Next, the subsequent process will be described. As shown in FIG. 27, shallow n-type impurity diffusion regions (extension regions) 12 in alignment with the gate electrode G1 of the n-channel MISFET are formed by using the photolithography technique and the ion-implantation technique. The shallow n-type impurity diffusion region 12 is a semiconductor region. Similarly, shallow p-type impurity diffusion regions (extension regions) 13 in alignment with the gate electrode G2 of the p-channel MISFET are formed by using the photolithography technique and the ion-implantation technique. The shallow p-type impurity diffusion region 13 is a semiconductor region.

Figure 28:
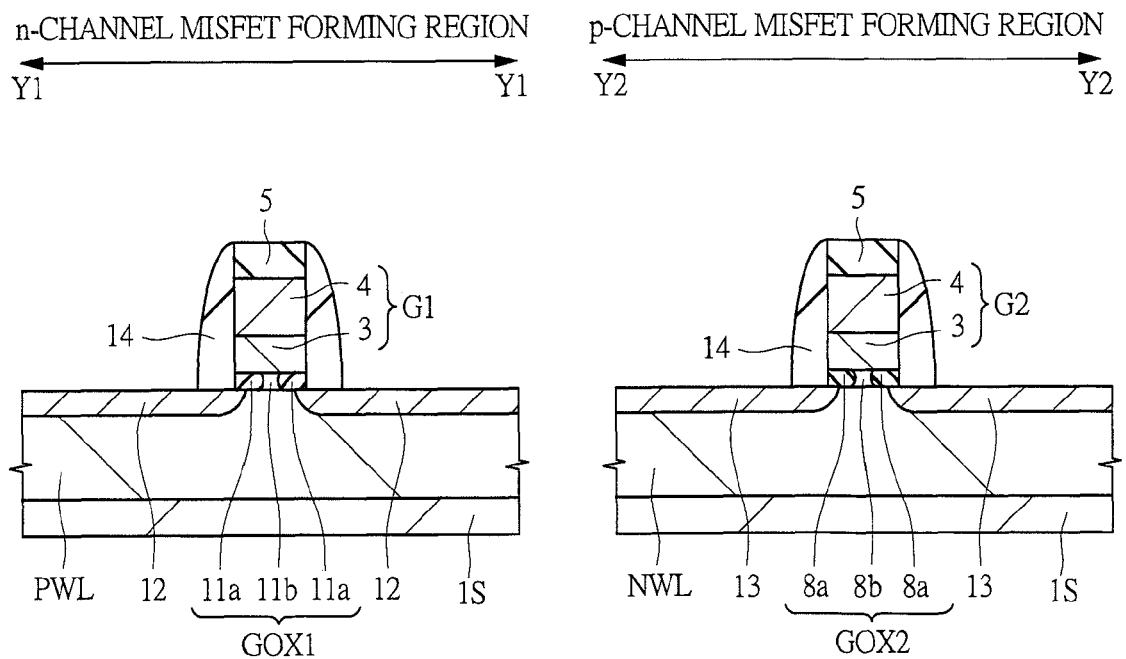
FIG. 28 is a cross-sectional view showing the manufacturing process of a semiconductor device continued from FIG. 27.

Thereafter, as shown in FIG. 28, a silicon nitride film is formed on the semiconductor substrate 1S. The silicon nitride film can be formed by using, for example, the CVD. Then, the silicon nitride film is anisotropically etched to form sidewalls 14 on the sidewalls of the gate electrode G1 and the gate electrode G2. The case where the sidewall 14 is constituted of a single film of a silicon nitride film has been described here, but the sidewall 14 is not limited to this and a sidewall constituted of a stacked film of a silicon nitride film and a silicon oxide film may be formed.

Figure 29:
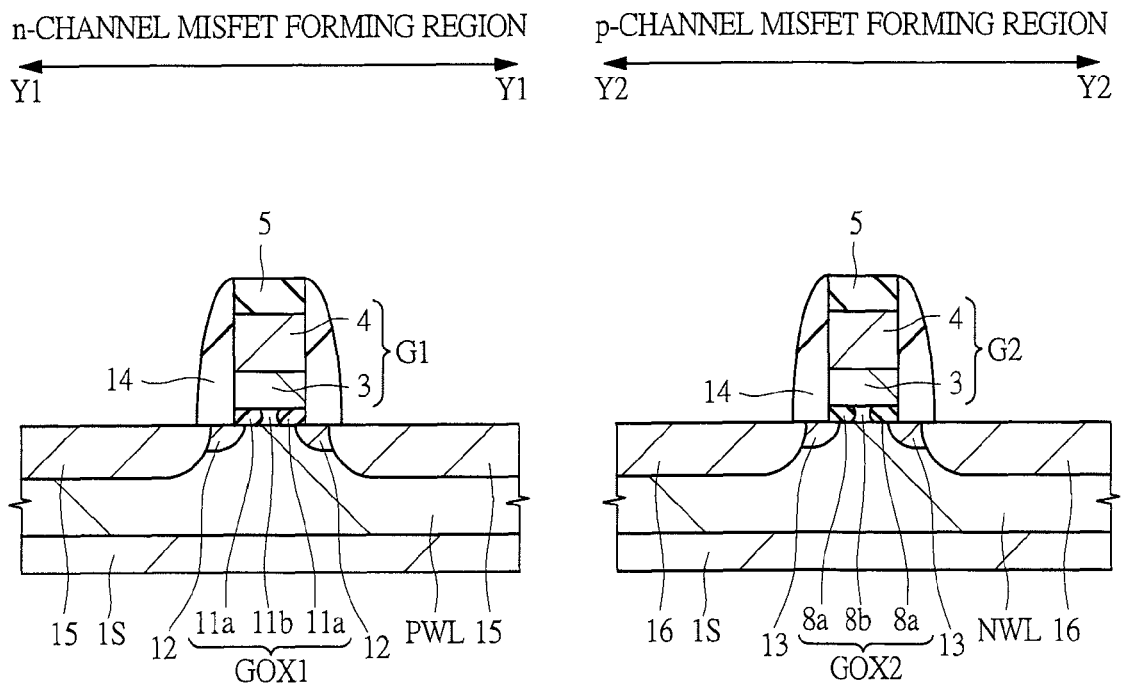
FIG. 29 is a cross-sectional view showing the manufacturing process of a semiconductor device continued from FIG. 28.

Next, as shown in FIG. 29, deep n-type impurity diffusion regions 15 in alignment with the sidewalls 14 are formed in the n-channel MISFET forming region by using the photolithography technique and the ion-implantation technique. The deep n-type impurity diffusion region 15 is a semiconductor region. The source region is formed from this deep n-type impurity diffusion region 15 and the shallow n-type impurity diffusion region 12. Similarly, the drain region is formed from the deep n-type impurity diffusion region 15 and the shallow n-type impurity diffusion region 12. The source region and the drain region are formed from the shallow n-type impurity diffusion region 12 and the deep n-type impurity diffusion region 15 as described above, so that the source region and the drain region having the LDD (Lightly Doped Drain) structure can be formed.

On the other hand, also in the p-channel MISFET forming region, deep p-type impurity diffusion regions 16 in alignment with the sidewalls 14 are formed by using the photolithography technique and the ion-implantation technique. The deep p-type impurity diffusion region 16 is a semiconductor region. The source region is formed from this deep p-type impurity diffusion region 16 and the shallow p-type impurity diffusion region 13. Similarly, the drain region is formed from the deep p-type impurity diffusion region 16 and the shallow p-type impurity diffusion region 13. The source region and the drain region are formed from the shallow p-type impurity diffusion region 13 and the deep p-type impurity diffusion region 16 as described above, so that the source region and the drain region having the LDD (Lightly Doped Drain) structure can be formed.

Thereafter, a silicide film for resistance reduction may be formed for the deep n-type impurity diffusion region 15 of the n-channel MISFET forming region and the deep p-type impurity diffusion region 16 of the p-channel MISFET forming region. When a polysilicon film is formed on the titanium nitride film 3, all or a part of the polysilicon film constituting the gate electrodes G1 and G2 may be silicided simultaneously with the deep n-type impurity diffusion region 15 and the deep p-type impurity diffusion region 16.

Figure 30:
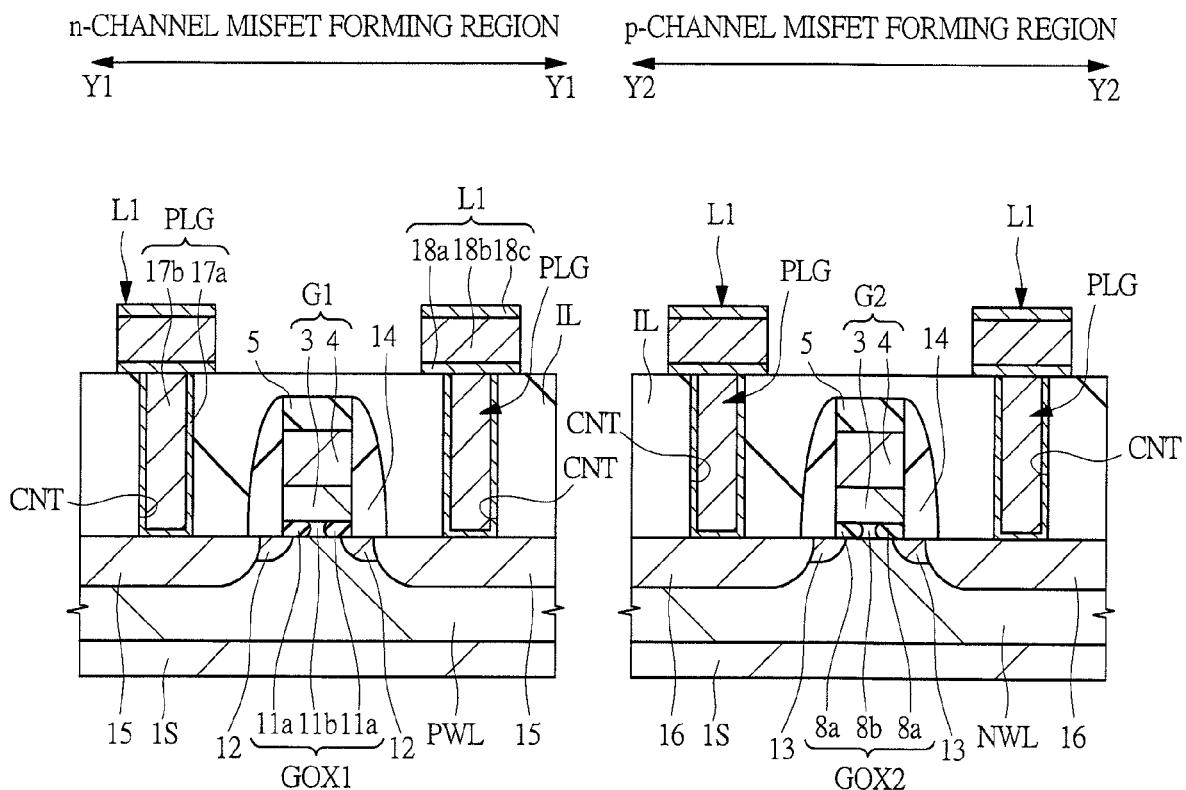
FIG. 30 is a cross-sectional view showing the manufacturing process of a semiconductor device continued from FIG. 29.

Next, as shown in FIG. 30, a silicon oxide film IL to be an interlayer insulating film is formed on the main surface of the semiconductor substrate 1S. The silicon oxide film IL can be formed by the CVD using TEOS (tetra ethyl ortho silicate) as a source material. Thereafter, the surface of the silicon oxide film IL is planarized by using, for example, the CMP (Chemical Mechanical Polishing). When a polysilicon film is formed on the titanium nitride film 3, after the polysilicon film is exposed by this CMP and a nickel film (Ni film) which is a film for silicidation is deposited, the heat treatment is performed and a surplus part of the film for silicidation is removed, whereby all or a part of the polysilicon film can be silicided.

Subsequently, a contact hole CNT penetrating through the silicon oxide film IL is formed by using the photolithography technique and the etching technique. This contact hole CNT is formed in a plural number. Concretely, the contact holes CNT reaching the source region and the drain region of the n-channel MISFET and the contact holes CNT reaching the source region and the drain region of the p-channel MISFET are formed.

Then, a titanium/titanium nitride film 17a is formed on the silicon oxide film IL including a bottom surface and an inner wall of the contact hole CNT. The titanium/titanium nitride film 17a is constituted of a stacked film of a titanium film and a titanium nitride film, and can be formed by using, for example, the sputtering. This titanium/titanium nitride film 17a has the so-called barrier property for preventing tungsten which is a material of the film to be buried in the subsequent process from being diffused into the silicon.

Subsequently, a tungsten film 17b is formed on the whole surface of the semiconductor substrate 1S so as to fill the contact holes CNT. This tungsten film 17b can be formed by using, for example, the CVD. Then, the unnecessary titanium/titanium nitride film 17a and tungsten film 17b formed on the silicon oxide film IL are removed by, for example, the CMP, thereby forming plugs PLG.

Next, a titanium/titanium nitride film 18a, an aluminum film 18b containing copper, and a titanium/titanium nitride film 18c are sequentially formed on the silicon oxide film IL and the plugs PLG. These films can be formed by using, for example, the sputtering. Subsequently, these films are patterned by using the photolithography technique and the etching technique, thereby forming wirings L1. Then, wirings are further formed on the wiring L1 to form the multilayer wirings. In this manner, the integrated circuit including an SRAM can be formed on the semiconductor substrate 1S. More specifically, although the manufacturing method of a semiconductor device has been described by illustrating the n-channel MISFET (driver MISFET Qd1) and the p-channel MISFET (load MISFET Qp1) constituting the SRAM in the first embodiment, other MISFETs (including transfer MISFET and others) constituting the SRAM are formed through basically the same process. In the above-described manner, the semiconductor device according to the first embodiment can be manufactured.

In the first embodiment, the element supply film 7 made of an aluminum oxide film is first formed, and aluminum is diffused by the heat treatment from this element supply film 7 to the first insulating film (for example, $HfO_2$ film) formed in the p-channel MISFET forming region. Thereafter, the element supply film 10 made of a magnesium oxide film is formed, and magnesium is diffused by the heat treatment from this element supply film 10 to the first insulating film (for example, $HfO_2$ film) formed in the n-channel MISFET forming region. The diffusions performed in this order are advantageous because aluminum is hard to be diffused as compared with magnesium. More specifically, to the element implanted first (aluminum), the heat treatment performed when the element (aluminum) is diffused and the heat treatment performed when the element implanted subsequently (magnesium) is diffused are applied. However, since aluminum has the property of being less diffused by the heat treatment than magnesium, there is a possibility that the heat treatment performed once cannot cause the sufficient diffusion of aluminum. Hence, by performing the diffusion of aluminum prior to the diffusion of magnesium, the sufficient diffusion of the aluminum can be achieved. Considering this point, it is desired that the diffusion of aluminum is performed prior to the diffusion of magnesium. In other words, it is desired that the diffusion of aluminum in the p-channel MISFET forming region is performed prior to the diffusion of magnesium in the n-channel MISFET forming region. In the first embodiment, however, there is no problem if the diffusion of magnesium in the n-channel MISFET forming region is performed prior to the diffusion of aluminum in the p-channel MISFET forming region. In other words, no matter which of the diffusions is performed first, the fact that the gate insulating film GOX1 of the n-channel MISFET and the gate insulating film GOX2 of the p-channel MISFET can be formed from respectively different high-dielectric-constant films without unnecessarily exposing the semiconductor substrate 1S (in particular, semiconductor substrate 1S below the gate stack structure) is unchanged.

Also, the gate electrode G1 and the gate electrode G2 are made of a common metal material (for example, titanium nitride film 3 and tungsten film 4) in the first embodiment, but the present invention can be applied to the case where the gate electrode G1 and the gate electrode G2 are made of different metal materials.

Furthermore, the first embodiment is directed to the manufacturing technology of an SRAM, but the present invention is not limited to this and can be also applied to, for example, the manufacturing technology of the CMISFET constituting a logic circuit. When the present invention is applied to the CMISFET constituting an SRAM or a logic circuit, the significant effect that the gate insulating film GOX1 of the n-channel MISFET and the gate insulating film GOX2 of the p-channel MISFET can be formed from respectively different high-dielectric-constant films without unnecessarily exposing the semiconductor substrate 1S (in particular, semiconductor substrate 1S below the gate stack structure) can be obtained with respect to the first problem. Also, when the present invention is applied to the SRAM, the significant effect that the gate electrode G extending from the n-channel MISFET forming region to the p-channel MISFET forming region through the element isolation region can be manufactured with high reliability can be obtained with respect to the second problem.

Second Embodiment

In the second embodiment, the example where the diffusion of an element by an element supply film is performed after forming an offset spacer on a sidewall of a gate electrode will be described. Since the manufacturing method of a semiconductor device according to the second embodiment is almost the same as the manufacturing method of a semiconductor device according to the first embodiment, the description will be made while placing an emphasis on the difference therebetween.

Figure 31:
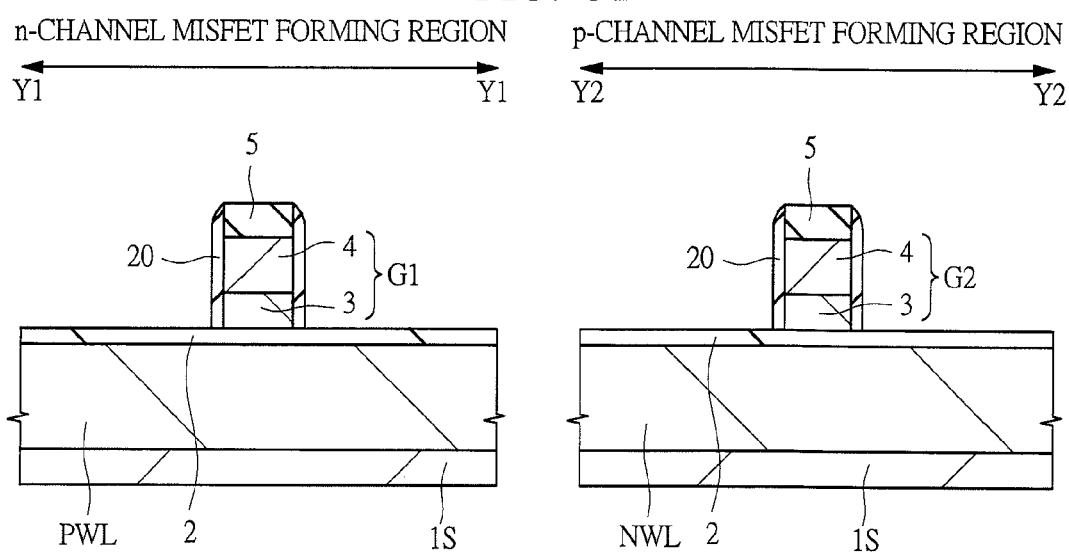
FIG. 31 is a cross-sectional view showing a manufacturing process of a semiconductor device according to the second embodiment.

The process from FIG. 12 to FIG. 15 is the same as that of the first embodiment. Subsequently, as shown in FIG. 31, a silicon nitride film is formed on the whole surface of the semiconductor substrate 1S. Then, the silicon nitride film is anisotropically etched to form offset spacers 20 on the sidewalls of the gate electrode G1 (including the silicon nitride film 5 to be the cap insulating film) and the sidewalls of the gate electrode G2 (including the silicon nitride film 5 to be the cap insulating film).

Figure 32:
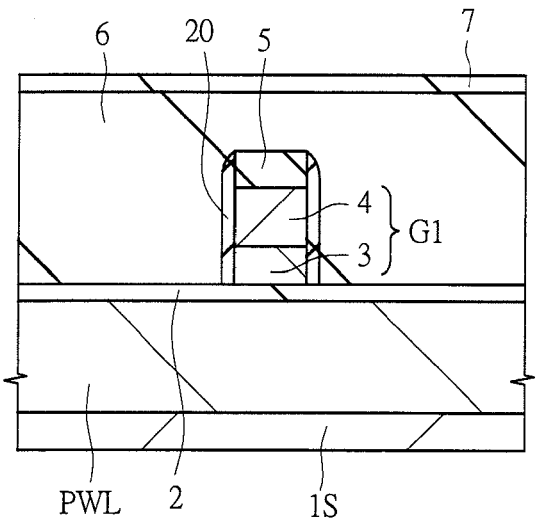
FIG. 32 is a cross-sectional view showing the manufacturing process of a semiconductor device continued from FIG. 31.
Figure 32:
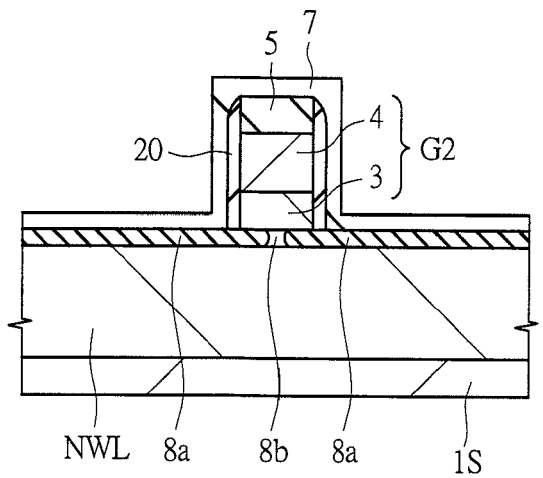

Thereafter, as shown in FIG. 32, the silicon oxide film 6 is formed so as to cover the n-channel MISFET forming region, and the element supply film 7 is formed on the whole surface of the semiconductor substrate 1S. At this time, since the silicon oxide film 6 is formed in the n-channel MISFET forming region, the element supply film 7 is formed on the silicon oxide film 6. Meanwhile, in the p-channel MISFET forming region, the element supply film 7 is formed so as to cover the first insulating film 2 and the gate electrode G2 (including the silicon nitride film 5) formed on the semiconductor substrate 1S.

The element supply film 7 is made of a film containing aluminum (element), and is made of, for example, an aluminum oxide film ($Al_2O_3$ film). Then, the heat treatment is performed to the semiconductor substrate 1S. By this means, aluminum (element) is diffused from the element supply film 7 made of, for example, an aluminum oxide film to the first insulating film 2. As a result, as shown in FIG. 32, aluminum (element) is diffused into the first insulating film 2 made of, for example, a $HfO_2$ film, so that the high-concentration HfAlO film 8a is formed in the p-channel MISFET forming region. At this time, since the first insulating film 2 just below the gate electrode G2 is not in direct contact with the element supply film 7, it turns into the low-concentration HfAlO film 8b. In other words, when focusing on the first insulating film 2 just below the gate electrode G2, aluminum (element) is diffused from the end portion side just below the gate electrode G2 toward the central portion just below the gate electrode G2. Accordingly, in the first insulating film 2 formed just below the gate electrode G2, the aluminum concentration is high on the end portion side in the channel direction, and the aluminum concentration decreases as going toward the central portion apart from the end portion. As a result, in the first insulating film 2 formed just below the gate electrode G2, the end portions are made of the high-concentration HfAlO films 8a, and the central portion is made of the low-concentration HfAlO film 8b. Note that, since the element supply film 7 is formed on the silicon oxide film 6 in the n-channel MISFET forming region, aluminum (element) is not implanted into the first insulating film 2 covered with the thick silicon oxide film 6, so that the first insulating film 2 remains a $HfO_2$ film.

In this case, since the offset spacers 20 made of a silicon nitride film is formed on the sidewalls of the gate electrode G2, the sidewalls of the gate electrode G2 are not in direct contact with the element supply film 7. Therefore, the diffusion of aluminum from the element supply film 7 into the gate electrode G2 by the heat treatment can be suppressed. In other words, the offset spacer 20 formed on the sidewall of the gate electrode G2 has a function to suppress the diffusion of aluminum from the element supply film 7 into the gate electrode G2. By this means, the implantation of an impurity such as aluminum into the titanium nitride film 3 and the tungsten film 4 constituting the gate electrode G2 can be suppressed, and therefore, the effect of preventing the deterioration in characteristics of the gate electrode G2 can be obtained.

Figure 33:
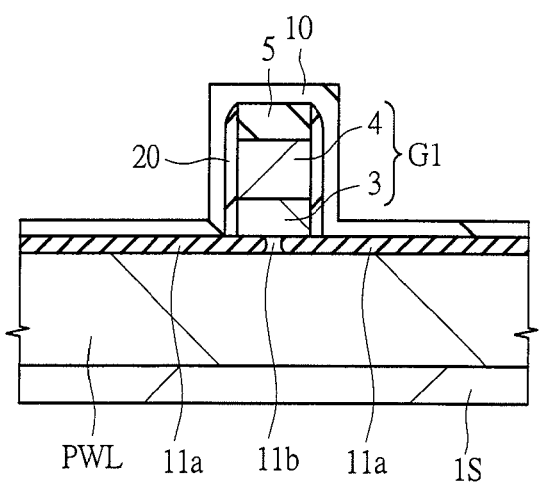
FIG. 33 is a cross-sectional view showing the manufacturing process of a semiconductor device continued from FIG. 32.
Figure 33:
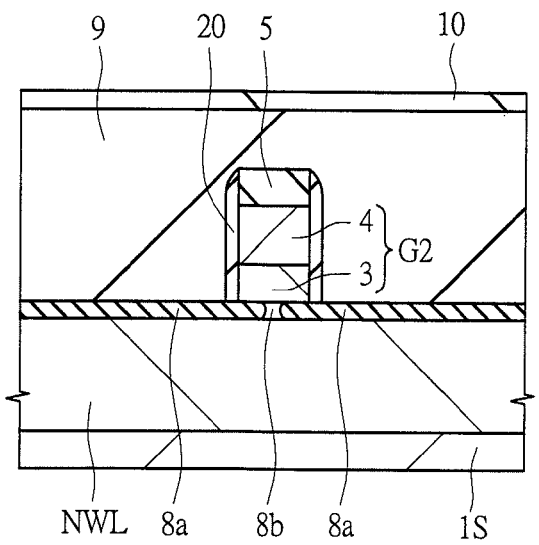

Subsequently, as shown in FIG. 33, after covering the p-channel MISFET forming region with the silicon oxide film 9, the element supply film 10 is formed on the whole surface of the semiconductor substrate 1S. At this time, since the silicon oxide film 9 is formed in the p-channel MISFET forming region, the element supply film 10 is formed on the silicon oxide film 9. Meanwhile, in the n-channel MISFET forming region, the element supply film 10 is formed so as to cover the first insulating film 2 and the gate electrode G1 (including the silicon nitride film 5) formed on the semiconductor substrate 1S.

The element supply film 10 is made of a film containing magnesium (element), and is made of, for example, a magnesium oxide film (MgO film). Then, the heat treatment is performed to the semiconductor substrate 1S. By this means, magnesium (element) is diffused from the element supply film 10 made of, for example, a magnesium oxide film to the first insulating film 2. As a result, as shown in FIG. 33, magnesium (element) is diffused into the first insulating film 2 made of, for example, a $HfO_2$ film, so that the high-concentration HfMgO film 11a is formed in the n-channel MISFET forming region. At this time, since the first insulating film 2 just below the gate electrode G1 is not in direct contact with the element supply film 10, it turns into the low-concentration HfMgO film 11b. In other words, when focusing on the first insulating film 2 just below the gate electrode G1, magnesium (element) is diffused from the end portion side just below the gate electrode G1 toward the central portion just below the gate electrode G1. Accordingly, in the first insulating film 2 formed just below the gate electrode G1, the magnesium concentration is high on the end portion side in the channel direction, and the magnesium concentration decreases as going toward the central portion apart from the end portion. As a result, in the first insulating film 2 formed just below the gate electrode G1, the end portions are made of the high-concentration HfMgO film 11a, and the central portion is made of the low-concentration HfMgO film 11b. Note that, since the element supply film 10 is formed on the silicon oxide film 9 in the p-channel MISFET forming region, magnesium is not implanted into the high-concentration HfAlO film 8a covered with the thick silicon oxide film 9.

In this case, since the offset spacers 20 made of a silicon nitride film are formed on the sidewalls of the gate electrode G1, the sidewalls of the gate electrode G1 are not in direct contact with the element supply film 10. Therefore, the diffusion of magnesium from the element supply film 10 into the gate electrode G1 by the heat treatment can be suppressed. In other words, the offset spacer 20 formed on the sidewall of the gate electrode G1 has a function to suppress the diffusion of magnesium from the element supply film 10 into the gate electrode G1. By this means, the implantation of an impurity such as magnesium into the titanium nitride film 3 and the tungsten film 4 constituting the gate electrode G1 can be suppressed, and therefore, the effect of preventing the deterioration in characteristics of the gate electrode G1 can be obtained.

The subsequent process is the same as that of the first embodiment. In this manner, the semiconductor device according to the second embodiment can be manufactured.

Third Embodiment

In the third embodiment, the example where the first insulating film exposed on the semiconductor substrate 1S is removed after forming a gate electrode and a silicon oxide film is formed in the region where the semiconductor substrate 1S is exposed, and thereafter, an element is diffused from an element supply film into the first insulating film will be described. Since the manufacturing method of a semiconductor device according to the third embodiment is almost the same as the manufacturing method of a semiconductor device according to the first embodiment, the description will be made while placing an emphasis on the difference therebetween.

Figure 34:
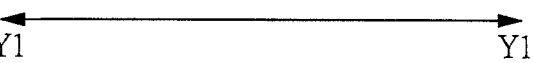
FIG. 34 is a cross-sectional view showing a manufacturing process of a semiconductor device according to the third embodiment.
Figure 34:
Figure 34:
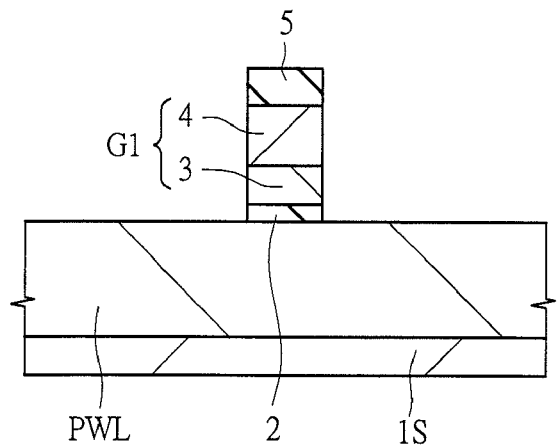
Figure 34:
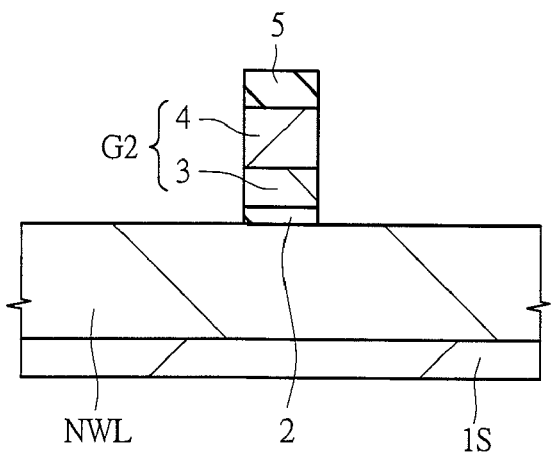

The process from FIG. 12 to FIG. 15 is the same as that of the first embodiment. Next, as shown in FIG. 34, the exposed first insulating film 2 is removed. By this means, the first insulating film 2 is formed only just below the gate electrode G1 and the gate electrode G2. Although the surface of the semiconductor substrate 1S is exposed at this time, since the portion just below the gate stack structure having the gate electrode G1 formed therein and the portion just below the gate stack structure having the gate electrode G2 formed therein are not exposed, the characteristic of the MISFET is little affected. In other words, if the portion just below the gate stack structure is exposed, a problem occurs on the characteristics of the MISFET because the semiconductor substrate 1S on which the gate insulating film is formed is exposed. However, no serious problem occurs on the characteristics of the MISFET unless the portion just below the gate stack structure is exposed.

Figure 35:
FIG. 35 is a cross-sectional view showing the manufacturing process of a semiconductor device continued from FIG. 34.
Figure 35:
Figure 35:
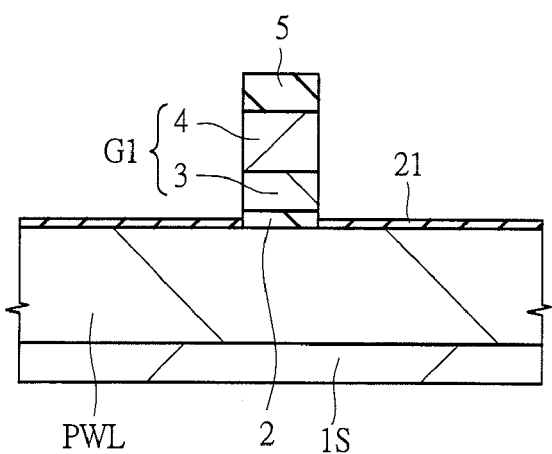
Figure 35:
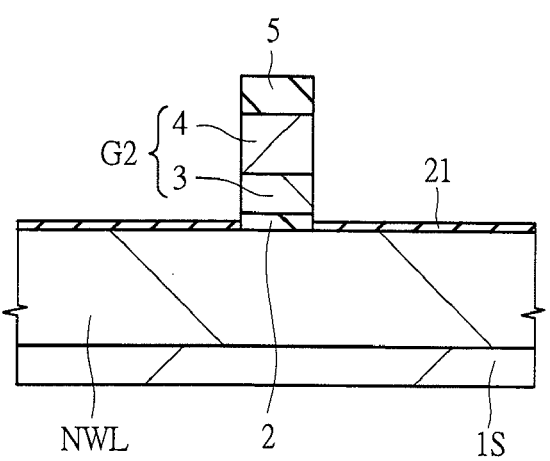
Figure 36:
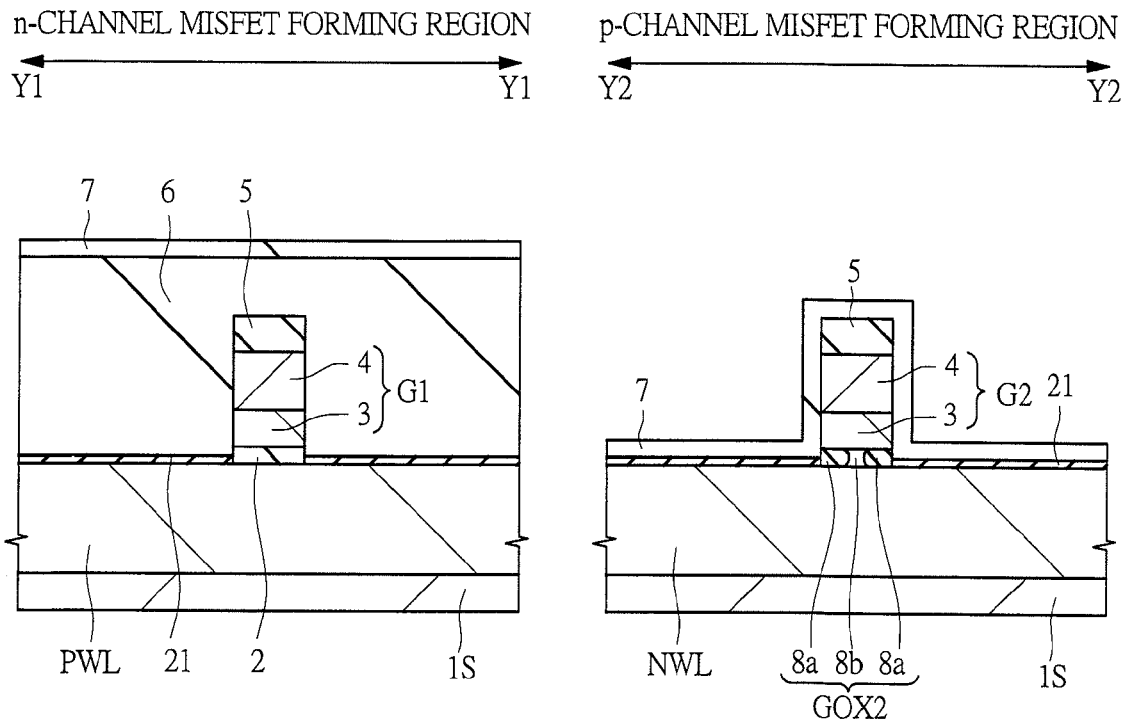
FIG. 36 is a cross-sectional view showing the manufacturing process of a semiconductor device continued from FIG. 35.

Subsequently, as shown in FIG. 35, a silicon oxide film 21 is formed on the exposed semiconductor substrate 1S. Thereafter, as shown in FIG. 36, the silicon oxide film 6 is formed so as to cover the n-channel MISFET forming region, and the element supply film 7 is formed on the whole surface of the semiconductor substrate 1S. At this time, since the silicon oxide film 6 is formed in the n-channel MISFET forming region, the element supply film 7 is formed on the silicon oxide film 6. Meanwhile, in the p-channel MISFET forming region, the element supply film 7 is formed so as to cover the silicon oxide film 21 and the gate electrode G2 (including the silicon nitride film 5) formed on the semiconductor substrate 1S.

The element supply film 7 is made of a film containing aluminum (element), and is made of, for example, an aluminum oxide film ($Al_2O_3$ film). Then, the heat treatment is performed to the semiconductor substrate 1S. By this means, aluminum (element) is diffused from the element supply film 7 made of, for example, an aluminum oxide film to the first insulating film 2. As a result, as shown in FIG. 36, aluminum (element) is diffused into the first insulating film 2 made of, for example, a $HfO_2$ film, so that the high-concentration HfAlO film 8a is formed in the p-channel MISFET forming region. At this time, since the first insulating film 2 just below the gate electrode G2 is not in direct contact with the element supply film 7, it turns into the low-concentration HfAlO film 8b. In other words, when focusing on the first insulating film 2 just below the gate electrode G2, aluminum (element) is diffused from the end portion side just below the gate electrode G2 toward the central portion just below the gate electrode G2. Accordingly, in the first insulating film 2 formed just below the gate electrode G2, the aluminum concentration is high on the end portion side in the channel direction, and the aluminum concentration decreases as going toward the central portion apart from the end portion. As a result, in the first insulating film 2 formed just below the gate electrode G2, the end portions are made of the high-concentration HfAlO films 8a, and the central portion is made of the low-concentration HfAlO film 8b. Note that, since the element supply film 7 is formed on the silicon oxide film 6 in the n-channel MISFET forming region, aluminum (element) is not implanted into the first insulating film 2 covered with the thick silicon oxide film 6, so that the first insulating film 2 remains a $HfO_2$ film.

Here, since the first insulating film 2 exposed on the semiconductor substrate 1S is removed in the third embodiment, the element supply film 7 is in direct contact with the first insulating film 2 formed just below the gate electrode G2. In other words, when the first insulating film 2 is formed also in the region other than the region just below the gate electrode G2, the element supply film 7 is in contact with the first insulating film 2. Therefore, rather than aluminum being diffused directly from the element supply film 7 to the first insulating film 2 formed just below the gate electrode G2, aluminum probably passes through the path as follows, that is, aluminum is diffused from the element supply film 7 to the first insulating film 2 formed outside the gate electrode G2 and then this aluminum is diffused into the first insulating film 2 formed just below the gate electrode G2. In this case, since the diffusion distance to the first insulating film 2 formed just below the gate electrode G2 is long, there is a fear that aluminum is not sufficiently diffused into the first insulating film 2 formed just below the gate electrode G2. On the other hand, since the first insulating film 2 exposed on the semiconductor substrate 1S is removed in the third embodiment, the element supply film 7 is in direct contact with the first insulating film 2 formed just below the gate electrode G2. Therefore, the diffusion distance from the element supply film 7 to the first insulating film 2 formed just below the gate electrode G2 is shortened. As a result, it is probably possible to sufficiently diffuse aluminum even into the first insulating film 2 formed just below the gate electrode G2. Note that the silicon oxide film 21 formed outside the gate electrode G2 is a film provided to prevent aluminum diffused from the element supply film 7 from being excessively diffused into the inside of the semiconductor substrate 1S to be the source region or the drain region.

Figure 37:
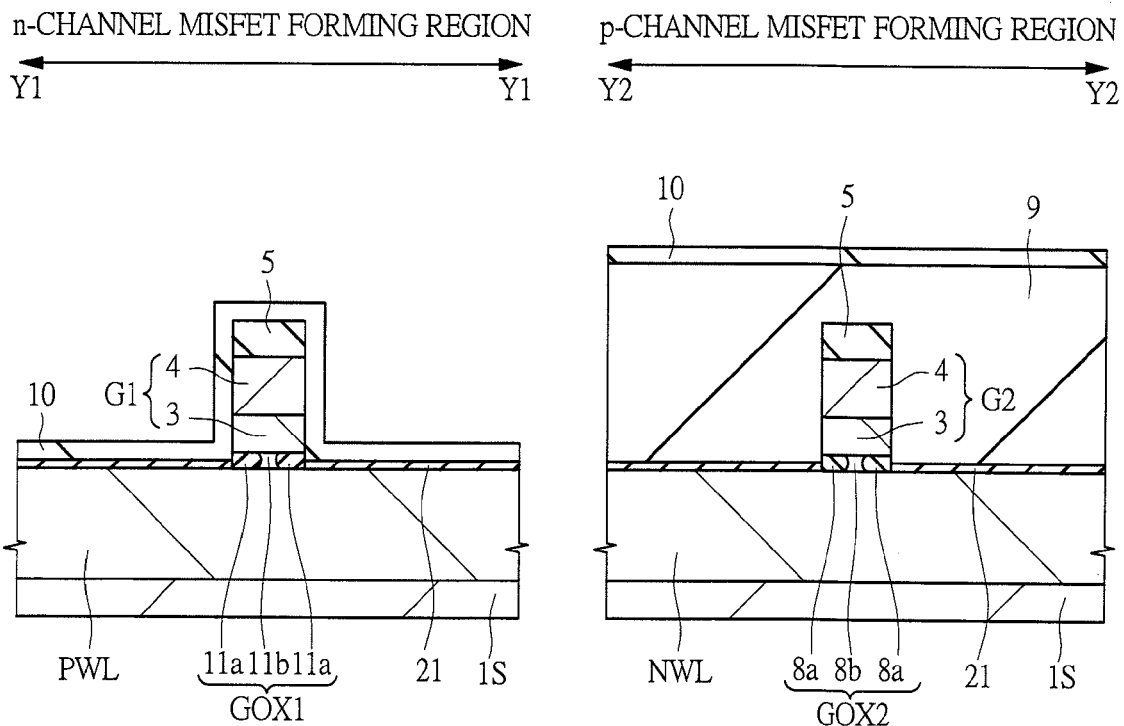
FIG. 37 is a cross-sectional view showing the manufacturing process of a semiconductor device continued from FIG. 36.

Subsequently, as shown in FIG. 37, the silicon oxide film 9 is formed so as to cover the p-channel MISFET forming region, and the element supply film 10 is formed on the whole surface of the semiconductor substrate 1S. At this time, since the silicon oxide film 9 is formed in the p-channel MISFET forming region, the element supply film 10 is formed on the silicon oxide film 9. Meanwhile, in the n-channel MISFET forming region, the element supply film 10 is formed so as to cover the first insulating film 2 and the gate electrode G1 (including the silicon nitride film 5) formed on the semiconductor substrate 1S.

The element supply film 10 is made of a film containing magnesium (element), and is made of, for example, a magnesium oxide film (MgO film). Then, the heat treatment is performed to the semiconductor substrate 1S. By this means, magnesium (element) is diffused from the element supply film 10 made of, for example, a magnesium oxide film to the first insulating film 2. As a result, as shown in FIG. 37, magnesium (element) is diffused into the first insulating film 2 made of, for example, a $HfO_2$ film, so that the high-concentration HfMgO films 11a are formed in the n-channel MISFET forming region. At this time, since the first insulating film 2 just below the gate electrode G1 is not in direct contact with the element supply film 10, it turns into the low-concentration HfMgO film 11b. In other words, when focusing on the first insulating film 2 just below the gate electrode G1, magnesium (element) is diffused from the end portion side just below the gate electrode G1 toward the central portion just below the gate electrode G1. Accordingly, in the first insulating film 2 formed just below the gate electrode G1, the magnesium concentration is high on the end portion side in the channel direction, and the magnesium concentration decreases as going toward the central portion apart from the end portion. As a result, in the first insulating film 2 formed just below the gate electrode G1, the end portions are made of the high-concentration HfMgO films 11a, and the central portion is made of the low-concentration HfMgO film 11b. Note that, since the element supply film 10 is formed on the silicon oxide film 9 in the p-channel MISFET forming region, magnesium (element) is not implanted into the high-concentration HfAlO film 8a covered with the thick silicon oxide film 9.

Here, since the first insulating film 2 exposed on the semiconductor substrate 1S is removed in the third embodiment, the element supply film 10 is in direct contact with the first insulating film 2 formed just below the gate electrode G1. In other words, when the first insulating film 2 is formed also in the region other than the region just below the gate electrode G1, the element supply film 10 is in contact with the first insulating film 2. Therefore, rather than magnesium being diffused directly from the element supply film 10 to the first insulating film 2 formed just below the gate electrode G1, magnesium probably passes through the path as follows, that is, magnesium is diffused from the element supply film 10 to the first insulating film 2 formed outside the gate electrode G1, and then this magnesium is diffused into the first insulating film 2 formed just below the gate electrode G1. In this case, since the diffusion distance to the first insulating film 2 formed just below the gate electrode G1 is long, there is a fear that magnesium is not sufficiently diffused into the first insulating film 2 formed just below the gate electrode G1. On the other hand, since the first insulating film 2 exposed on the semiconductor substrate 1S is removed in the third embodiment, the element supply film 10 is in direct contact with the first insulating film 2 formed just below the gate electrode G1. Therefore, the diffusion distance from the element supply film 10 to the first insulating film 2 formed just below the gate electrode G1 is shortened. As a result, it is probably possible to sufficiently diffuse magnesium even into the first insulating film 2 formed just below the gate electrode G1. Note that the silicon oxide film 21 formed outside the gate electrode G1 is a film provided to prevent magnesium diffused from the element supply film 10 from being excessively diffused into the inside of the semiconductor substrate 1S to be the source region or the drain region.

The subsequent process is the same as that of the first embodiment. In this manner, the semiconductor device according to the third embodiment can be manufactured.

Fourth Embodiment

In the fourth embodiment, the example where the length of the first insulating film in the gate length direction is made shorter than the gate length of the gate electrode, thereby facilitating the diffusion of an element from the element supply film into the first insulating film will be described.

Since the manufacturing method of a semiconductor device according to the fourth embodiment is almost the same as the manufacturing method of a semiconductor device according to the first embodiment, the description will be made while placing an emphasis on the difference therebetween.

Figure 38:
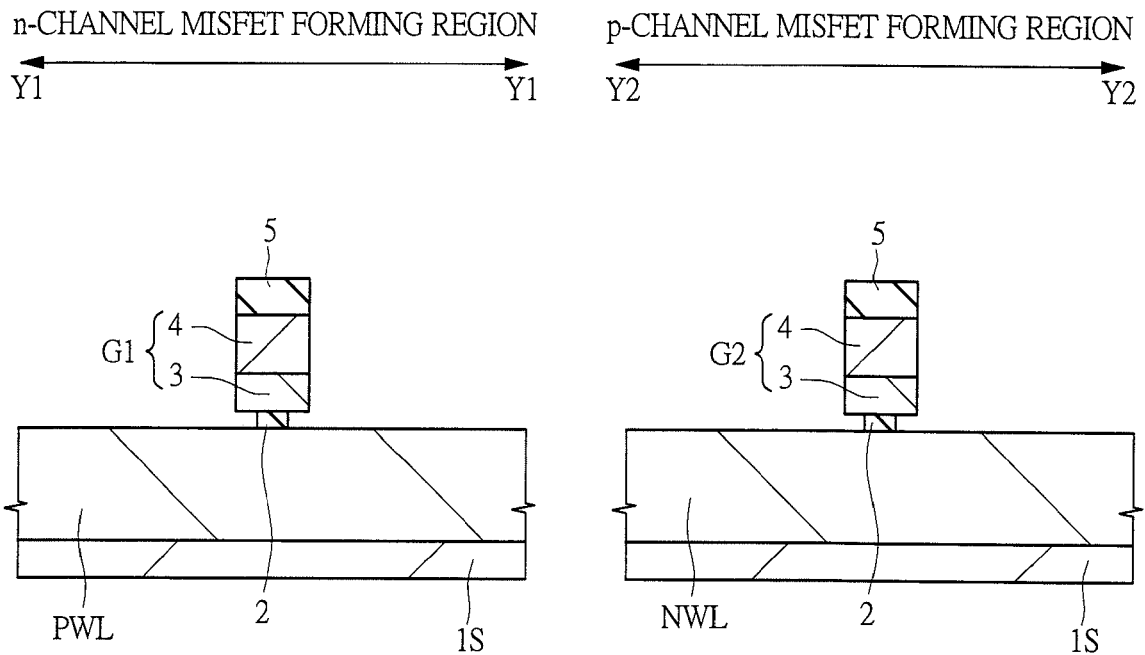
FIG. 38 is a cross-sectional view showing a manufacturing process of a semiconductor device according to the fourth embodiment.

The process from FIG. 12 to FIG. 15 is the same as that of the first embodiment. Next, as shown in FIG. 38, the first insulating film 2 exposed outside the gate electrode G1 and the gate electrode G2 is removed by wet etching. At this time, by extending the processing time of the wet etching, not only the first insulating film 2 exposed on the semiconductor substrate 1S, but a part of the first insulating films 2 formed just below the gate electrode G1 and just below the gate electrode G2 is removed. More specifically, the first insulating films 2 formed just below the gate electrode G1 and just below the gate electrode G2 are partly etched from the end portions of the gate electrode G1 and the gate electrode G2 toward the central portions. By this means, the length of the first insulating film 2 formed just below the gate electrode G1 in the gate length direction becomes shorter than the gate length of the gate electrode G1. Similarly, the length of the first insulating film 2 formed just below the gate electrode G2 in the gate length direction becomes shorter than the gate length of the gate electrode G2.

Figure 39:
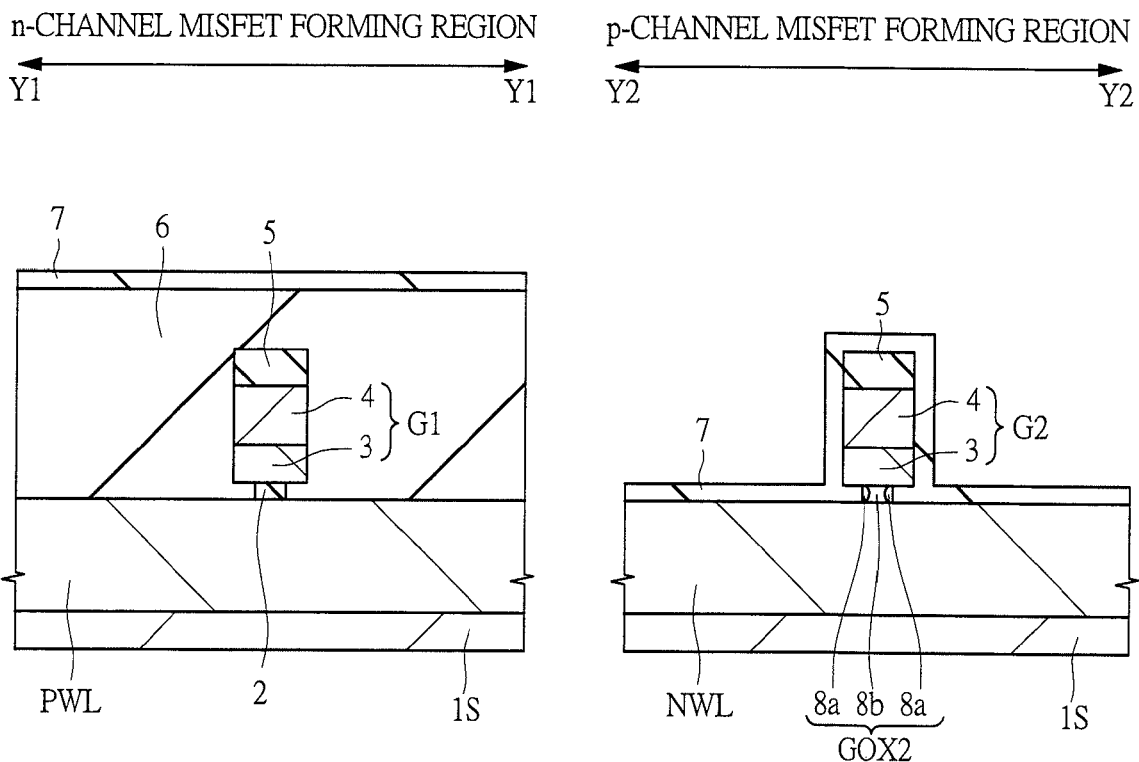
FIG. 39 is a cross-sectional view showing the manufacturing process of a semiconductor device continued from FIG. 38.

Subsequently, as shown in FIG. 39, the silicon oxide film 6 is formed so as to cover the n-channel MISFET forming region, and the element supply film 7 is formed on the whole surface of the semiconductor substrate 1S. At this time, since the silicon oxide film 6 is formed in the n-channel MISFET forming region, the element supply film 7 is formed on the silicon oxide film 6. Meanwhile, in the p-channel MISFET forming region, the element supply film 7 is formed so as to cover the first insulating film 2 and the gate electrode G2 (including the silicon nitride film 5) formed on the semiconductor substrate 1S.

The element supply film 7 is made of a film containing aluminum (element), and is made of, for example, an aluminum oxide film ($Al_2O_3$ film). Then, the heat treatment is performed to the semiconductor substrate 1S. By this means, aluminum (element) is diffused from the element supply film 7 made of, for example, an aluminum oxide film to the first insulating film 2. At this time, since the length of the first insulating film 2 formed just below the gate electrode G2 in the gate length direction is shorter than the gate length of the gate electrode G2, the element supply film 7 reaches the region just below the gate electrode G2 and has contact with the first insulating film 2. As a result, as shown in FIG. 39, aluminum (element) is diffused into the first insulating film 2 made of, for example, a $HfO_2$ film, so that the high-concentration HfAlO film 8a is formed in the p-channel MISFET forming region. Then, aluminum (element) is diffused up to the central portion of the first insulating film 2 formed just below the gate electrode G2. Since the central portion of the first insulating film 2 is not in direct contact with the element supply film 7, the aluminum concentration thereof is lower than that of the end portions of the first insulating film 2 which are in direct contact with the element supply film 7, so that the low-concentration HfAlO film 8b is formed.

Here, in the fourth embodiment, the length of the first insulating film 2 formed just below the gate electrode G2 in the gate length direction is shortened. For this reason, the distance from the end portion of the first insulating film 2 to the central portion is shortened. This means that the diffusion distance of aluminum (element) diffused from the end portion of the first insulating film 2 to the central portion is shortened. More specifically, in the fourth embodiment, since the length of the first insulating film 2 formed just below the gate electrode G2 in the gate length direction is shortened, aluminum (element) can be sufficiently diffused up to the central portion of the first insulating film 2. Therefore, although the gate insulating film GOX2 is constituted of the high-concentration HfAlO films 8a formed in the end portions and the low-concentration HfAlO film 8b formed in the central portion, the difference in aluminum concentration between the high-concentration HfAlO film 8a and the low-concentration HfAlO film 8b can be reduced. In other words, according to the fourth embodiment, aluminum can be sufficiently diffused up to the central portion of the gate insulating film GOX2. Although the fourth embodiment is mainly directed to the MISFET having the gate electrode G2 whose gate length is 20 nm or less, aluminum can be sufficiently diffused into the whole gate insulating film GOX2 by making the length of the first insulating film formed just below the gate electrode G2 in the gate length direction shorter than the gate length like in the fourth embodiment. Therefore, even in the MISFET having the gate electrode G2 whose gate length is 20 nm or more, aluminum can be diffused into the whole gate insulating film GOX2. This means not only that the potential barrier can be reduced in the end portion of the source region in the channel region, but also that the potential barrier can be reduced in the whole channel region. Therefore, according to the fourth embodiment, the threshold voltage can be sufficiently reduced even in the MISFET having the gate electrode G2 whose gate length is 20 nm or more.

Note that, since the element supply film 7 is formed on the silicon oxide film 6 in the n-channel MISFET forming region, aluminum (element) is not implanted into the first insulating film 2 covered with the thick silicon oxide film 6, so that the first insulating film 2 remains a $HfO_2$ film.

Figure 40:
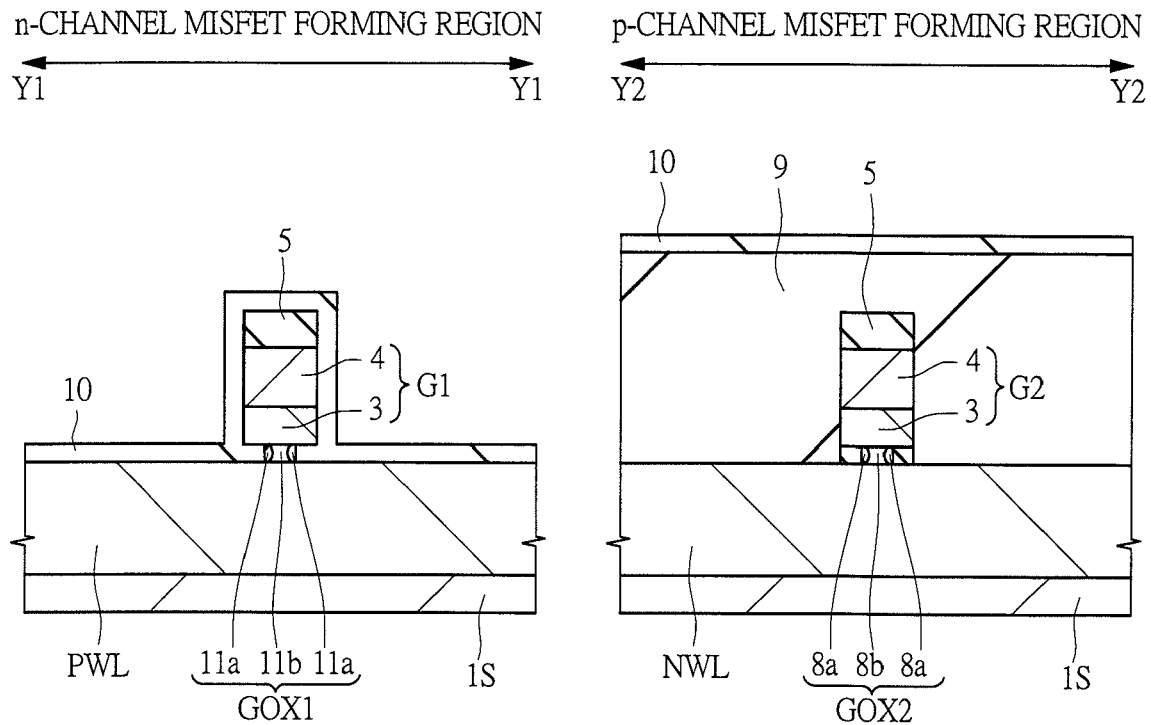
FIG. 40 is a cross-sectional view showing the manufacturing process of a semiconductor device continued from FIG. 39.

Next, as shown in FIG. 40, the silicon oxide film 9 is formed so as to cover the p-channel MISFET forming region, and the element supply film 10 is formed on the whole surface of the semiconductor substrate 1S. At this time, since the silicon oxide film 9 is formed in the p-channel MISFET forming region, the element supply film 10 is formed on the silicon oxide film 9. Meanwhile, in the n-channel MISFET forming region, the element supply film 10 is formed so as to cover the first insulating film 2 and the gate electrode G1 (including the silicon nitride film 5) formed on the semiconductor substrate 1S.

The element supply film 10 is made of a film containing magnesium (element), and is made of, for example, a magnesium oxide film (MgO film). Then, the heat treatment is performed to the semiconductor substrate 1S. By this means, magnesium (element) is diffused from the element supply film 10 made of, for example, a magnesium oxide film to the first insulating film 2. At this time, since the length of the first insulating film 2 formed just below the gate electrode G1 in the gate length direction is shorter than the gate length of the gate electrode G1, the element supply film 10 reaches the region just below the gate electrode G1 and has contact with the first insulating film 2. As a result, as shown in FIG. 40, magnesium (element) is diffused into the first insulating film 2 made of, for example, a $HfO_2$ film, so that the high-concentration HfMgO film 11a is formed in the n-channel MISFET forming region. Then, magnesium (element) is diffused up to the central portion of the first insulating film 2 formed just below the gate electrode G1. Since the central portion of the first insulating film 2 is not in direct contact with the element supply film 10, the magnesium concentration thereof is lower than that of the end portion of the first insulating film 2 which is in direct contact with the element supply film 10, so that the low-concentration HfMgO film 11b is formed.

Here, in the fourth embodiment, the length of the first insulating film 2 formed just below the gate electrode G1 in the gate length direction is shortened. For this reason, the distance from the end portion of the first insulating film 2 to the central portion is shortened. This means that the diffusion distance of magnesium (element) diffused from the end portion of the first insulating film 2 to the central portion is shortened. More specifically, in the fourth embodiment, since the length of the first insulating film 2 formed just below the gate electrode G1 in the gate length direction is shortened, magnesium (element) can be sufficiently diffused up to the central portion of the first insulating film 2. Therefore, although the gate insulating film GOX1 is constituted of the high-concentration HfMgO films 11a formed in the end portions and the low-concentration HfMgO film 11b formed in the central portion, the difference in magnesium concentration between the high-concentration HfMgO film 11a and the low-concentration HfMgO film 11b can be reduced. In other words, according to the fourth embodiment, magnesium can be sufficiently diffused up to the central portion of the gate insulating film GOX1. Although the fourth embodiment is mainly directed to the MISFET having the gate electrode G1 whose gate length is 20 nm or less, magnesium can be sufficiently diffused into the whole gate insulating film GOX1 by making the length of the first insulating film formed just below the gate electrode G1 in the gate length direction shorter than the gate length like in the fourth embodiment. Therefore, even in the MISFET having the gate electrode G1 whose gate length is 20 nm or more, magnesium can be diffused into the whole gate insulating film GOX1. This means not only that the potential barrier can be reduced in the end portion of the source region in the channel region, but also that the potential barrier can be reduced in the whole channel region. Therefore, according to the fourth embodiment, the threshold voltage can be sufficiently reduced even in the MISFET having the gate electrode G1 whose gate length is 20 nm or more.

The subsequent process is the same as that of the first embodiment. In this manner, the semiconductor device according to the fourth embodiment can be manufactured. According to the fourth embodiment, since the gate insulating film GOX1 of the n-channel MISFET and the gate insulating film GOX2 of the p-channel MISFET can be formed from respectively different high-dielectric-constant films without unnecessarily exposing the semiconductor substrate 1S (in particular, the semiconductor substrate 1S below the gate stack structure), the reliability of the semiconductor device can be improved. In particular, according to the fourth embodiment, even in the semiconductor device in which the n-channel MISFET having the gate length of 20 nm or more and the p-channel MISFET having the gate length of 20 nm or more are formed together, the threshold voltage can be reduced, and the above-described effects can be obtained.

Fifth Embodiment

In the fifth embodiment, the example where, when the formation process of an element supply film, the diffusion process of an element into the first insulating film from the element supply film by the heat treatment, and the removal process of the element supply film are defined as a cycle process, this cycle process is repeatedly performed will be described.

Since the manufacturing method of a semiconductor device according to the fifth embodiment is almost the same as the manufacturing method of a semiconductor device according to the first embodiment, the description will be made while placing an emphasis on the difference therebetween.

Figure 41:
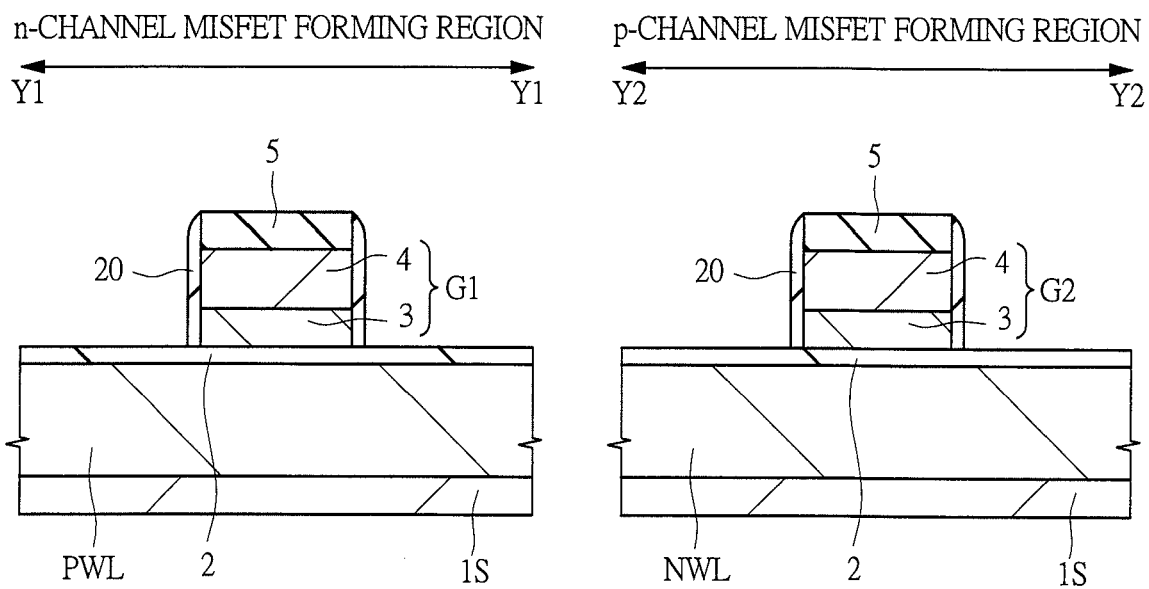
FIG. 41 is a cross-sectional view showing a manufacturing process of a semiconductor device according to the fifth embodiment.

The process from FIG. 12 to FIG. 15 is the same as that of the first embodiment. Subsequently, as shown in FIG. 41, a silicon nitride film is formed on the whole surface of the semiconductor substrate 1S. Then, the silicon nitride film is anisotropically etched to form offset spacers 20 on the sidewalls of the gate electrode G1 (including the silicon nitride film 5 to be the cap insulating film) and the sidewalls of the gate electrode G2 (including the silicon nitride film 5 to be the cap insulating film).

Figure 42:
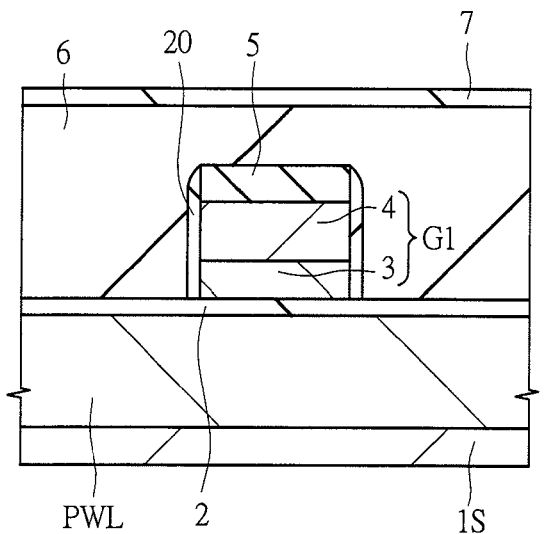
FIG. 42 is a cross-sectional view showing the manufacturing process of a semiconductor device continued from FIG. 41.
Figure 42:
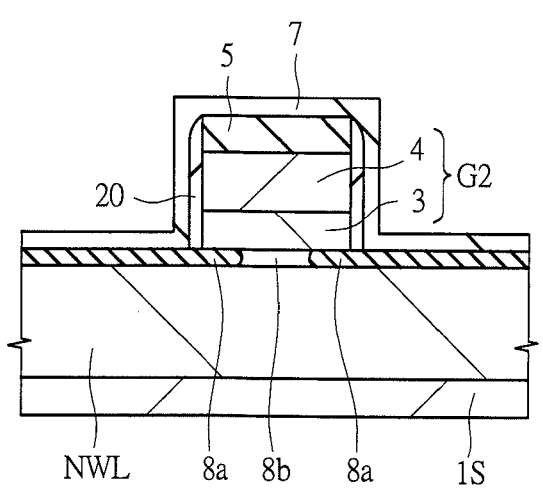

Thereafter, as shown in FIG. 42, the silicon oxide film 6 is formed so as to cover the n-channel MISFET forming region, and the element supply film 7 is formed on the whole surface of the semiconductor substrate 1S. At this time, since the silicon oxide film 6 is formed in the n-channel MISFET forming region, the element supply film 7 is formed on the silicon oxide film 6. Meanwhile, in the p-channel MISFET forming region, the element supply film 7 is formed so as to cover the first insulating film 2 and the gate electrode G2 (including the silicon nitride film 5) formed on the semiconductor substrate 1S.

The element supply film 7 is made of a film containing aluminum (element), and is made of, for example, an aluminum oxide film ($Al_2O_3$ film). Then, the heat treatment is performed to the semiconductor substrate 1S. By this means, aluminum (element) is diffused from the element supply film 7 made of, for example, an aluminum oxide film to the first insulating film 2. As a result, as shown in FIG. 42, aluminum (element) is diffused into the first insulating film 2 made of, for example, a $HfO_2$ film, so that the high-concentration HfAlO film 8a is formed in the p-channel MISFET forming region. At this time, since the first insulating film 2 just below the gate electrode G2 is not in direct contact with the element supply film 7, it turns into the low-concentration HfAlO film 8b. In other words, when focusing on the first insulating film 2 just below the gate electrode G2, aluminum (element) is diffused from the end portion side just below the gate electrode G2 toward the central portion just below the gate electrode G2. Accordingly, in the first insulating film 2 formed just below the gate electrode G2, the aluminum concentration is high on the end portion side in the channel direction, and the aluminum concentration decreases as going toward the central portion apart from the end portion. As a result, in the first insulating film 2 formed just below the gate electrode G2, the end portions are made of the high-concentration HfAlO films 8a, and the central portion is made of the low-concentration HfAlO film 8b. Note that, since the element supply film 7 is formed on the silicon oxide film 6 in the n-channel MISFET forming region, aluminum (element) is not implanted into the first insulating film 2 covered with the thick silicon oxide film 6, so that the first insulating film 2 remains a $HfO_2$ film.

Figure 43:
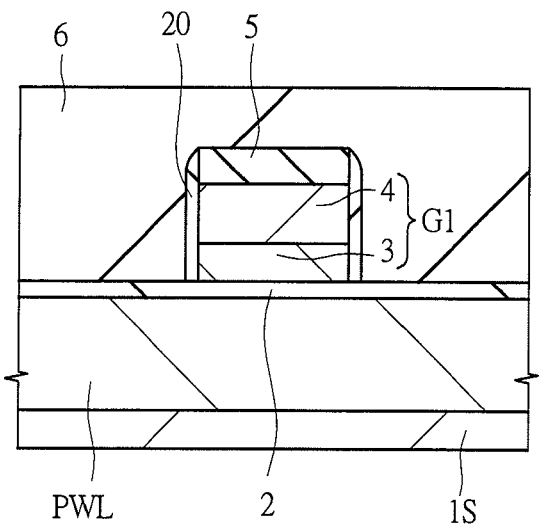
FIG. 43 is a cross-sectional view showing the manufacturing process of a semiconductor device continued from FIG. 42.
Figure 43:
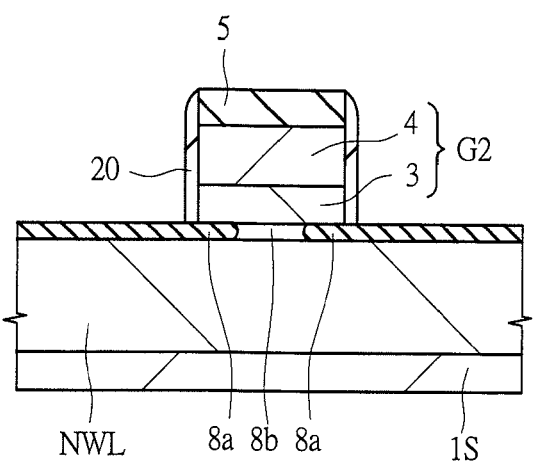
Figure 44:
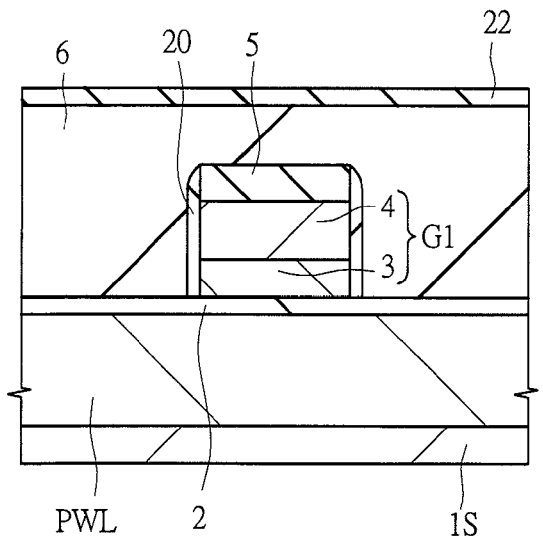
FIG. 44 is a cross-sectional view showing the manufacturing process of a semiconductor device continued from FIG. 43.
Figure 44:
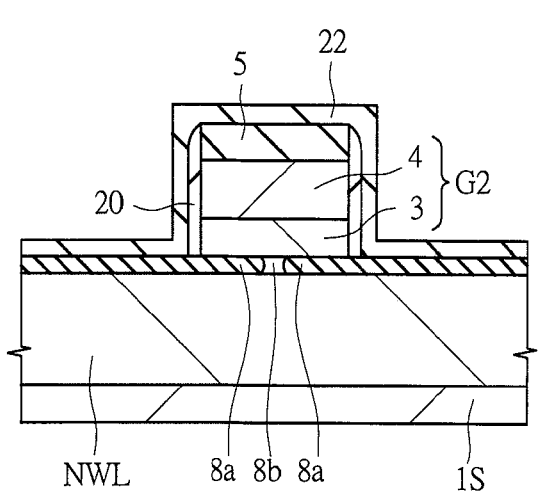
Figure 45:
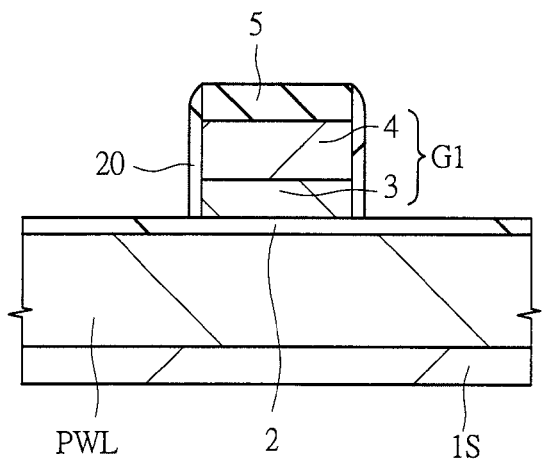
FIG. 45 is a cross-sectional view showing the manufacturing process of a semiconductor device continued from FIG. 44.
Figure 45:
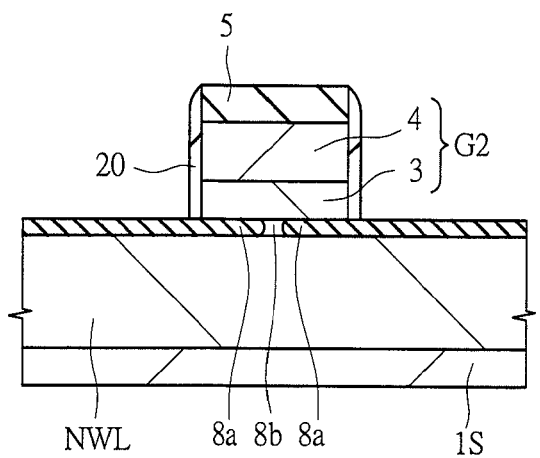

Next, as shown in FIG. 43, the element supply film 7 is removed. In the above-described process, the formation process of the element supply film 7, the diffusion process of aluminum (element) from the element supply film 7 into the first insulating film 2 by the heat treatment, and the removal process of the element supply film 7 are performed. When a series of these processes are defined as a cycle process, the cycle process is repeatedly performed in the fifth embodiment. Concretely, as shown in FIG. 44, after forming an element supply film 22 again on the semiconductor substrate 1S, the heat treatment is performed. By this means, aluminum (element) is further diffused into the first insulating film 2 formed just below the gate electrode G2. More specifically, by repeating the above-described cycle process, aluminum (element) is further diffused from the end portion of the first insulating film 2 formed just below the gate electrode G2 toward the central portion. As a result, most of the first insulating film 2 formed just below the gate electrode G2 turns into the high-concentration HfAlO film 8a, so that the low-concentration HfAlO film 8b formed in the central portion is narrowed. Subsequently, as shown in FIG. 45, the element supply film 22 is removed, and the silicon oxide film 6 formed in the n-channel MISFET forming region is removed.

By repeatedly performing the cycle process as described above, the following effects can be obtained. First, when the cycle process is repeatedly performed to the MISFET having the gate electrode G2 whose gate length is 20 nm or less, the region occupied by the high-concentration HfAlO film 8a formed just below the gate electrode G2 is increased. In other words, the region occupied by the low-concentration HfAlO film 8b is reduced. This means that aluminum can be added at a high concentration to the whole gate insulating film formed just below the gate electrode G2. In the MISFET having the gate electrode G2 whose gate length is 20 nm or less, the threshold voltage of the MISFET can be reduced if the high-concentration HfAlO film 8a is provided only in the end portion of the gate insulating film, but since most of the gate insulating film can be formed of the high-concentration HfAlO film 8a according to the fifth embodiment, the threshold voltage of the MISFET can be reduced without fail.

Furthermore, the fifth embodiment can be applied to the MISFET having the gate electrode G2 whose gate length is 20 nm or more. This is because aluminum (element) is sufficiently diffused up to the central portion of the first insulating film 2 by repeatedly performing the cycle process in the fifth embodiment. In other words, although the gate insulating film is constituted of the high-concentration HfAlO films 8a formed in the end portions and the low-concentration HfAlO film 8b formed in the central portion, the difference in aluminum concentration between the high-concentration HfAlO film 8a and the low-concentration HfAlO film 8b can be reduced. In other words, according to the fifth embodiment, aluminum can be sufficiently diffused up to the central portion of the gate insulating film. Therefore, even in the MISFET having the gate electrode G2 whose gate length is 20 nm or more, aluminum can be diffused into the whole gate insulating film. This means not only that the potential barrier can be reduced in the end portion of the source region in the channel region, but also that the potential barrier can be reduced in the whole channel region. Therefore, according to the fifth embodiment, the threshold voltage can be sufficiently reduced even in the MISFET having the gate electrode G2 whose gate length is 20 nm or more.

Here, instead of repeatedly performing the cycle process described above, the extension of the processing time of the heat treatment after forming the element supply film 7 is conceivable as the method for sufficiently diffusing aluminum in the whole gate insulating film. This is because aluminum is correspondingly diffused when the processing time of the heat treatment is extended. However, when the processing time of the heat treatment is extended, the element supply film 7 is firmly fixed to the underlying member, so that the removal thereof becomes difficult. For this reason, the diffusion of aluminum is accelerated by repeatedly performing the cycle process like in the fifth embodiment. In the fifth embodiment, since the processing time of the heat treatment is not extended, such a disadvantage that the removal of the element supply film 7 becomes difficult does not occur.

Figure 46:
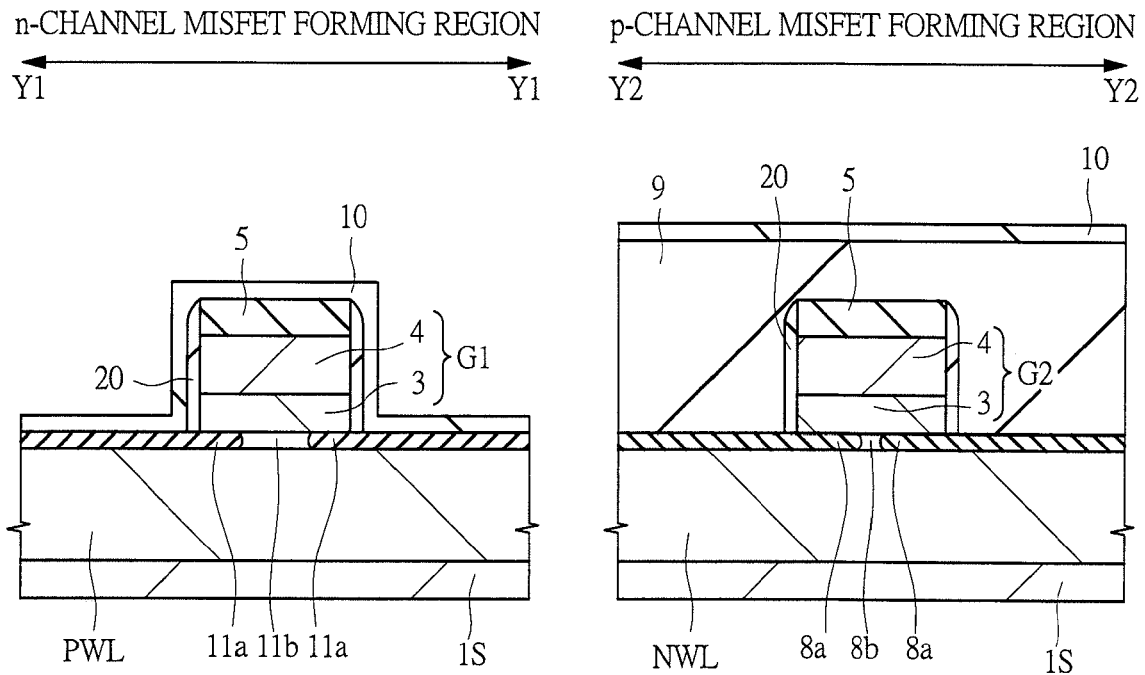
FIG. 46 is a cross-sectional view showing the manufacturing process of a semiconductor device continued from FIG. 45.

Subsequently, as shown in FIG. 46, the silicon oxide film 9 is formed so as to cover the p-channel MISFET forming region, and the element supply film 10 is formed on the whole surface of the semiconductor substrate 1S. At this time, since the silicon oxide film 9 is formed in the p-channel MISFET forming region, the element supply film 10 is formed on the silicon oxide film 9. Meanwhile, in the n-channel MISFET forming region, the element supply film 10 is formed so as to cover the first insulating film 2 and the gate electrode G1 (including the silicon nitride film 5) formed on the semiconductor substrate 1S.

The element supply film 10 is made of a film containing magnesium (element), and is made of, for example, a magnesium oxide film (MgO film). Then, the heat treatment is performed to the semiconductor substrate 1S. By this means, magnesium (element) is diffused from the element supply film 10 made of, for example, a magnesium oxide film to the first insulating film 2. As a result, as shown in FIG. 46, magnesium (element) is diffused into the first insulating film 2 made of, for example, a $HfO_2$ film, so that the high-concentration HfMgO film 11a is formed in the n-channel MISFET forming region. At this time, since the first insulating film 2 just below the gate electrode G1 is not in direct contact with the element supply film 10, it turns into the low-concentration HfMgO film 11b. In other words, when focusing on the first insulating film 2 just below the gate electrode G1, magnesium (element) is diffused from the end portion side just below the gate electrode G1 toward the central portion just below the gate electrode G1. Accordingly, in the first insulating film 2 formed just below the gate electrode G1, the magnesium concentration is high on the end portion side in the channel direction, and the magnesium concentration decreases as going toward the central portion apart from the end portion. As a result, in the first insulating film 2 formed just below the gate electrode G1, the end portions are made of the high-concentration HfMgO film 11a, and the central portion is made of the low-concentration HfMgO film 11b. Note that, since the element supply film 10 is formed on the silicon oxide film 9 in the p-channel MISFET forming region, magnesium (element) is not implanted into the high-concentration HfAlO film 8a covered with the thick silicon oxide film 9.

Figure 47:
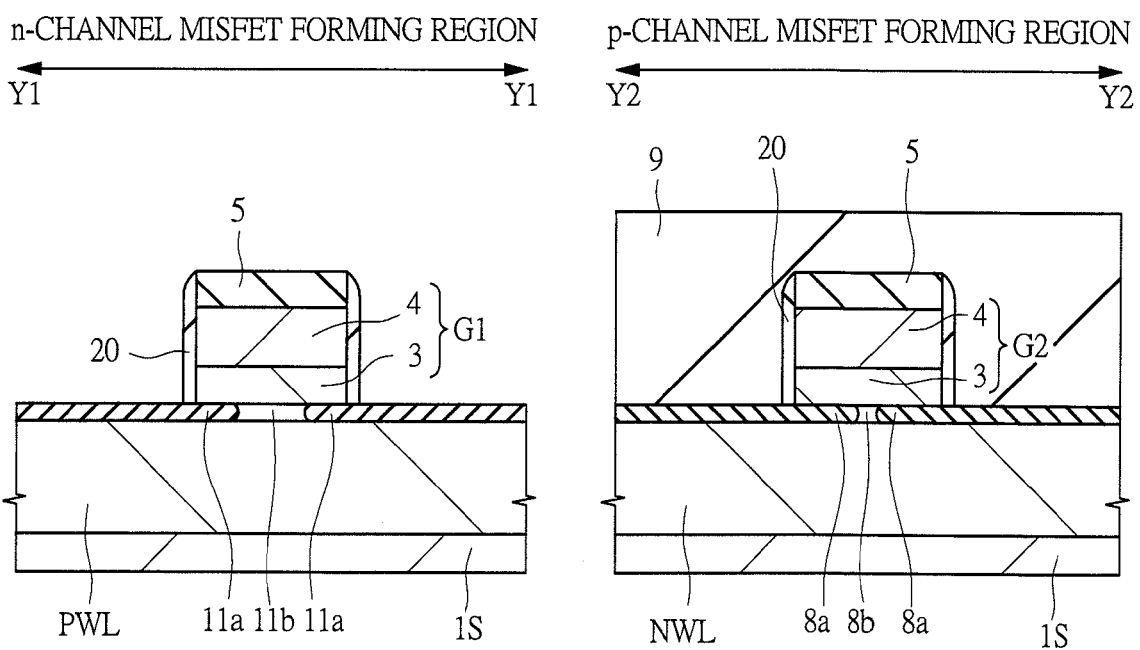
FIG. 47 is a cross-sectional view showing the manufacturing process of a semiconductor device continued from FIG. 46.
Figure 48:
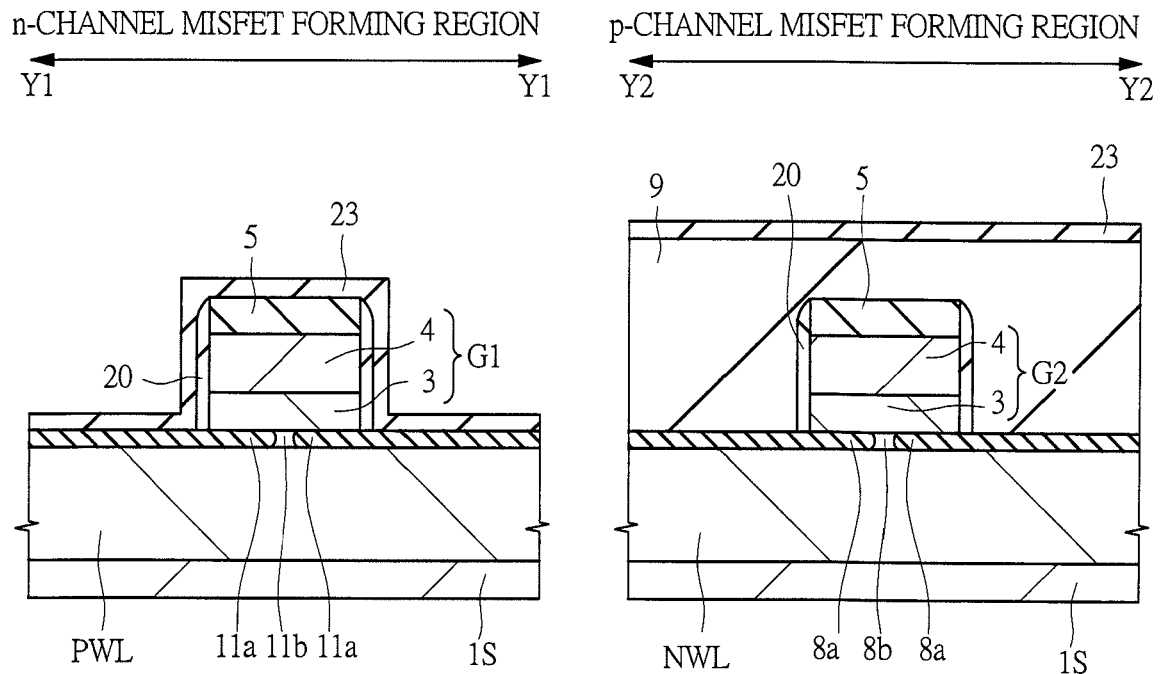
FIG. 48 is a cross-sectional view showing the manufacturing process of a semiconductor device continued from FIG. 47.

Next, as shown in FIG. 47, the element supply film 10 is removed. In the above-described process, the formation process of the element supply film 10, the diffusion process of magnesium (element) from the element supply film 10 into the first insulating film 2 by the heat treatment and the removal process of the element supply film 10 are performed. When a series of these processes are defined as a cycle process, the cycle process is repeatedly performed in the fifth embodiment. Concretely, as shown in FIG. 48, after forming an element supply film 23 again on the semiconductor substrate 1S, the heat treatment is performed. By this means, magnesium (element) is further diffused into the first insulating film 2 formed just below the gate electrode G1. More specifically, by repeating the above-described cycle process, magnesium (element) is further diffused from the end portion of the first insulating film 2 formed just below the gate electrode G1 toward the central portion. As a result, most of the first insulating film 2 formed just below the gate electrode G1 turns into the high-concentration HfMgO film 11a, and the low-concentration HfMgO film 11b formed in the central portion is narrowed. Subsequently, the element supply film 23 is removed, and the silicon oxide film 9 formed in the p-channel MISFET forming region is removed.

As described above, also in the n-channel MISFET formed in the n-channel MISFET forming region, magnesium can be sufficiently diffused into the most part of the gate insulating film formed just below the gate electrode G1 by applying the method according to the fifth embodiment. Therefore, the threshold voltage can be sufficiently reduced without deteriorating the reliability of the semiconductor device not only in the MISFET having the gate electrode G1 whose gate length is 20 nm or less but also in the MISFET having the gate electrode G1 whose gate length is 20 nm or more.

The subsequent process is the same as that of the first embodiment. In this manner, the semiconductor device according to the fifth embodiment can be manufactured.

Sixth Embodiment

In the sixth embodiment, the example where the n-channel MISFET and the p-channel MISFET are formed on an SOI (Silicon On Insulator) substrate will be described. Since the manufacturing method of a semiconductor device according to the sixth embodiment is almost the same as the manufacturing method of a semiconductor device according to the first embodiment, the description will be made while placing an emphasis on the difference therebetween.

Figure 49:
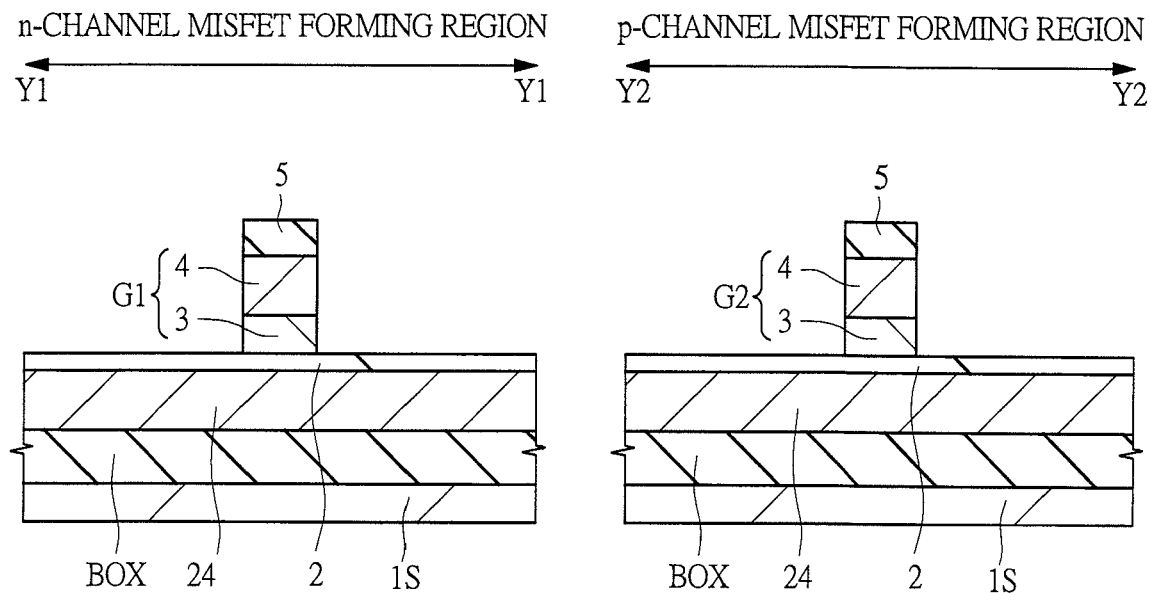
FIG. 49 is a cross-sectional view showing a manufacturing process of a semiconductor device according to the sixth embodiment.

The process from FIG. 12 to FIG. 15 is the same as that of the first embodiment. In the sixth embodiment, however, the gate electrode G1 and the gate electrode G2 are formed on an SOI substrate as shown in FIG. 49. The SOI substrate is constituted of a semiconductor substrate 1S to be a substrate layer, a buried insulating layer BOX formed on the semiconductor substrate 1S, and an active layer 24 which is a semiconductor region formed on the buried insulating layer BOX as shown in FIG. 49.

Figure 50:
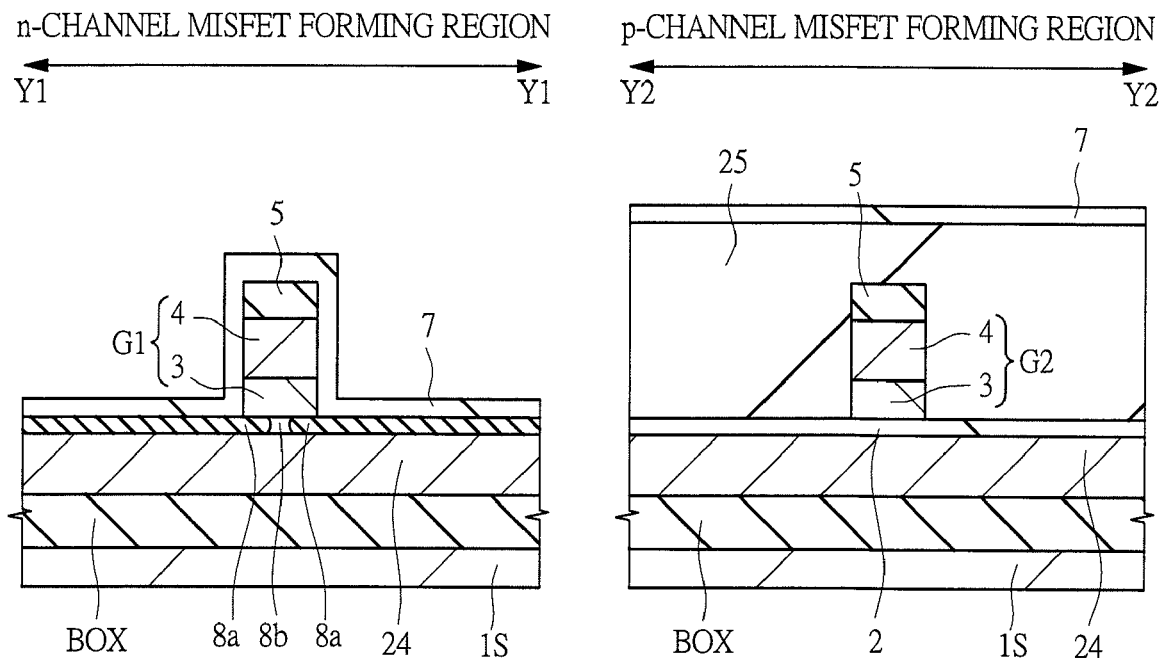
FIG. 50 is a cross-sectional view showing the manufacturing process of a semiconductor device continued from FIG. 49.

Thereafter, as shown in FIG. 50, a silicon oxide film 25 is formed so as to cover the p-channel MISFET forming region, and the element supply film 7 is formed on the whole surface of the SOI substrate. At this time, since the silicon oxide film 25 is formed in the p-channel MISFET forming region, the element supply film 7 is formed on the silicon oxide film 25. Meanwhile, in the n-channel MISFET forming region, the element supply film 7 is formed so as to cover the first insulating film 2 and the gate electrode G1 (including the silicon nitride film 5) formed on the SOI substrate.

The element supply film 7 is made of a film containing aluminum (element), and is made of, for example, an aluminum oxide film ($Al_2O_3$ film). Then, the heat treatment is performed to the SOI substrate. By this means, aluminum (element) is diffused from the element supply film 7 made of, for example, an aluminum oxide film into the first insulating film 2. As a result, as shown in FIG. 50, aluminum (element) is diffused into the first insulating film 2 made of, for example, a $HfO_2$ film, so that the high-concentration HfAlO film 8a is formed in the n-channel MISFET forming region. At this time, since the first insulating film 2 just below the gate electrode G1 is not in direct contact with the element supply film 7, it turns into the low-concentration HfAlO film 8b. In other words, when focusing on the first insulating film 2 just below the gate electrode G1, aluminum (element) is diffused from the end portion side just below the gate electrode G1 toward the central portion just below the gate electrode G1. Accordingly, in the first insulating film 2 formed just below the gate electrode G1, the aluminum concentration is high on the end portion side in the channel direction, and the aluminum concentration decreases as going toward the central portion apart from the end portion. As a result, in the first insulating film 2 formed just below the gate electrode G1, the end portions are made of the high-concentration HfAlO films 8a, and the central portion is made of the low-concentration HfAlO film 8b. Note that, since the element supply film 7 is formed on the silicon oxide film 25 in the p-channel MISFET forming region, aluminum (element) is not implanted into the first insulating film 2 covered with the thick silicon oxide film 25, and the first insulating film 2 remains a HfO$_2$ film.

Figure 51:
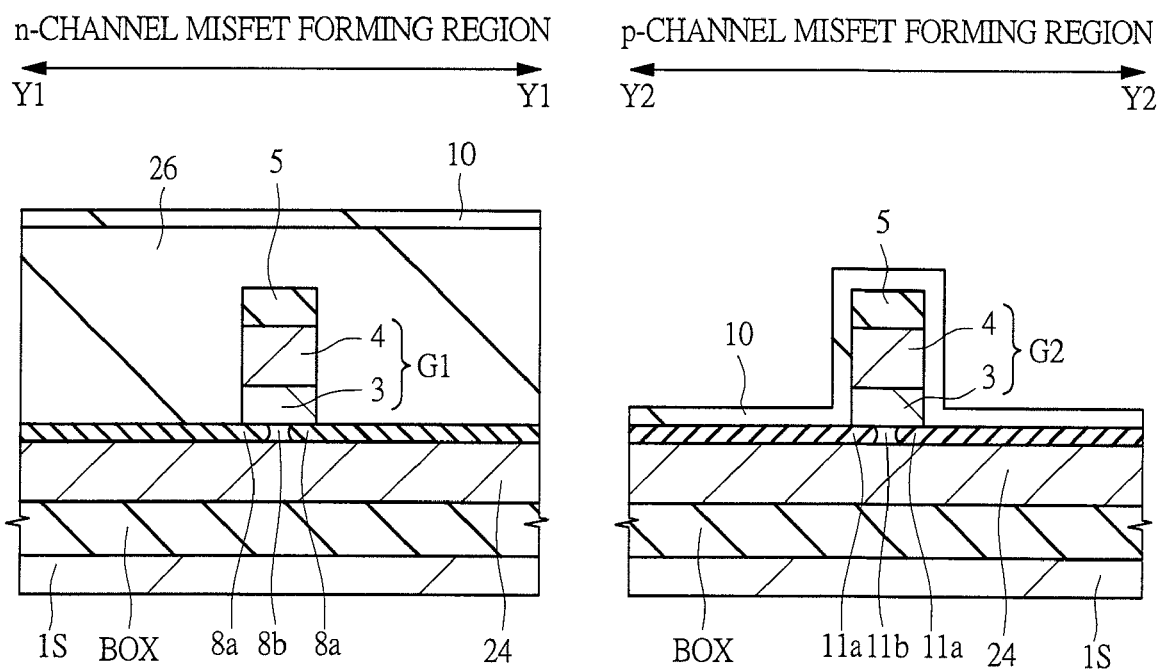
FIG. 51 is a cross-sectional view showing the manufacturing process of a semiconductor device continued from FIG. 50.

Subsequently, as shown in FIG. 51, a silicon oxide film 26 is formed so as to cover the n-channel MISFET forming region, and the element supply film 10 is formed on the whole surface of the SOI substrate. At this time, since the silicon oxide film 26 is formed in the n-channel MISFET forming region, the element supply film 10 is formed on the silicon oxide film 26. Meanwhile, in the p-channel MISFET forming region, the element supply film 10 is formed so as to cover the first insulating film 2 and the gate electrode G2 (including the silicon nitride film 5) formed on the SOI substrate.

The element supply film 10 is made of a film containing magnesium (element), and is made of, for example, a magnesium oxide film (MgO film). Then, the heat treatment is performed to the SOI substrate. By this means, magnesium (element) is diffused from the element supply film 10 made of, for example, a magnesium oxide film to the first insulating film 2. As a result, as shown in FIG. 51, magnesium (element) is diffused into the first insulating film 2 made of, for example, a HfO$_2$ film, so that the high-concentration HfMgO film 11a is formed in the p-channel MISFET forming region. At this time, since the first insulating film 2 just below the gate electrode G2 is not in direct contact with the element supply film 10, it turns into the low-concentration HfMgO film 11b. In other words, when focusing on the first insulating film 2 just below the gate electrode G2, magnesium (element) is diffused from the end portion side just below the gate electrode G2 toward the central portion just below the gate electrode G2. Accordingly, in the first insulating film 2 formed just below the gate electrode G2, the magnesium concentration is high on the end portion side in the channel direction, and the magnesium concentration decreases as going toward the central portion apart from the end portion. As a result, in the first insulating film 2 formed just below the gate electrode G2, the end portions are made of the high-concentration HfMgO films 11a, and the central portion is made of the low-concentration HfMgO film 11b. Note that, since the element supply film 10 is formed on the silicon oxide film 26 in the n-channel MISFET forming region, magnesium (element) is not implanted into the high-concentration HfAlO film 8a covered with the thick silicon oxide film 26.

Figure 52:
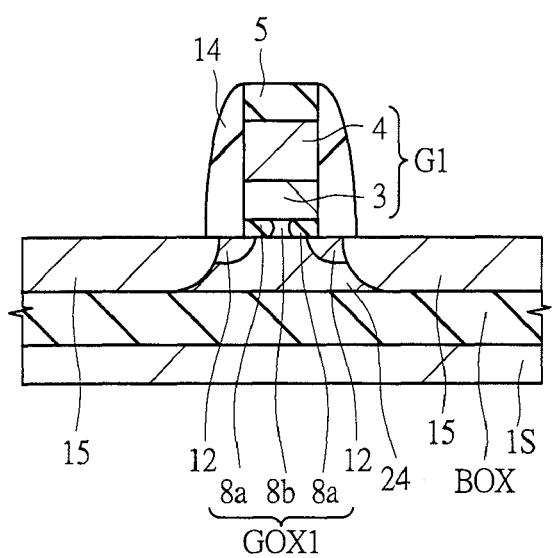
FIG. 52 is a cross-sectional view showing the manufacturing process of a semiconductor device continued from FIG. 51.
Figure 52:
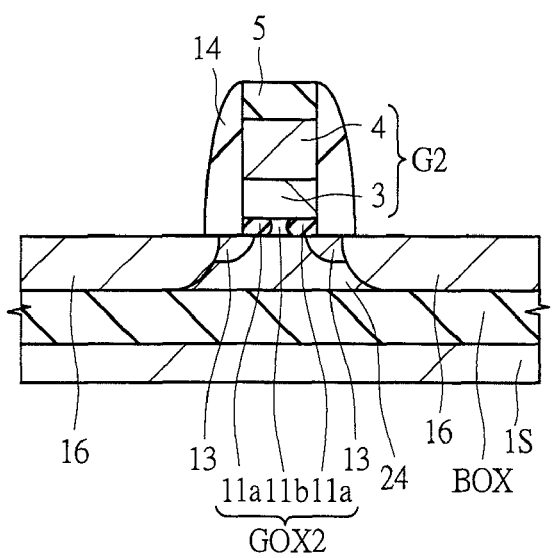

The subsequent process is the same as that of the first embodiment. In this manner, the semiconductor device as shown in FIG. 52 can be manufactured. The difference between the semiconductor device according to the sixth embodiment shown in FIG. 52 and the semiconductor device according to the first embodiment shown in FIG. 3 will be described here. First, the n-channel MISFET and the p-channel MISFET are formed on the SOI substrate in FIG. 52, and on the other hand, the n-channel MISFET and the p-channel MISFET are formed on the normal semiconductor substrate (bulk) 1S in FIG. 3.

Furthermore, in FIG. 52, the gate insulating film GOX1 of the n-channel MISFET is constituted of the high-concentration HfAlO films 8a and the low-concentration HfAlO film 8b, and the gate insulating film GOX2 of the p-channel MISFET is constituted of the high-concentration HfMgO films 11a and the low-concentration HfMgO film 11b. Meanwhile, in FIG. 3 showing the first embodiment, the gate insulating film GOX1 of the n-channel MISFET is constituted of the high-concentration HfMgO films 11a and the low-concentration HfMgO film 11b, and the gate insulating film GOX2 of the p-channel MISFET is constituted of the high-concentration HfAlO films 8a and the low-concentration HfAlO film 8b. As described above, the elements added to the gate insulating films are reversed between FIG. 52 showing the sixth embodiment and FIG. 3 showing the first embodiment.

This is because of the following reasons. When the n-channel MISFET and the p-channel MISFET are formed on the normal semiconductor substrate 1S as shown in the first embodiment, the threshold voltage of the n-channel MISFET can be reduced by adding magnesium to the HfO$_2$ film constituting the gate insulating film GOX1 in the n-channel MISFET. Similarly, the threshold voltage of the p-channel MISFET can be reduced by adding aluminum to the HfO$_2$ film constituting the gate insulating film GOX2 in the p-channel MISFET. As described above, when the normal semiconductor substrate 1S is used, from the standpoint of reducing the threshold voltage in both the n-channel MISFET and the p-channel MISFET, magnesium is added to the gate insulating film GOX1 of the n-channel MISFET, and aluminum is added to the gate insulating film GOX2 of the p-channel MISFET.

Meanwhile, when the n-channel MISFET and the p-channel MISFET are formed on the SOI substrate, the threshold voltage is in a state of being excessively lowered even when the above-described elements are not added to both the gate insulating film GOX1 of the n-channel MISFET and the gate insulating film GOX2 of the p-channel MISFET. In other words, even in the case where the MISFET is brought into an OFF state, current flows in the channel. As described above, since the threshold voltage of the MISFET is increased in the case of the normal semiconductor substrate 1S, it is necessary to form the gate insulating film so as to reduce the threshold voltage of the MISFET. On the other hand, since the threshold voltage of the MISFET is excessively lowered in the case of the SOI substrate, it is necessary to adjust the threshold voltage of the MISFET so as to be increased to some extent.

For this reason, in the sixth embodiment, a HfAlO film is formed by adding aluminum to the gate insulating film GOX1 of the n-channel MISFET, whereby the threshold voltage of the n-channel MISFET is adjusted so as to be increased. Similarly, a HfMgO film is formed by adding magnesium to the gate insulating film GOX2 of the p-channel MISFET, whereby the threshold voltage of the p-channel MISFET is adjusted so as to be increased.

According to the sixth embodiment, the gate insulating film GOX1 of the n-channel MISFET and the gate insulating film GOX2 of the p-channel MISFET can be formed from respectively different high-dielectric-constant films without unnecessarily exposing the SOI substrate (in particular, the SOI substrate below the gate stack structure), and therefore, the reliability of the semiconductor device can be improved.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention can be widely used in the manufacturing industry of semiconductor devices.

What is claimed is:

1. A manufacturing method of a semiconductor device comprising the step of: forming a first MISFET in a first region and forming a second MISFET in a second region, in which the first MISFET and the second MISFET constitute MISFETs of different conductivity types, wherein the step of forming the first MISFET and the second MISFET includes the steps of:

(a) forming a first insulating film on a semiconductor substrate;

(b) forming a first conductor film on the first insulating film;

(c) pattering the first conductor film, thereby forming a first gate electrode in the first region and forming a second gate electrode in the second region;

(d) after the step (c), forming a first mask film so as to cover the first gate electrode, the second gate electrode and the exposed first insulating film;

(e) after the step (d), removing the first mask film formed in the first region while leaving the first mask film formed in the second region;

(f) after the step (e), forming a first element supply film so as to cover the first mask film formed in the second region, the first gate electrode exposed in the first region and the first insulating film exposed in the first region;

(g) after the step (f), performing a first heat treatment to the semiconductor substrate;

(h) after the step (g), removing the first element supply film;

(i) after the step (h), removing the first mask film formed in the second region;

(j) after the step (i), forming a second mask film so as to cover the first gate electrode, the second gate electrode and the exposed first insulating film;

(k) after the step (j), removing the second mask film formed in the second region while leaving the second mask film formed in the first region;

(l) after the step (k), forming a second element supply film so as to cover the second mask film formed in the first region, the second gate electrode exposed in the second region and the first insulating film exposed in the second region;

(m) after the step (l), performing a second heat treatment to the semiconductor substrate;

(n) after the step (m), removing the second element supply film;

(o) after the step (n), removing the second mask film formed in the first region; and (p) after the step (o), forming a first source region and a first drain region of the first MISFET in the first region, and forming a second source region and a second drain region of the second MISFET in the second region, a first element contained in the first element supply film is diffused from the first element supply film into the first insulating film formed below the first gate electrode by the first heat treatment in the step (g), whereby the first insulating film covered with the first gate electrode turns into a first gate insulating film made of a film having a dielectric constant higher than that of a silicon oxide film, and an amount of the first element contained in the first gate insulating film decreases as going from an end portion toward a central portion in a gate length direction of the first gate insulating film, and a second element contained in the second element supply film is diffused from the second element supply film into the first insulating film formed below the second gate electrode by the second heat treatment in the step (m), whereby the first insulating film covered with the second gate electrode turns into a second gate insulating film made of a film having a dielectric constant higher than that of a silicon oxide film, and an amount of the second element contained in the second gate insulating film decreases as going from an end portion toward a central portion in a gate length direction of the second gate insulating film.

2. The manufacturing method of a semiconductor device according to claim 1, further comprising the steps of:

(t) after the step (c) and before the step (d), removing the first insulating film exposed in the step (c); and (u) after the step (t) and before the step (d), forming a silicon oxide film on the exposed semiconductor substrate, wherein, in the step (f), after the step (e), the first element supply film is formed so as to cover the first mask film formed in the second region, the first gate electrode formed in the first region, the first insulating film below the first gate electrode and the silicon oxide film exposed in the first region, and in the step (l), after the step (k), the second element supply film is formed so as to cover the second mask film formed in the first region, the second gate electrode formed in the second region, the first insulating film below the second gate electrode and the silicon oxide film exposed in the second region.

3. The manufacturing method of a semiconductor device according to claim 1, further comprising the step of:

(v) after the step (c) and before the step (d), removing the first insulating film exposed in the step (c), a part of the first insulating film formed below the first gate electrode and a part of the first insulating film formed below the second gate electrode, thereby making a length of the first insulating film formed below the first gate electrode in a gate length direction shorter than a length of the first gate electrode in the gate length direction, and making a length of the first insulating film formed below the second gate electrode in the gate length direction shorter than a length of the second gate electrode in the gate length direction, wherein, in the step (f), after the step (e), the first element supply film is formed so as to cover the first mask film formed in the second region, the first gate electrode formed in the first region and the first insulating film formed below the first gate electrode, and in the step (l), after the step (k), the second element supply film is formed so as to cover the second mask film formed in the first region, the second gate electrode formed in the second region and the first insulating film formed below the second gate electrode.

4. The manufacturing method of a semiconductor device according to claim 1, wherein, when the step (f), the step (g) and the step (h) sequentially performed after the step (e) and before the step (i) are defined as one first cycle process, the first cycle process is repeatedly performed after the step (e) and before the step (i), and when the step (l), the step (m) and the step (n) sequentially performed after the step (k) and before the step (o) are defined as one second cycle process, the second cycle process is repeatedly performed after the step (k) and before the step (o).

5. The manufacturing method of a semiconductor device according to claim 1, wherein a gate length of the first gate electrode and a gate length of the second gate electrode are 20 nm or less.

6. The manufacturing method of a semiconductor device according to claim 1, wherein the first insulating film is made of any one of a $HfO_2$ film, a HfON film, a HfSiO film, a HfSiON film, a $SiO_2$ film and a SiON film.

7. The manufacturing method of a semiconductor device according to claim 6,
wherein the first MISFET is an n-channel MISFET, and the second MISFET is a p-channel MISFET.

8. The manufacturing method of a semiconductor device according to claim 7,
wherein the element contained in the first element supply film is any one of magnesium, lanthanum, scandium, dysprosium, yttrium and gadolinium.

9. The manufacturing method of a semiconductor device according to claim 7,
wherein the first element supply film is any one of a magnesium film, a magnesium oxide film, a lanthanum film and a lanthanum oxide film.

10. The manufacturing method of a semiconductor device according to claim 7,
wherein the element contained in the second element supply film is aluminum.

11. The manufacturing method of a semiconductor device according to claim 7,
wherein the second element supply film is any one of an aluminum film, an aluminum oxide film and an aluminum nitride film.

12. The manufacturing method of a semiconductor device according to claim 7,
wherein the first insulating film is a $HfO_2$ film,
the first element supply film is a magnesium oxide film and the first element contained in the first element supply film is magnesium, and
the second element supply film is an aluminum oxide film and the second element contained in the second element supply film is aluminum.

13. The manufacturing method of a semiconductor device according to claim 1,
wherein the first conductor film is made of a stacked film, and the first gate electrode and the second gate electrode formed by pattering the first conductor film are made of the stacked film.

14. The manufacturing method of a semiconductor device according to claim 13,
wherein the stacked film is made of a titanium nitride film and a tungsten film or made of a titanium nitride film and a polysilicon film at least a part of which is silicided.

15. The manufacturing method of a semiconductor device according to claim 1, further comprising the steps of:
(q) after the step (b) and before the step (c), forming a second insulating film on the first conductor film; and
(r) after the step (q) and before the step (c), pattering the second insulating film to form a cap insulating film,
wherein, in the step (c), the first conductor film is patterned with using the cap insulating film as a hard mask, thereby forming the first gate electrode and the second gate electrode.

16. The manufacturing method of a semiconductor device according to claim 15, further comprising the step of:
(s) after the step (c) and before the step (d), forming an offset spacer on a sidewall of the first gate electrode and on a sidewall of the second gate electrode.

17. The manufacturing method of a semiconductor device according to claim 16,
wherein the offset spacer is made of a silicon nitride film.

18. The manufacturing method of a semiconductor device according to claim 1,
wherein the first MISFET is a p-channel MISFET, and the second MISFET is an n-channel MISFET.

19. The manufacturing method of a semiconductor device according to claim 18,
wherein the first insulating film is a $HfO_2$ film,
the first element supply film is an aluminum oxide film and the first element contained in the first element supply film is aluminum, and
the second element supply film is a magnesium oxide film and the second element contained in the second element supply film is magnesium.

20. The manufacturing method of a semiconductor device according to claim 1,
wherein the semiconductor substrate is an SOI substrate having a substrate layer, a buried insulating layer formed on the substrate layer and an active layer formed on the buried insulating layer.

21. The manufacturing method of a semiconductor device according to claim 20,
wherein the first MISFET is an n-channel MISFET and the second MISFET is a p-channel MISFET.

22. The manufacturing method of a semiconductor device according to claim 21,
wherein the first insulating film is a $HfO_2$ film,
the first element supply film is an aluminum oxide film and the first element contained in the first element supply film is aluminum, and
the second element supply film is a magnesium oxide film and the second element contained in the second element supply film is magnesium.

* * * * *